US008928077B2

(12) United States Patent
Lee et al.

(10) Patent No.: US 8,928,077 B2
(45) Date of Patent: Jan. 6, 2015

(54) SUPERJUNCTION STRUCTURES FOR POWER DEVICES

(75) Inventors: JaeGil Lee, Puchon-si (KR); Chongman Yun, Seoul (KR); Hocheol Jang, Gyeonggi-do (KR); Christopher L. Rexer, Mountain Top, PA (US); Praveen Muraleedharan Shenoy, Pune, IN (US); Dwayne S. Reichl, Pocono Lake, PA (US); Joseph A. Yedinak, Mountain Top, PA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 12/234,549

(22) Filed: Sep. 19, 2008

(65) Prior Publication Data

US 2009/0079002 A1 Mar. 26, 2009

Related U.S. Application Data

(60) Provisional application No. 60/974,433, filed on Sep. 21, 2007.

(51) Int. Cl.
| *H01L 29/66* | (2006.01) |
| *H01L 29/78* | (2006.01) |
| *H01L 29/06* | (2006.01) |
| H01L 29/08 | (2006.01) |
| H01L 29/10 | (2006.01) |
| H01L 29/40 | (2006.01) |

(52) U.S. Cl.
CPC ........ *H01L 29/7811* (2013.01); *H01L 29/0634* (2013.01); *H01L 29/66712* (2013.01); *H01L 29/7813* (2013.01); H01L 29/0615 (2013.01); H01L 29/0696 (2013.01); H01L 29/0878 (2013.01); H01L 29/1095 (2013.01); H01L 29/404 (2013.01)
USPC ........................... 257/339; 257/328; 257/341

(58) Field of Classification Search
USPC .......... 257/302, 328–330, 341, 342, 500, 339
See application file for complete search history.

(56) References Cited

U.S. PATENT DOCUMENTS

| 3,404,295 A | 10/1968 | Warner et al. |
| 3,412,297 A | 11/1968 | Amlinger |

(Continued)

FOREIGN PATENT DOCUMENTS

| CN | 1036666 A | 10/1989 |
| CN | 1744329 A | 3/2006 |

(Continued)

OTHER PUBLICATIONS

"CoolMOSä the second generation," Infineon Technologies product information, (2000), 2 pages total.

(Continued)

*Primary Examiner* — Errol Fernandes

(57) ABSTRACT

In one general aspect, a power device includes an active region having a plurality of pillars of a first conductivity type alternately arranged with a plurality of pillars of a second conductivity type where the plurality of pillars of the second conductivity type in the active region each have substantially the same width. The power device includes a termination region surrounding at least a portion of the active region and having a plurality of pillars of the first conductivity type alternately arranged with a plurality of pillars of the second conductivity type where the plurality of pillars of the second conductivity type in the active region each have substantially the same width and are smaller than each width of the pillars of the second conductivity type in the termination region. The power device includes a transition region disposed between the active region and the termination region.

25 Claims, 71 Drawing Sheets

(56) References Cited

U.S. PATENT DOCUMENTS

| | | |
|---|---|---|
| 3,497,777 A | 2/1970 | Teszner et al. |
| 3,564,356 A | 2/1971 | Wilson |
| 3,660,697 A | 5/1972 | Berglund et al. |
| 4,003,072 A | 1/1977 | Matsushita et al. |
| 4,300,150 A | 11/1981 | Colak |
| 4,324,038 A | 4/1982 | Chang et al. |
| 4,326,332 A | 4/1982 | Kenney et al. |
| 4,337,474 A | 6/1982 | Yukimoto |
| 4,345,265 A | 8/1982 | Blanchard |
| 4,404,575 A | 9/1983 | Nishizawa |
| 4,445,202 A | 4/1984 | Geotze et al. |
| 4,579,621 A | 4/1986 | Hine |
| 4,636,281 A | 1/1987 | Buiguez et al. |
| 4,638,344 A | 1/1987 | Cardwell, Jr. |
| 4,639,761 A | 1/1987 | Singer et al. |
| 4,682,405 A | 7/1987 | Blanchard et al. |
| 4,698,653 A | 10/1987 | Cardwell, Jr. |
| 4,716,126 A | 12/1987 | Cogan |
| 4,746,630 A | 5/1988 | Hui et al. |
| 4,754,310 A | 6/1988 | Coe |
| 4,774,556 A | 9/1988 | Fujii et al. |
| 4,775,881 A | 10/1988 | Ploog et al. |
| 4,796,070 A | 1/1989 | Black |
| 4,801,986 A | 1/1989 | Chang et al. |
| 4,801,995 A | 1/1989 | Iwanishi |
| 4,821,095 A | 4/1989 | Temple |
| 4,823,176 A | 4/1989 | Baliga et al. |
| 4,853,345 A | 8/1989 | Himelick |
| 4,868,624 A | 9/1989 | Grung et al. |
| 4,893,160 A | 1/1990 | Blanchard |
| 4,914,058 A | 4/1990 | Blanchard |
| 4,941,026 A | 7/1990 | Temple |
| 4,961,100 A | 10/1990 | Baliga et al. |
| 4,967,245 A | 10/1990 | Cogan et al. |
| 4,974,059 A | 11/1990 | Kinzer |
| 4,975,782 A | 12/1990 | Bauer |
| 4,990,463 A | 2/1991 | Mori |
| 4,992,390 A | 2/1991 | Chang |
| 5,027,180 A | 6/1991 | Nishizawa et al. |
| 5,034,785 A | 7/1991 | Blanchard |
| 5,065,273 A | 11/1991 | Rajeevakumar |
| 5,071,782 A | 12/1991 | Mori |
| 5,072,266 A | 12/1991 | Bulucea et al. |
| 5,077,228 A | 12/1991 | Eklund et al. |
| 5,079,608 A | 1/1992 | Wodarczyk et al. |
| 5,105,243 A | 4/1992 | Nakagawa et al. |
| 5,111,253 A | 5/1992 | Korman et al. |
| 5,142,640 A | 8/1992 | Iwanatsu |
| 5,156,989 A | 10/1992 | Williams et al. |
| 5,164,325 A | 11/1992 | Cogan et al. |
| 5,164,802 A | 11/1992 | Jones et al. |
| 5,216,275 A | 6/1993 | Chen |
| 5,219,777 A | 6/1993 | Kang |
| 5,219,793 A | 6/1993 | Cooper et al. |
| 5,233,215 A | 8/1993 | Baliga |
| 5,242,845 A | 9/1993 | Baba et al. |
| 5,262,336 A | 11/1993 | Pike, Jr. et al. |
| 5,268,311 A | 12/1993 | Euen et al. |
| 5,275,965 A | 1/1994 | Manning |
| 5,283,201 A | 2/1994 | Tsang et al. |
| 5,294,824 A | 3/1994 | Okada |
| 5,298,781 A | 3/1994 | Cogan et al. |
| 5,300,447 A | 4/1994 | Anderson |
| 5,326,711 A | 7/1994 | Malhi |
| 5,334,546 A | 8/1994 | Terashima |
| 5,346,835 A | 9/1994 | Malhi et al. |
| 5,350,937 A | 9/1994 | Yamazaki et al. |
| 5,365,102 A | 11/1994 | Mehrotra et al. |
| 5,366,914 A | 11/1994 | Takahashi et al. |
| 5,389,815 A | 2/1995 | Takahashi |
| 5,405,794 A | 4/1995 | Kim |
| 5,418,376 A | 5/1995 | Muraoka et al. |
| 5,424,231 A | 6/1995 | Yang |
| 5,429,977 A | 7/1995 | Lu et al. |
| 5,430,311 A | 7/1995 | Murakami et al. |
| 5,430,324 A | 7/1995 | Bencuya |
| 5,434,435 A | 7/1995 | Baliga |
| 5,436,189 A | 7/1995 | Beasom |
| 5,438,215 A | 8/1995 | Tihanyi |
| 5,442,214 A | 8/1995 | Yang |
| 5,473,176 A | 12/1995 | Kakumoto |
| 5,473,180 A | 12/1995 | Ludikhuize |
| 5,474,943 A | 12/1995 | Hshieh et al. |
| 5,488,010 A | 1/1996 | Wong |
| 5,489,787 A | 2/1996 | Amaratunga et al. |
| 5,519,245 A | 5/1996 | Tokura et al. |
| 5,541,425 A | 7/1996 | Nishihara |
| 5,545,915 A | 8/1996 | Disney et al. |
| 5,554,862 A | 9/1996 | Omura et al. |
| 5,557,127 A | 9/1996 | Ajit et al. |
| 5,567,634 A | 10/1996 | Hebert et al. |
| 5,567,635 A | 10/1996 | Acovic et al. |
| 5,572,048 A | 11/1996 | Sugawara |
| 5,576,245 A | 11/1996 | Cogan et al. |
| 5,578,851 A | 11/1996 | Hshieh et al. |
| 5,581,100 A | 12/1996 | Ajit |
| 5,583,065 A | 12/1996 | Miwa |
| 5,592,005 A | 1/1997 | Floyd et al. |
| 5,595,927 A | 1/1997 | Chen et al. |
| 5,597,765 A | 1/1997 | Yilmaz et al. |
| 5,605,852 A | 2/1997 | Bencuya |
| 5,616,945 A | 4/1997 | Williams |
| 5,623,152 A | 4/1997 | Majumdar et al. |
| 5,629,543 A | 5/1997 | Hshieh et al. |
| 5,637,898 A | 6/1997 | Baliga |
| 5,637,910 A | 6/1997 | Sakamoto |
| 5,639,676 A | 6/1997 | Hshieh et al. |
| 5,640,034 A | 6/1997 | Malhi |
| 5,648,670 A | 7/1997 | Blanchard |
| 5,656,843 A | 8/1997 | Goodyear et al. |
| 5,665,619 A | 9/1997 | Kwan et al. |
| 5,670,803 A | 9/1997 | Beilstein, Jr. et al. |
| 5,689,128 A | 11/1997 | Hshieh et al. |
| 5,693,569 A | 12/1997 | Ueno |
| 5,705,409 A | 1/1998 | Witek |
| 5,710,072 A | 1/1998 | Krautschneider et al. |
| 5,714,781 A | 2/1998 | Yamamoto et al. |
| 5,719,409 A | 2/1998 | Singh et al. |
| 5,726,469 A | 3/1998 | Chen |
| 5,731,626 A | 3/1998 | Eaglesham et al. |
| 5,770,878 A | 6/1998 | Beasom |
| 5,776,813 A | 7/1998 | Huang et al. |
| 5,780,343 A | 7/1998 | Bashir |
| 5,801,417 A | 9/1998 | Tsang et al. |
| 5,814,858 A | 9/1998 | Williams |
| 5,859,446 A | 1/1999 | Nagasu et al. |
| 5,877,528 A | 3/1999 | So |
| 5,879,971 A | 3/1999 | Witek |
| 5,879,994 A | 3/1999 | Kwan et al. |
| 5,894,149 A | 4/1999 | Uenishi et al. |
| 5,895,951 A | 4/1999 | So et al. |
| 5,895,952 A | 4/1999 | Darwish et al. |
| 5,897,343 A | 4/1999 | Mathew et al. |
| 5,897,360 A | 4/1999 | Kawaguchi |
| 5,900,663 A | 5/1999 | Johnson et al. |
| 5,906,680 A | 5/1999 | Meyerson |
| 5,917,216 A | 6/1999 | Floyd et al. |
| 5,929,481 A | 7/1999 | Hsieh et al. |
| 5,932,897 A | 8/1999 | Kawaguchi et al. |
| 5,943,581 A | 8/1999 | Lu et al. |
| 5,949,104 A | 9/1999 | D'Anna et al. |
| 5,949,124 A | 9/1999 | Hadizad et al. |
| 5,959,324 A | 9/1999 | Kohyama |
| 5,960,271 A | 9/1999 | Wollesen et al. |
| 5,972,741 A | 10/1999 | Kubo et al. |
| 5,973,360 A | 10/1999 | Tihanyi |
| 5,973,367 A | 10/1999 | Williams |
| 5,976,936 A | 11/1999 | Miyajima et al. |
| 5,981,344 A | 11/1999 | Hshieh et al. |
| 5,981,996 A | 11/1999 | Fujishima |
| 5,998,833 A | 12/1999 | Baliga |
| 6,005,271 A | 12/1999 | Hshieh |
| 6,008,097 A | 12/1999 | Yoon et al. |
| 6,011,298 A | 1/2000 | Blanchard |

(56) References Cited

U.S. PATENT DOCUMENTS

| | | |
|---|---|---|
| 6,015,727 A | 1/2000 | Wanlass |
| 6,020,250 A | 2/2000 | Kenney et al. |
| 6,034,415 A | 3/2000 | Johnson et al. |
| 6,037,202 A | 3/2000 | Witek |
| 6,037,628 A | 3/2000 | Huang |
| 6,037,632 A | 3/2000 | Omura et al. |
| 6,040,600 A | 3/2000 | Uenishi et al. |
| 6,048,772 A | 4/2000 | D'Anna |
| 6,049,108 A | 4/2000 | Williams et al. |
| 6,051,488 A | 4/2000 | Lee et al. |
| 6,057,558 A | 5/2000 | Yamamoto et al. |
| 6,057,577 A | 5/2000 | Barret et al. |
| 6,063,678 A | 5/2000 | D'Anna |
| 6,064,088 A | 5/2000 | D'Anna |
| 6,066,878 A | 5/2000 | Neilson |
| 6,069,043 A | 5/2000 | Floyd et al. |
| 6,081,009 A | 6/2000 | Neilson |
| 6,084,264 A | 7/2000 | Darwish |
| 6,084,268 A | 7/2000 | de Fresart et al. |
| 6,087,232 A | 7/2000 | Kim et al. |
| 6,096,608 A | 8/2000 | Williams |
| 6,097,063 A | 8/2000 | Fujihira |
| 6,103,578 A | 8/2000 | Uenishi et al. |
| 6,104,054 A | 8/2000 | Corsi et al. |
| 6,110,799 A | 8/2000 | Huang |
| 6,110,804 A | 8/2000 | Parthasarathy et al. |
| 6,114,727 A | 9/2000 | Ogura et al. |
| 6,130,458 A | 10/2000 | Takagi et al. |
| 6,137,152 A | 10/2000 | Wu |
| 6,150,697 A | 11/2000 | Teshigahara et al. |
| 6,156,606 A | 12/2000 | Michaelis |
| 6,156,611 A | 12/2000 | Lan et al. |
| 6,163,052 A | 12/2000 | Liu et al. |
| 6,165,870 A | 12/2000 | Shim et al. |
| 6,168,983 B1 | 1/2001 | Rumennik et al. |
| 6,168,996 B1 | 1/2001 | Numazawa et al. |
| 6,171,935 B1 | 1/2001 | Nance et al. |
| 6,174,773 B1 | 1/2001 | Fujishima |
| 6,174,785 B1 | 1/2001 | Parekh et al. |
| 6,184,545 B1 | 2/2001 | Werner et al. |
| 6,184,555 B1 | 2/2001 | Tihanyi et al. |
| 6,188,104 B1 | 2/2001 | Choi et al. |
| 6,188,105 B1 | 2/2001 | Kocon et al. |
| 6,190,948 B1 | 2/2001 | Seok |
| 6,190,978 B1 | 2/2001 | D'Anna |
| 6,191,447 B1 | 2/2001 | Baliga |
| 6,194,741 B1 | 2/2001 | Kinzer et al. |
| 6,198,127 B1 | 3/2001 | Kocon |
| 6,201,279 B1 | 3/2001 | Pfirsch |
| 6,204,097 B1 | 3/2001 | Shen et al. |
| 6,207,994 B1 | 3/2001 | Rumennik et al. |
| 6,222,233 B1 | 4/2001 | D'Anna |
| 6,225,649 B1 | 5/2001 | Minato |
| 6,228,727 B1 | 5/2001 | Lim et al. |
| 6,239,463 B1 | 5/2001 | Williams et al. |
| 6,239,464 B1 | 5/2001 | Tsuchitani et al. |
| 6,242,787 B1 | 6/2001 | Nakayama et al. |
| 6,259,136 B1 | 7/2001 | Kawaguchi et al. |
| 6,265,269 B1 | 7/2001 | Chen et al. |
| 6,271,100 B1 | 8/2001 | Ballantine et al. |
| 6,271,552 B1 | 8/2001 | D'Anna |
| 6,271,562 B1 | 8/2001 | Deboy et al. |
| 6,274,904 B1 | 8/2001 | Tihanyi |
| 6,274,905 B1 | 8/2001 | Mo |
| 6,277,706 B1 | 8/2001 | Ishikawa |
| 6,281,547 B1 | 8/2001 | So et al. |
| 6,285,060 B1 | 9/2001 | Korec et al. |
| 6,291,298 B1 | 9/2001 | Williams et al. |
| 6,291,856 B1 | 9/2001 | Miyasaka et al. |
| 6,294,818 B1 | 9/2001 | Fujihira |
| 6,297,534 B1 | 10/2001 | Kawaguchi et al. |
| 6,303,969 B1 | 10/2001 | Tan |
| 6,307,246 B1 | 10/2001 | Nitta et al. |
| 6,309,920 B1 | 10/2001 | Laska et al. |
| 6,310,365 B1 | 10/2001 | Chen |
| 6,313,482 B1 | 11/2001 | Baliga |
| 6,316,806 B1 | 11/2001 | Mo |
| 6,326,656 B1 | 12/2001 | Tihanyi |
| 6,337,499 B1 | 1/2002 | Werner |
| 6,346,464 B1 | 2/2002 | Takeda et al. |
| 6,346,469 B1 | 2/2002 | Greer |
| 6,351,018 B1 | 2/2002 | Sapp |
| 6,353,252 B1 | 3/2002 | Yasuhara et al. |
| 6,359,308 B1 | 3/2002 | Hijzen et al. |
| 6,362,026 B2 | 3/2002 | Zeng et al. |
| 6,362,112 B1 | 3/2002 | Hamerski |
| 6,362,505 B1 | 3/2002 | Tihanyi |
| 6,365,462 B2 | 4/2002 | Baliga |
| 6,365,930 B1 | 4/2002 | Schillaci et al. |
| 6,368,920 B1 | 4/2002 | Beasom |
| 6,368,921 B1 | 4/2002 | Hijzen et al. |
| 6,376,314 B1 | 4/2002 | Jerred |
| 6,376,878 B1 | 4/2002 | Kocon |
| 6,376,890 B1 | 4/2002 | Tihanyi |
| 6,384,456 B1 | 5/2002 | Tihanyi |
| 6,388,286 B1 | 5/2002 | Baliga |
| 6,388,287 B2 | 5/2002 | Deboy et al. |
| 6,396,102 B1 | 5/2002 | Calafut |
| 6,400,003 B1 | 6/2002 | Huang |
| 6,429,481 B1 | 8/2002 | Mo et al. |
| 6,433,385 B1 | 8/2002 | Kocon et al. |
| 6,436,779 B2 | 8/2002 | Hurkx et al. |
| 6,437,399 B1 | 8/2002 | Huang |
| 6,441,454 B2 | 8/2002 | Hijzen et al. |
| 6,452,230 B1 | 9/2002 | Boden, Jr. |
| 6,461,918 B1 | 10/2002 | Calafut |
| 6,465,304 B1 | 10/2002 | Blanchard et al. |
| 6,465,843 B1 | 10/2002 | Hirler et al. |
| 6,465,869 B2 | 10/2002 | Ahlers et al. |
| 6,472,678 B1 | 10/2002 | Hshieh et al. |
| 6,472,708 B1 | 10/2002 | Hshieh et al. |
| 6,475,884 B2 | 11/2002 | Hshieh et al. |
| 6,476,443 B1 | 11/2002 | Kinzer |
| 6,479,352 B2 | 11/2002 | Blanchard |
| 6,489,652 B1 | 12/2002 | Jeon et al. |
| 6,501,146 B1 | 12/2002 | Harada |
| 6,573,558 B2 | 6/2003 | Disney |
| 6,580,123 B2 | 6/2003 | Thapar |
| 6,608,350 B2 | 8/2003 | Kinzer et al. |
| 6,611,021 B1 | 8/2003 | Onishi et al. |
| 6,624,472 B2 | 9/2003 | Hurkx et al. |
| 6,630,698 B1 | 10/2003 | Deboy et al. |
| 6,635,906 B1 | 10/2003 | Chen |
| 6,649,459 B2 | 11/2003 | Deboy et al. |
| 6,649,975 B2 | 11/2003 | Baliga |
| 6,653,740 B2 | 11/2003 | Kinzer et al. |
| 6,657,254 B2 | 12/2003 | Hshieh et al. |
| 6,673,679 B1 | 1/2004 | Miyasaka et al. |
| 6,673,680 B2 | 1/2004 | Calafut |
| 6,677,626 B1 | 1/2004 | Shindou et al. |
| 6,683,347 B1 | 1/2004 | Fujihira |
| 6,683,363 B2 | 1/2004 | Challa |
| 6,690,062 B2 | 2/2004 | Henninger et al. |
| 6,693,323 B2 | 2/2004 | Sato et al. |
| 6,693,338 B2 | 2/2004 | Saitoh et al. |
| 6,696,728 B2 | 2/2004 | Onishi et al. |
| 6,700,156 B2 | 3/2004 | Saitoh et al. |
| 6,710,403 B2 | 3/2004 | Sapp |
| 6,713,813 B2 | 3/2004 | Marchant |
| 6,724,042 B2 | 4/2004 | Onishi et al. |
| 6,740,931 B2 | 5/2004 | Kouzuki et al. |
| 6,750,508 B2 | 6/2004 | Omura et al. |
| 6,777,746 B2 | 8/2004 | Kitagawa et al. |
| 6,818,513 B2 | 11/2004 | Marchant |
| 6,818,947 B2 | 11/2004 | Grebs et al. |
| 6,819,089 B2 | 11/2004 | Deboy et al. |
| 6,825,514 B2 | 11/2004 | Deboy et al. |
| 6,825,537 B2 | 11/2004 | Iwamoto et al. |
| 6,828,195 B2 | 12/2004 | Mo et al. |
| 6,828,609 B2 | 12/2004 | Deboy et al. |
| 6,838,722 B2 | 1/2005 | Bhalla et al. |
| 6,844,592 B2 | 1/2005 | Yamaguchi et al. |
| 6,861,701 B2 | 3/2005 | Williams et al. |
| 6,870,201 B1 | 3/2005 | Deboy et al. |

(56) References Cited

U.S. PATENT DOCUMENTS

| | | | |
|---|---|---|---|
| 6,878,989 B2 | 4/2005 | Izumisawa et al. | |
| 6,884,592 B2 | 4/2005 | Matzinger et al. | |
| 6,894,329 B2 | 5/2005 | Deboy et al. | |
| 6,903,418 B2 | 6/2005 | Iwamoto et al. | |
| 6,919,610 B2 | 7/2005 | Saitoh et al. | |
| 6,930,352 B2 | 8/2005 | Saito et al. | |
| 6,936,890 B2 | 8/2005 | Hueting et al. | |
| 6,960,798 B2 | 11/2005 | Deboy et al. | |
| 6,982,459 B2 | 1/2006 | Suzuki et al. | |
| 6,989,566 B2 | 1/2006 | Noda et al. | |
| 6,995,426 B2 | 2/2006 | Okumura et al. | |
| 6,995,428 B2 | 2/2006 | Huang et al. | |
| 7,023,069 B2 | 4/2006 | Blanchard | |
| 7,041,560 B2 | 5/2006 | Hshieh | |
| 7,052,982 B2 | 5/2006 | Hshieh et al. | |
| 7,087,958 B2 | 8/2006 | Chuang et al. | |
| 7,098,520 B2 | 8/2006 | Park et al. | |
| 7,115,475 B2 | 10/2006 | Yamaguchi et al. | |
| 7,118,951 B2 | 10/2006 | Yedinak et al. | |
| 7,170,119 B2 | 1/2007 | Yamauchi et al. | |
| 7,202,526 B2 | 4/2007 | Kitagawa et al. | |
| 7,221,011 B2 | 5/2007 | Banerjee et al. | |
| 7,224,022 B2 | 5/2007 | Tokano et al. | |
| 7,224,027 B2 | 5/2007 | Blanchard | |
| 7,226,841 B2 | 6/2007 | Izumisawa et al. | |
| 7,250,343 B2 | 7/2007 | Kotek et al. | |
| 7,317,213 B2 | 1/2008 | Yamaguchi et al. | |
| 7,449,354 B2 | 11/2008 | Marchant et al. | |
| 7,560,787 B2 | 7/2009 | Kocon | |
| 7,582,519 B2 | 9/2009 | Kocon et al. | |
| 7,595,542 B2 | 9/2009 | Park et al. | |
| 7,612,408 B2 | 11/2009 | Zundel et al. | |
| 7,625,793 B2 | 12/2009 | Calafut | |
| 7,859,076 B2 * | 12/2010 | Van Dalen et al. | 257/452 |
| 7,863,708 B2 | 1/2011 | Yilmaz et al. | |
| 7,902,071 B2 | 3/2011 | Marchant | |
| 8,304,829 B2 | 11/2012 | Yedinak et al. | |
| 2001/0023961 A1 | 9/2001 | Hsieh et al. | |
| 2001/0025984 A1 | 10/2001 | Osawa | |
| 2001/0028083 A1 * | 10/2001 | Onishi et al. | 257/328 |
| 2001/0032998 A1 | 10/2001 | Iwamoto et al. | |
| 2001/0041400 A1 | 11/2001 | Ren et al. | |
| 2001/0041407 A1 | 11/2001 | Brown | |
| 2001/0049167 A1 | 12/2001 | Madson | |
| 2001/0050394 A1 | 12/2001 | Onishi et al. | |
| 2002/0009832 A1 | 1/2002 | Blanchard | |
| 2002/0014658 A1 | 2/2002 | Blanchard | |
| 2002/0066924 A1 | 6/2002 | Blanchard | |
| 2002/0070418 A1 | 6/2002 | Kinzer et al. | |
| 2002/0088990 A1 | 7/2002 | Iwamoto et al. | |
| 2002/0100933 A1 | 8/2002 | Marchant | |
| 2003/0006452 A1 | 1/2003 | Challa | |
| 2003/0060013 A1 | 3/2003 | Marchant | |
| 2003/0132450 A1 | 7/2003 | Minato et al. | |
| 2003/0178676 A1 | 9/2003 | Henninger et al. | |
| 2003/0183858 A1 | 10/2003 | Kitagawa et al. | |
| 2003/0193067 A1 | 10/2003 | Kim | |
| 2003/0222327 A1 | 12/2003 | Yamaguchi et al. | |
| 2004/0026735 A1 | 2/2004 | Suzuki et al. | |
| 2004/0056302 A1 | 3/2004 | Grebs et al. | |
| 2004/0065921 A1 | 4/2004 | Iwamoto et al. | |
| 2004/0108568 A1 | 6/2004 | Qu | |
| 2004/0135228 A1 | 7/2004 | Iwamoto et al. | |
| 2004/0171198 A1 | 9/2004 | Zeng | |
| 2004/0195620 A1 | 10/2004 | Chuang et al. | |
| 2004/0232483 A1 | 11/2004 | Kitagawa et al. | |
| 2005/0098826 A1 | 5/2005 | Yamaguchi et al. | |
| 2005/0116313 A1 * | 6/2005 | Lee et al. | 257/500 |
| 2005/0161735 A1 | 7/2005 | Aoki et al. | |
| 2005/0167742 A1 | 8/2005 | Challa et al. | |
| 2005/0184336 A1 | 8/2005 | Takahashi et al. | |
| 2005/0242411 A1 | 11/2005 | Tso | |
| 2005/0250322 A1 | 11/2005 | Aida et al. | |
| 2005/0275025 A1 | 12/2005 | Lanzerstorfer | |
| 2005/0280086 A1 * | 12/2005 | Saito et al. | 257/341 |
| 2006/0006458 A1 | 1/2006 | Motai et al. | |
| 2006/0033157 A1 | 2/2006 | Kitagawa et al. | |
| 2006/0038226 A1 | 2/2006 | Kitagawa et al. | |
| 2006/0043480 A1 | 3/2006 | Tsuchitani et al. | |
| 2006/0043481 A1 | 3/2006 | Yamashita et al. | |
| 2006/0118864 A1 | 6/2006 | Hirler et al. | |
| 2006/0138536 A1 | 6/2006 | Kouzuki et al. | |
| 2006/0197152 A1 | 9/2006 | Tokano et al. | |
| 2006/0214222 A1 * | 9/2006 | Challa et al. | 257/328 |
| 2006/0216896 A1 | 9/2006 | Saito et al. | |
| 2006/0231917 A1 | 10/2006 | Ono et al. | |
| 2006/0273386 A1 | 12/2006 | Yilmaz et al. | |
| 2006/0284248 A1 | 12/2006 | Saito et al. | |
| 2007/0001194 A1 | 1/2007 | Ono et al. | |
| 2007/0001230 A1 | 1/2007 | Lee et al. | |
| 2007/0018243 A1 | 1/2007 | Ono et al. | |
| 2007/0023831 A1 | 2/2007 | Kitagawa et al. | |
| 2007/0029597 A1 | 2/2007 | Lee et al. | |
| 2007/0032020 A1 | 2/2007 | Grebs et al. | |
| 2007/0102773 A1 | 5/2007 | Hisatom et al. | |
| 2007/0134819 A1 | 6/2007 | Uchiyama | |
| 2007/0138453 A1 | 6/2007 | Le | |
| 2007/0138543 A1 * | 6/2007 | Saito | 257/328 |
| 2007/0138546 A1 | 6/2007 | Kawamura et al. | |
| 2007/0145514 A1 | 6/2007 | Kocon | |
| 2007/0155104 A1 | 7/2007 | Marchant et al. | |
| 2007/0158740 A1 * | 7/2007 | Yoshikawa et al. | 257/330 |
| 2007/0181927 A1 | 8/2007 | Yedinak et al. | |
| 2007/0194374 A1 | 8/2007 | Bhalla et al. | |
| 2007/0272977 A1 * | 11/2007 | Saito et al. | 257/329 |
| 2008/0064168 A1 | 3/2008 | Kraft et al. | |
| 2009/0200606 A1 | 8/2009 | Yilmaz et al. | |
| 2010/0032790 A1 | 2/2010 | Rinehimer | |
| 2010/0123192 A1 | 5/2010 | Burke et al. | |

FOREIGN PATENT DOCUMENTS

| | | |
|---|---|---|
| DE | 4300806 C1 | 12/1993 |
| DE | 4309764 A1 | 9/1994 |
| DE | 19736981 A1 | 8/1998 |
| EP | 0053854 A1 | 6/1982 |
| EP | 0114435 A1 | 8/1984 |
| EP | 0634798 A1 | 1/1995 |
| EP | 975024 A2 | 1/2000 |
| EP | 1026749 A1 | 8/2000 |
| EP | 1054451 A2 | 11/2000 |
| EP | 1111685 A1 | 6/2001 |
| EP | 1114466 B1 | 7/2001 |
| EP | 747967 B1 | 2/2002 |
| EP | 1205980 A1 | 5/2002 |
| GB | 2309336 A1 | 7/1997 |
| JP | 61-128554 A | 6/1986 |
| JP | 62-069562 | 3/1987 |
| JP | 63-186475 | 8/1988 |
| JP | 63-288047 | 11/1988 |
| JP | 64-022051 | 1/1989 |
| JP | 01-093169 A | 4/1989 |
| JP | 01-192174 A | 8/1989 |
| JP | 1-194364 A | 8/1989 |
| JP | 04-256370 A | 9/1992 |
| JP | 5-226638 A | 9/1993 |
| JP | 7-221116 A | 8/1995 |
| JP | 08-264787 A | 10/1996 |
| JP | 09-064352 A | 3/1997 |
| JP | 09-213938 A | 8/1997 |
| JP | 09-266311 A | 10/1997 |
| JP | 10-223896 A | 8/1998 |
| JP | 2000-040822 | 2/2000 |
| JP | 2000-040872 | 2/2000 |
| JP | 2000-156978 A | 6/2000 |
| JP | 2000-277726 A | 10/2000 |
| JP | 2000-277728 A | 10/2000 |
| JP | 2001-015448 | 1/2001 |
| JP | 2001-015752 | 1/2001 |
| JP | 2001-102577 A | 4/2001 |
| JP | 2001-111041 A | 4/2001 |
| JP | 2001-135819 A | 5/2001 |
| JP | 2001-144292 A | 5/2001 |
| JP | 2001-244461 A | 9/2001 |

(56) References Cited

FOREIGN PATENT DOCUMENTS

| | | |
|---|---|---|
| JP | 2001-313391 A | 12/2001 |
| JP | 2002-083976 A | 3/2002 |
| JP | 2002-280555 | 9/2002 |
| KR | 10-2005-0095385 A | 9/2005 |
| WO | WO 97/29518 A1 | 8/1997 |
| WO | WO 00/33386 A2 | 6/2000 |
| WO | WO 00/68997 A1 | 11/2000 |
| WO | WO 00/68998 A1 | 11/2000 |
| WO | WO 00/75965 A2 | 12/2000 |
| WO | WO 01/06550 A1 | 1/2001 |
| WO | WO 01/06557 A1 | 1/2001 |
| WO | WO 01/45155 A1 | 6/2001 |
| WO | WO 01/59847 A2 | 8/2001 |
| WO | WO 01/71815 | 9/2001 |
| WO | WO 01/88997 A2 | 11/2001 |
| WO | WO 01/95385 A1 | 12/2001 |
| WO | WO 01/95398 A1 | 12/2001 |
| WO | WO 02/01644 A2 | 1/2002 |
| WO | WO 02/047171 A1 | 6/2002 |
| WO | WO 03/085722 A2 | 10/2003 |
| WO | 2006/126164 A2 | 11/2006 |
| WO | WO 2009/039441 A1 | 3/2009 |

OTHER PUBLICATIONS

"IR develops CoolMOSä—equivalent technology, positions it at the top of a 3-tiered line of new products for SMPS," International Rectifiers company information available at http://www.irf.com (1999) 3 pages total.

Bai et al., "Junction termination technique for super junction devices", Proceedings. The 12th International Symposium on Power Semiconductor Devices and Ics., 2000.

Bai et al., "Novel automated optimization of power MOSFET for 12V input, high-frequency DC-DC converter," International Symposium on Power Semiconductors and ICs, Technical Digest, (2003), pp. 366-369.

Baliga "New Concepts in Power Rectifiers," Physics of Semiconductor Devices, Proceedings of the Third Int'l Workshop, Madras (India), Committee on Science and Technology in Developing Countries (1985), pp. 471-481.

Baliga "Options for CVD of Dielectrics Include Low-k Materials," Technical Literature from Semiconductor International, Jun. 1998, 4 pages total.

Baliga et al., "Improving the reverse recovery of power MOSFET integral diodes by electron irradiation," (Dec. 1983) Solid State Electronics, vol. 26, No. 12, pp. 1133-1141.

Bauer, "The MOS controlled superjunction transistor (SJBT): a new, highly efficient, high power semiconductor device for medium to high voltage applications", Accessed on Dec. 6, 2011.

Brown et al. Novel Trench Gate Structure Developments Set the Benchmark for Next Generation Power MOSFET Switching Performance. Power Electronics—May 2003 Proceedings (PCIM), Nurenburg, vol. 47, pp. 275-278.

Bulucea "Trench DMOS Transistor Technology for High Current (100 A Range) Switching" Solid-State Electronics vol. 34 No. pp. 493-507 (1991).

Buzzo et al., "Characterization of Unconventional Engineering Solutions for Superjunction Devices" Proceedings of the 18th International Symposium on Power Semiconductor Devices & IC's Jun. 4-8, 2006 Naples, Italy.

Chang, et al., "Self-Aligned UMOSFET's with a Specific On-Resistance of 1 m.OMEGA.cm.sup.2", IEEE Transactions on Electron Devices, Nov. 1987, pp. 2329-2334, vol. ED-34, No. 11 . . . .

Cheng et al., "Fast reverse recovery body diode in high-voltage VDMOSFET using cell-distributed schottky contacts," (May 2003) IEEE Transactions on Electron Devices, vol. 50, No. 5, pp. 1422-1425.

Cheng et al., "Improving the CoolMOSTM Body-Diode Switching Performance with Integrated Schottky Contacts" Department of Electronic Engineering, Beijing Polytechnic University, China, Accessed on Dec. 6, 2011.

Curtis, et al. "APCVD TEOS: 03 Advanced Trench Isolation Applications," Semiconductor Fabtech 9th Edition (1999) 8 pages total.

Darwish et al. A New Power W-Gated Trench MOSFET (WMOSFET) with High Switching Performance. ISPSD Proceedings—Apr. 2003, Cambridge, 4 pages total.

Djekic, O. et al., "High frequency synchronous buck converter for low voltage applications," (1998) Proc. IEEE Power Electronics Specialist Conf. (PESC), pp. 1248-1254.

Fujihira "Theory of Semiconductor Superjunction Devices" Jpn. J. Appl. Phys. vol. 36 pp. 6254-6262 (1997).

Gan et al. "Poly Flanked VDMOS (PFVDMOS): A Superior Technology for Superjunction Devices," IEEE Power Electronics Specialists Conference, Jun. 17-22, 2001, Vancouver, Canada (2001), 4 pages total.

Glenn et al., A novel vertical deep trench Resurf DMOS (VTR-DMOS), The 12th International Symposium on Power Semiconductor Devices and ICs., 2000.

Hatorri et al., "Shallow angle implantation for extended trench gate power MOSFETs with super junction structure",ISPSD '01. Proceedings of the 13th International Symposium on Power Semiconductor Devices and ICs, 2001.

Hattori et al., "Design of a 200V super junction MOSFET with n-buffer regions and its fabrication by trench filling", Proceedings of 2004 International Symposium on Power Semiconductor Devices and ICs, Kitakyushu, pp. 189-192 (2004).

Henson et al., "Low Voltage Super Junction MOSFET Simulation and Experimentation", International Rectifier 233 Kansas St, El Segundo, CA 90245 USA, Accessed on Dec. 6, 2011.

Iwamoto et al., "Above 500V class Superjunction MOSFETs fabricated by deep trench etching and epitaxial growth", Fuji Electric Advanced Technology Co., Ltd. 4-18-1, Tsukama Matsumoto, Nagano 390-0821, Japan, Proceedings of the 17 International Symposium on Power Semiconductor Devices & IC's May 23-26, 2005, Santa Barbara, CA.

Kao et al. "Two Dimensional Thermal Oxidation of Silicon-II. Modeling Stress Effects in Wet Oxides," IEEE Transactions on Electron Devices, vol. ED-35, No. 1, Jan. 1988, pp. 25-37.

Kao et al. "Two Dimensional Thermal Oxidation of Silicon-I. Experiments,", IEEE Transactions on Electron Devices, vol. ED-34,No. 5, May 1987, pp. 1008-1017.

Kassakian, J.G. et al., "High-frequency high-density converters for distributed power supply systems," (Apr. 1988) Proceedings of the IEEE, vol. 76, No. 4, pp. 362-376.

Kodama et al., "Temperature characteristics of a new 100V rated power MOSFET, VLMOS (vertical LOCOS MOS)", Proceedings of 2004 International Symposium on Power Semiconductor Devices and Ics, Kitakyushu, pp. 463-466 (2004).

Koops et al., "RESURF stepped oxide (RSO) MOSFET for 85V having a record-low specific on-resistance", Proceedings of 2004 International Symposium on Power Semiconductor Devices and ICs, Kitakyushu, pp. 185-188 (2004).

Korman, C.S. et al., "High performance power DMOSFET with integrated schottky diode," (1989) Proc. IEEE Power Electronics Specialist Conf. (PESC), pp. 176-179.

Kunori et al., "120V Multi RESURF Junction Barrier Schottky Rectifier (MR-JBS)" R & D Center, Shindengen Electric Mfg.Co.,Ltd. No. 10-13 Minami-cho Hanno-city Saitama, 357-8585, Japan, Accessed on Dec. 6, 2011.

Kurosaki et al., "200V Multi RESURF Trench MOSFET (MR-TMOS)" Shindengen Electric Mfg.Co.,Ltd. No. 10-13 Minami-cho Hanno-city Saitama, 357-8585, Japan, Accessed on Dec. 6, 2011.

Lorenz et al., "COOL MOS—An important milestone towards a new power MOSFET generation" Power Conversion pp. 151-160 (1988).

Maksimovic, A.M. et al., "Modeling and simulation of power electronic converters," (Jun. 2001) Proceedings of the IEEE, vol. 89, No. 6, pp. 898-912.

Mehrotra, M. et al., "Very low forward drop JBS rectifiers fabricated using submicron technology," (Nov. 1993) IEEE Transactions on Electron Devices, vol. 40, No. 11, pp. 2131-2132.

Minato et al., "Which is cooler, trench or multi-epitaxy? Cutting edge approach for the silicon limit by the super trench power MOS-FET (STM)" The 12th International Symposium on Power Semiconductor Devices and ICs, Proceedings, 2000.

(56) References Cited

OTHER PUBLICATIONS

Miura et al., "High Performance Superjunction UMOSFETs with Split P-Columns Fabricated by Multi-Ion-Implantations" NEC Electronics Corporation, Power Management Devices Division, Proceedings of the 17 International Symposium on Power Semiconductor Devices & IC's May 23-26, 2005, Santa Barbara, CA.
Moghadam "Delivering Value Around New Industry Paradigms," Technical Literature from Applied Materials, pp. 1-11, vol. 1, Issue 2, Nov. 1999.
Napoli et al., "Design consideration of 1000 V merged PiN Schottky diode using superjunction sustaining layer" Proceedings of the 13th International Symposium on Power Semiconductor Devices and ICs, Osaka, pp. 339-342, 2001.
Ninomiya et al., "Ultra-low on-resistance 60-100 V superjunction UMOSFETs fabricated by multiple ion-implantation" Proceedings of 2004 International Symposium on Power Semiconductor Devices and ICs, Kitakyushu, pp. 177-180 (2004).
Nitta et al., Experimental results and simulation analysis of 250V super trench power MOSFET(STM), ISPSD 2000, Copyright 2000 by IEEE. Catalog No. 00CH37094C.
Onishi et al., "24mΩcm2 680V Silicon Superjunction MOSFET" Matsumoto Branch, Fuji Hitachi Power Semiconductor Co., Ltd., 4-18-1 Tsukama, Matsumoto, 390-0821 Japan, Accessed on Dec. 6, 2011.
Park et al., "Lateral Trench Gate Super-Junction SOI-LDMOSFETs with Low On-Resistance," Institute for Microelectronics, University of Technology Vienna, Austria (2002), pp. 283-285.
Quddus, M., et al., "Drain Voltage Dependence of on Resistance in 700V Super Junction LDMOS Transistor", Proceedings of 2004 International Symposium on Power Semiconductor Devices and ICs, Kitakyushu, pp. 201-204 (2004).
R. van Dalen, "Electrical characterisation of vertical vapor phase doped (VPD) RESURF MOSFETs", Proceedings of 2004 International Symposium on Power Semiconductor Devices and Ics, Kitakyushu, pp. 451-454 (2004).
Rochefort et al., "A scalable trench etch based process for high voltage vertical RESURF MOSFETs", Philips Research Leuven, Kapeldreef 75, B-3001 Leuven, Belgium, Proceedings of the 17 International Symposium on Power Semiconductor Devices & IC's May 23-26, 2005, Santa Barbara, CA.
Rochefort et al., "Manufacturing of high aspect-ratio p-n junctions using Vapor Phase Doping for application in multi-Resurf devices", Philips Research Leuven, Kapeldreef 75, B-3001 Leuven, Belgium, Accessed on Dec. 6, 2011.
Roig et al., "Electrical and Physical Characterization of 150-200V FLYMOSFETs", Proceedings of the 18th International Symposium on Power Semiconductor Devices & IC's Jun. 4-8, 2006 Naples, Italy.
Rub et al., "550 V superjunction 3.9 Ωmm2 transistor formed by 25 MeV masked boron implantation", Proceedings of 2004 International Symposium on Power Semiconductor Devices and Ics, Kitakyushu, pp. 455-458 (2004).
Rub et al., "A 600V 8.7Ohmmm$^2$ Lateral Superjunction Transistor", Proceedings of the 18th International Symposium on Power Semiconductor Devices & IC's Jun. 4-8, 2006 Naples, Italy.
Rub et al., "First study on superjunction high-voltage transistors with n-columns formed by proton implantation and annealing", Proceedings of 2004 International Symposium on Power Semiconductor Devices and ICs, Kitakyushu, pp. 181-184 (2004).
S.G. Nassif-Khalil et al., "170V Super Junction—LDMOST in a 0.5 mm Commercial CMOS/SOS Technology" University of Toronto, Toronto, Ontario M5S 3G4, Canada, Accessed on Dec. 6, 2011.
Saggio et al., "MDmeshTM: innovative technology for high voltage Power MOSFETs", Proceedings of 2000 International Symposium on Power Semiconductor Devices and ICs (2000).
Saint-Eve et al., "Reliability of CoolMOSTM Under Extremely Hard Repetitive Electrical Working Conditions" ENS de Cachan, 61, av. du Président Wilson, 94235 Cachan Cedex, Accessed on Dec. 6, 2011.
Saito et al., "600V Semi-superjunction MOSFET" Toshiba Corp. Semiconductor Company, Komukai Toshiba-cho, Saiwai-ku, Kawasaki 212-8583, Japan, Accessed on Dec. 6, 2011.
Saito et al., "A 15.5mΩcm2-680V Superjunction MOSFET Reduced On-Resistance by Lateral Pitch Narrowing" Proceedings of the 18th International Symposium on Power Semiconductor Devices & IC's Jun. 4-8, 2006 Naples, Italy.
Saito et al., "A 20mΩcm2 600 V-class superjunction MOSFET", Proceedings of 2004 International Symposium on Power Semiconductor Devices and Ics, Kitakyushu, pp. 459-462 (2004).
Saito et al., "Over 1000V Semi-Superjunction MOSFET with Ultra-Low On-Resistance blow the Si-Limit", Toshiba Corp. Semiconductor Company, Komukai Toshiba-cho, Saiwai-ku, Kawasaki 212-8583, Japan, Proceedings of the 17 International Symposium on Power Semiconductor Devices & IC's May 23-26, 2005, Santa Barbara, CA.
Saitoh et al., "Ultra Low On-Resistance SBD with P-Buried Floating Layer" Toshiba Corp. Semiconductor Company, Japan, Accessed on Dec. 6, 2011.
Sakai et al., "Experimental investigation of dependence of electrical characteristics of device parameters in trench MOS barrier, schottky diodes," (1998) International Symposium on Power Semiconductors and ICs, Technical Digest, pp. 293-296.
Sakakibara et al., "Break-through of the Si limit under 300V breakdown voltage with new concept power device : Super 3D MOSFET",Research Laboratories, DENSO Corporation, Nisshin, Aichi, 470-0111, Japan, Accessed on Dec. 6, 2011.
Sapp et al., "Novel Low Capacitance VDMOS Device for Switching and RF Power Amplification", Proceedings of the 17 International Symposium on Power Semiconductor Devices & IC's May 23-26, 2005, Santa Barbara, CA.
Schmitt et al., "A Comparison of Electron, Proton and Helium Ion Irradiation for the Optimization of the CoolMOSTM Body Diode", Infineon Technologies AG, AI PS DD, Balanstr. 59, D-81541 Munich, Germany, Accessed on Dec. 6, 2011.
Shenai et al., "Current transport mechanisms in atomically abrupt metal-semiconductor interfaces," (Apr. 1988) IEEE Transactions on Electron Devices, vol. 35, No. 4, pp. 468-482.
Shenai et al., "Monolithically integrated power MOSFET and schottky diode with improved reverse recovery characteristics," (Apr. 1990) IEEE Transactions on Electron Devices, vol. 37, No. 4, pp. 1167-1169.
Shenoy et al. "Analysis of the Effect of Charge Imbalance on the Static and Dynamic Characteristic of the Super Junction MOSFET," IEEE International Symposium on Power Semiconductor Devices 1999, pp. 99-102 (1999).
Singer "Empty Spaces in Silicon (ESS): An Alternative to SOI," Semiconductor International p. 42, Dec. 1999.
Tabisz et al., "A MOSFET resonant synchronous rectifier for high-frequency dc/dc converters," (1990) Proc. IEEE Power Electronics Specialist Conf. (PESC), pp. 769-779.
Takahashi et al., "20m cm2 660V Super Junction MOSFETs Fabricated by Deep Trench Etching and Epitaxial Growth" Proceedings of the 18th International Symposium on Power Semiconductor Devices & IC's Jun. 4-8, 2006 Naples, Italy.
Takaya et al., "Floating Island and Thick Bottom Oxide Trench Gate MOSFET (FITMOS)—A 60V Ultra Low On-Resistance Novel MOSFET with Superior Internal Body Diode-", Proceedings of the 17 International Symposium on Power Semiconductor Devices & IC's May 23-26, 2005, Santa Barbara, CA.
Technical Literature from Quester Technology, Model APT-4300 300mm Atmospheric TEOS/Ozone CVD System, (unknown date), 3 pages total.
Technical Literature from Quester Technology, Model APT-6000 Atmospheric TEOS-Ozone CVD System, (unknown date), 2 pages total.
Technical Literature from Silicon Valley Group Thermal Systems, APNext, High Throughput APCVD Cluster Tool for 200 mm/300 mm Wafer Processing, (unknown date), 2 pages total.
Tu et al. "On the reverse blocking characteristics of schottky power diodes," (Dec. 1992) IEEE Transactions on Electron Devices. vol. 39, No. 12, pp. 2813-2814 2 pages total.

(56) References Cited

OTHER PUBLICATIONS

Udrea et al., "Ultra-high voltage device termination using the 3D RESURF (super-junction) concept—experimental demonstration at 6.5 kV", Proceedings of 2001 International Symposium on Power Semiconductor Devices and Ics, Osaka, pp. 129-132 (2001).

Ueda et al., "An Ultra-Low On-Resistance Power MOSFET Fabricated by Using a Fully Self-Aligned Process", IEEE Transactions on Electron Devices, Apr. 1987, pp. 926-930, vol. ED-34, No. 4.

Wilamowski "Schottky Diodes with High Breakdown Voltages," Solid-State Electronics 26:491-493 (1983).

Wolf, "Silicon Processing for the VLSI Era" vol. 2 Process Integration Lattice Press (1990), 3 pages total.

Yamaguchi et al., "Breakthrough of on-resistance Si limit by Super 3D MOSFET under 100V breakdown voltage", Proceedings of the 18th International Symposium on Power Semiconductor Devices & IC's Jun. 4-8, 2006 Naples, Italy.

Yamaguchi et al., "Ultra Low On-resistance Super 3D MOSFET" Research Laboratories, DENSO Corporation, Nisshin, Aichi, 470-0111, Japan, Accessed on Dec. 6, 2011.

Yamashita et al., Conduction Power loss in MOSFET synchronous rectifier with parallel-connected schottky barrier diode, (Jul. 1998) IEEE Transactions on Power electronics, vol. 13, No. 4, pp. 667-673.

Yamauchi et al., "200V Super Junction MOSFET Fabricated by High Aspect Ratio Trench Filling", Proceedings of the 18th International Symposium on Power Semiconductor Devices & IC's Jun. 4-8, 2006 Naples, Italy.

Yamauchi et al., "Electrical Properties of Super Junction p-n Diodes Fabricated by Trench Filling" Shoichi Yamauchi, Yoshiyuki Hattori* and Hitoshi Yamaguchi Research Laboratories, DENSO Corporation, Nissin, Aichi, 470-0111, Japan, Accessed on Dec. 6, 2011.

Yamauchi et al., "Fabrication of high aspect ratio doping region by using trench filling of epitaxial Si growth", Proceedings of 2001 International Symposium on Power Semiconductor Devices and Ics, Osaka, pp. 363-366 (2001).

Yamauchi et al., "Influence of trench etching on super junction devices fabricated by trench filling", Proceedings of 2004 International Symposium on Power Semiconductor Devices and ICs, Kitakyushu, pp. 193-196 (2004).

Yamazaki et al., "Forward transient behavior of PiN and super junction diodes" Proceedings of 2004 International Symposium on Power Semiconductor Devices and ICs, Kitakyushu, pp. 197-200 (2004).

Zhang et al., "Analysis of the forward biased safe operating area of the super junction MOSFET" Proceedings of 2000 International Symposium on Power Semiconductor Devices and ICs (2000).

Zingg"New benchmark for RESURF, SOI and super-junction power devices", Proceedings of 2001 International Symposium on Power Semiconductor Devices and Ics, Osaka, pp. 343-346 (2001).

The Extended European Search Report corresponding to the Application No. 08831427.3, date of mailing Feb. 15, 2011, 7 pages total.

International Search Report and Written Opinion corresponding to the PCT application No. PCT/US2008077118, date of mailing Nov. 19, 2008, 9 pages total.

International Search Report corresponding to the PCT application No. PCT/US200210008, date of mailing Sep. 23, 2003, 2 pages total.

Chinese Office Action corresponding to the Application No. 2008-80117046.4, date of mailing Jun. 9, 2011, 14 pages total.

200880117046.4, , "Office action received for Chinese patent Application No. 200880117046.4, mailed on Mar. 22, 2012", 26 pages including 16 pages of English Translation.

* cited by examiner

5um Trench
7um Mesa
2.9um Gaps
Uniform Active Area
BV @ 645V

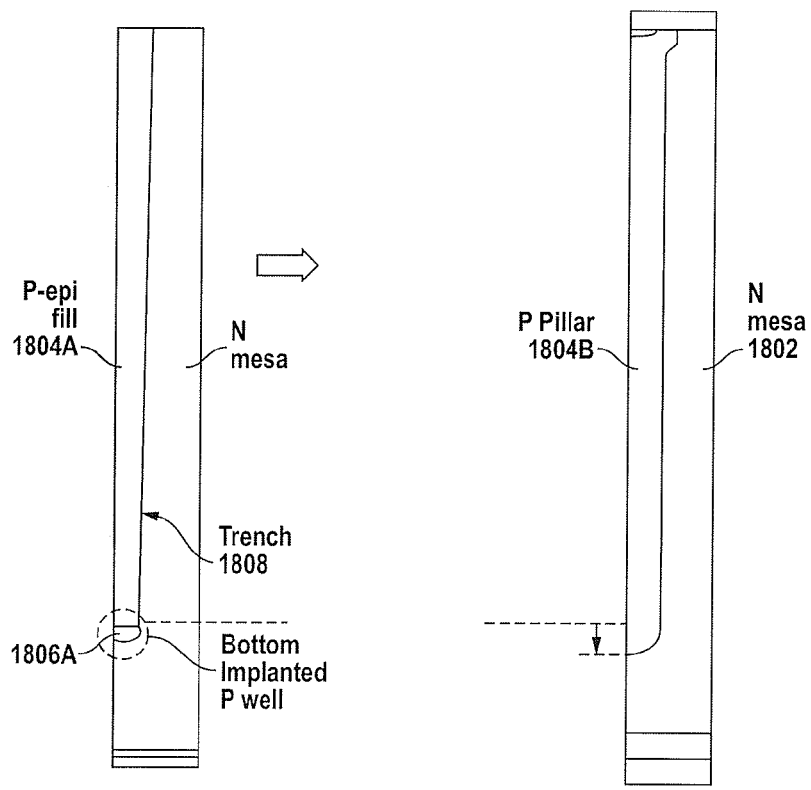
FIG. 18A
FIG. 18B
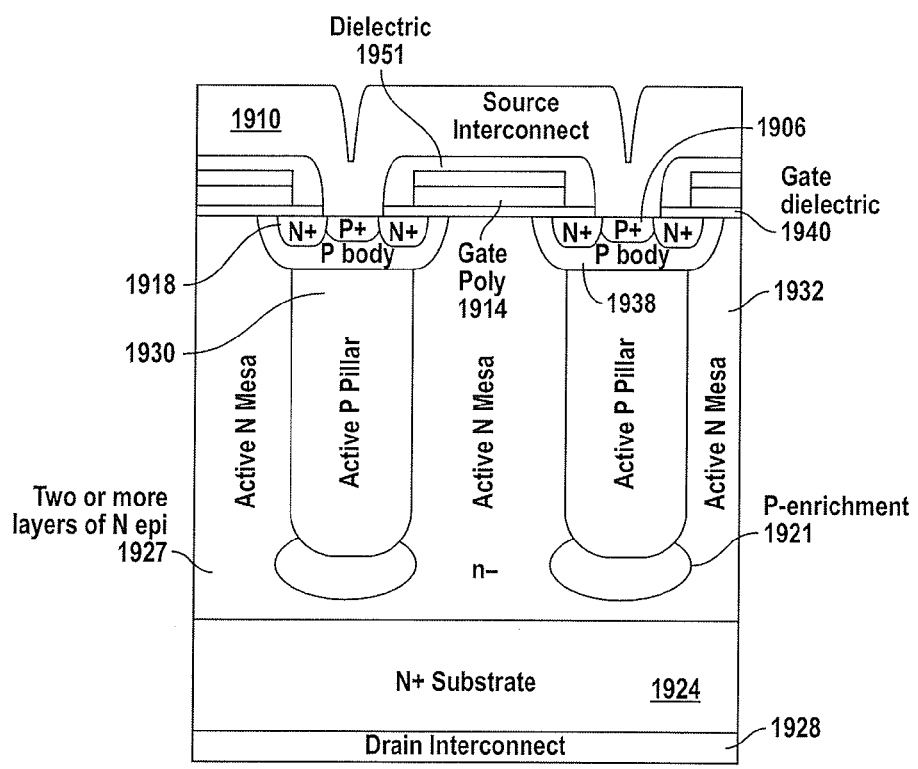
FIG. 19

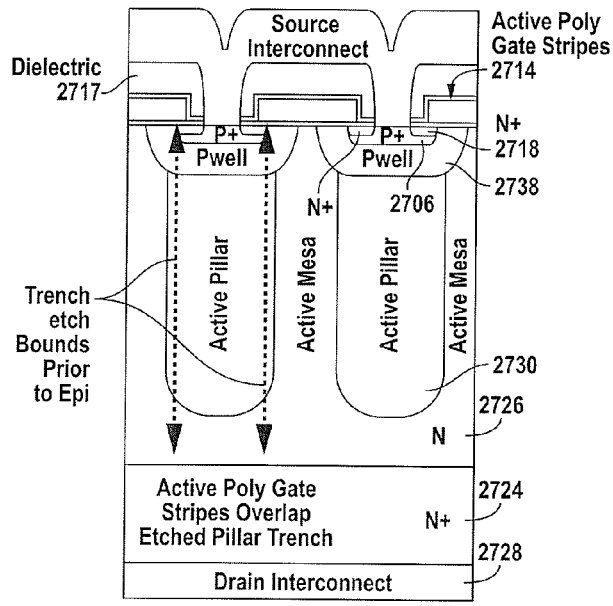
FIG. 27A
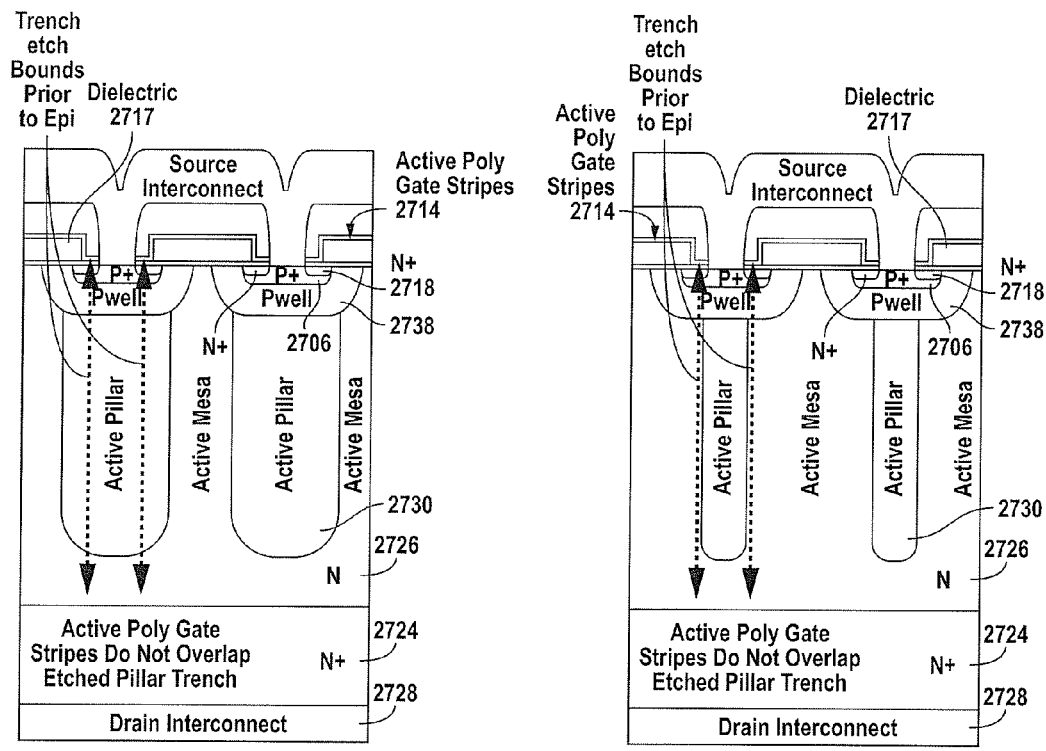
FIG. 27B
FIG. 27C

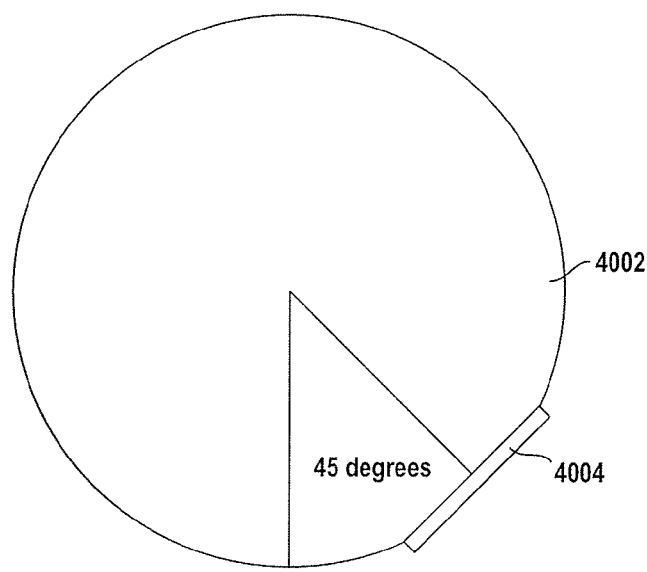
FIG. 40
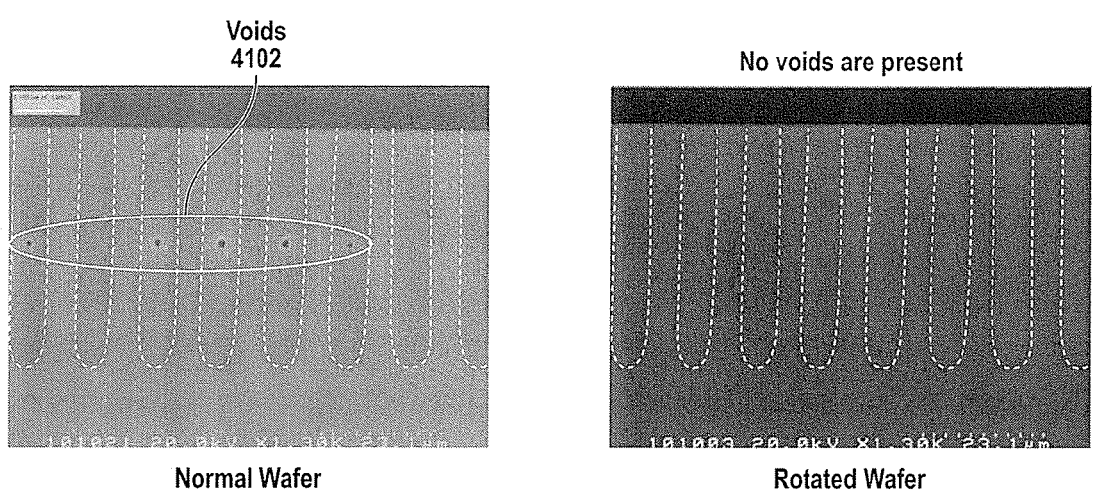
Normal Wafer
FIG. 41A
Rotated Wafer
FIG. 41B 50 um deep trench after etch No HCl deposition Ramped HCl process

SUPERJUNCTION STRUCTURES FOR POWER DEVICES

CROSS-REFERENCE TO RELATED APPLICATIONS

This application claims the benefit of U.S. Provisional Appln. No. 60/974,433, filed Sep. 21, 2007, which is incorporated by reference in its entirety for all purposes.

BACKGROUND OF THE INVENTION

The present invention relates in general to semiconductor technology and in particular to various embodiments for improved power semiconductor devices such as transistors and diodes and their methods of manufacture.

The key component in power electronic applications is the solid-state switch. From ignition control in automotive applications to battery-operated consumer electronic devices, to power converters in industrial applications, there is a need for a power switch that optimally meets the demands of the particular application. Solid-state switches including, for example, the power metal-oxide-semiconductor field effect transistor (power MOSFET), the insulated-gate bipolar transistor (IGBT) and various types of thyristors have continued to evolve to meet this demand. In the case of the power MOSFET, for example, double-diffused structures (DMOS) with lateral channel (e.g., U.S. Pat. No. 4,682,405 to Blanchard et al.), trenched gate structures (e.g., U.S. Pat. No. 6,429,481 to Mo et al.), and various techniques for charge balancing in the transistor drift region (e.g., U.S. Pat. No. 4,941,026 to Temple, U.S. Pat. No. 5,216,275 to Chen, and U.S. Pat. No. 6,081,009 to Neilson) have been developed, among many other technologies, to address the differing and often competing performance requirements.

Some of the defining performance characteristics for the power switch are its on-resistance, breakdown voltage and switching speed. Depending on the requirements of a particular application, a different emphasis is placed on each of these performance criteria. For example, for power applications greater than about 300-400 volts, the IGBT exhibits an inherently lower on-resistance as compared to the power MOSFET, but its switching speed is lower due to its slower turn off characteristics. Therefore, for applications greater than 400 volts with low switching frequencies requiring low on-resistance, the IGBT is the preferred switch while the power MOSFET is often the device of choice for relatively higher frequency applications. If the frequency requirements of a given application dictate the type of switch that is used, the voltage requirements determine the structural makeup of the particular switch. For example, in the case of the power MOSFET, because of the proportional relationship between the drain-to-source on-resistance $R_{DSon}$ and the breakdown voltage, improving the voltage performance of the transistor while maintaining a low $R_{DSon}$ poses a challenge. Various charge balancing structures in the transistor drift region have been developed to address this challenge with differing degrees of success.

Device performance parameters are also impacted by the fabrication process and the packaging of the die. Attempts have been made to address some of these challenges by developing a variety of improved processing and packaging techniques.

Whether it is in ultra-portable consumer electronic devices or routers and hubs in communication systems, the varieties of applications for the power switch continue to grow with the expansion of the electronic industry. The power switch therefore remains a semiconductor device with high development potential.

BRIEF SUMMARY OF THE INVENTION

In accordance with an embodiment of the invention a power device comprises an active region and a termination region surrounding the active region, and a plurality of pillars of first and second conductivity type alternately arranged in each of the active and termination regions, wherein the pillars of first conductivity type in the active and termination regions have substantially the same width, and the pillars of the second conductivity type in the active region have a smaller width than the pillars of the second conductivity type in the termination region so that a charge balance condition in each of the active and termination regions results in a higher breakdown voltage in the termination region than in the active region.

In one variation the first conductivity type is P-type and the second conductivity type is N-type.

In another variation the first conductivity type is N-type and the second conductivity type is P-type.

In another variation each of the pillars of first conductivity type comprises a trench substantially filled with P-type silicon, the trenches being separated from one another by N-type regions forming the pillars of second conductivity type.

In another variation the pillars of first conductivity type in the active region have substantially the same doping profile as the pillars of first conductivity type in the termination region.

In another variation the active region includes a planar gate structure extending over at least one of the pillars of second conductivity type in the active region.

In another variation the active region includes a trench gate structure extending to a predetermined depth within at least one of the pillars of the second conductivity type in the active region.

In another variation the active region does not include gate structure extending over any of the pillars of second conductivity type in the active region.

In another variation the pillars of first conductivity type in the active region are stripe-shaped, and the plurality of pillars of first conductivity type in the termination region surround the active region in a concentric fashion.

In another variation the plurality of pillars of first conductivity type in the active and termination regions are concentric.

In another variation a plurality of pillars of first conductivity type have termination pillars that are extensions of the active pillars and another plurality of termination pillars are parallel to the active region.

In accordance with another embodiment of the invention, a power device comprises an active region, a transition region, and a termination region surrounding the active and transition regions, and a plurality of pillars of first and second conductivity type alternately arranged in each of the active and termination regions, the transition region having at least one pillar of the first conductivity type and one pillar of the second conductivity type between the active and termination regions, the plurality of pillars of the first conductivity type in the active region being connected to a source terminal, the plurality of pillars of the first conductivity type in the termination region floating, and at least one pillar of the first conductivity type in the transition region being connected to the source terminal through a bridging diffusion of the first conductivity connecting at least one pillar of the first conductivity type in the transition region to one of the plurality of pillars of the first conductivity type in the active region, wherein the bridging diffusion extends across the width of the at least one pillar of the second conductivity type, the pillars of first conductivity type in the active and termination regions as well as the at least one pillar of the first conductivity type in the transition region all have substantially the same width, and the pillars of the second conductivity type in the active region have a smaller width than a width of the at least one pillar of the second conductivity type in the transition region so that a charge balance condition in each of the active and transition regions results in a higher breakdown voltage in the transition regions than in the active region.

In one variation the pillars of the second conductivity type in the active region have a smaller width than a width of the plurality of pillars of the second conductivity type in the termination region so that a charge balance condition in each of the active and termination regions results in a higher breakdown voltage in the termination region than in the active region.

In another variation the active region comprises body regions of the first conductivity type, and source regions of the second conductivity type in the body regions, wherein the bridging diffusion extends deeper than the body regions.

In another variation the bridging diffusion and the body regions have substantially similar doping concentration.

In another variation the active region comprises body regions of the first conductivity type, and source regions of the second conductivity type in the body regions, wherein the bridging diffusion extends to a shallower depth than the body regions.

In another variation the bridging diffusion has a lower doping concentration than the body regions.

In another variation the first conductivity type is P-type and the second conductivity type is N-type.

In another variation the first conductivity type is N-type and the second conductivity type is P-type.

In another variation each pillar of first conductivity type comprises a trench substantially filled with P-type silicon, the trenches being separated from one another by N-type regions forming the pillars of second conductivity type.

In another variation the pillars of first conductivity type in the active and termination regions and the at least one pillar of first conductivity type in the transition region all have substantially the same doping profile.

In another variation the active region includes a planar gate structure extending over at least one of the pillars of second conductivity type in the active region.

In another variation the active region includes a trench gate structure extending to a predetermined depth within at least one of the pillars of the second conductivity type in the active region.

In another variation the active region does not include gate structure extending over any of the pillars of second conductivity type in the active region.

In another variation the plurality of pillars of first conductivity type in the active region and the at least one pillar of first conductivity type in the transition region are stripe-shaped, and the plurality of pillars of first conductivity type in the termination region surround the active and transition regions in a concentric fashion.

In another variation the plurality of pillars of first conductivity type in the active and termination regions and the at least one pillar of the first conductivity type in the transition region are concentric.

In accordance with another embodiment of the invention, a power device comprises an active region and a termination region surrounding the active region, a plurality of pillars of first and second conductivity type alternately arranged in each of the active and termination regions, the pillars of first conductivity type in the active and termination regions having substantially the same width and being spaced from one another by substantially the same distance, and a surface well region of the first conductivity type extending across a top region of two or more of the pillars of the first conductivity type in the termination region, each of the surface well regions being centered about its corresponding pillar of the first conductivity type, and at least two of the surface well regions having different widths.

In one variation a width of two or more of the surface well regions decreases in a direction away from the active region.

In another variation two or more of the surface well regions have the same width.

In another variation a width of one or more of the surface well regions is greater than the width of the pillars of the first conductivity type.

In another variation a width of one or more of the surface well regions is smaller than the width of the pillars of the first conductivity type.

In another variation the active region comprises body regions of the first conductivity type, and source regions of the second conductivity type in the well regions, wherein the body regions extend deeper than the surface well regions.

In another variation the active region comprises body regions of the first conductivity type, and source regions of the second conductivity type in the well regions, wherein the body regions have a higher doping concentration than the surface well regions.

In another variation the two or more of the pillars of the first conductivity type with a surface well region across their top region float.

In another variation the first conductivity type is P-type and the second conductivity type is N-type.

In another variation the first conductivity type is N-type and the second conductivity type is P-type.

In another variation each pillar of first conductivity type comprises a trench substantially filled with P-type silicon, the trenches being separated from one another by N-type regions forming the pillars of second conductivity type.

In another variation the pillars of first conductivity type in the active and termination regions all have substantially the same doping profile.

In another variation the active region includes a planar gate structure extending over at least one pillar of second conductivity type in the active region.

In another variation the active region includes a trench gate structure extending to a predetermined depth within at least one pillar of the second conductivity type in the active region.

In another variation the active region does not include gate structure extending over any of the pillars of second conductivity type in the active region.

In another variation the plurality of pillars of first conductivity type in the active region are stripe-shaped, and the plurality of pillars of first conductivity type in the termination region surround the active region in a concentric fashion.

In another variation the plurality of pillars of first conductivity type in the active and termination regions are concentric.

In another variation a plurality of pillars of first conductivity type have termination pillars that are extensions of the active pillars and another plurality of termination pillars extend parallel to the plurality of first and second conductivity type in the active region.

In accordance with another embodiment of the invention, a power device comprises an active region and a termination region surrounding the active region, a plurality of pillars of first and second conductivity type alternately arranged in each of the active and termination regions, the pillars of first conductivity type in the active and termination regions having substantially the same width and being spaced from one another by substantially the same distance, and a surface well region of the first conductivity type extending across a top region of two or more of the pillars of the first conductivity type in the termination region, one or more the surface well regions being offset relative to its corresponding pillar of the first conductivity type, and at least two of the surface well regions having different widths.

In one variation two or more of the surface well regions merge together.

In another variation a width of two or more of the surface well regions decreases in a direction away from the active region.

In another variation a width of one or more of the surface well regions is greater than the width of the pillars of the first conductivity type.

In another variation a width of one or more of the surface well regions is smaller than the width of the pillars of the first conductivity type.

In accordance with another embodiment of the invention, a power device comprises an active region and a termination region surrounding the active region, and a plurality of pillars of first and second conductivity type alternately arranged in each of the active and termination regions, the pillars of first conductivity type in the active region being stripe-shaped, and the pillars of the first conductivity type in the termination region being concentric, ends of the stripe-shaped pillars of first conductivity type being spaced from a first one of the concentric pillars of the first conductivity to form a gap region of the second conductivity type there between, wherein no diffusion region of the first conductivity type extends through the gap region thus allowing the gap region to float.

In one variation at least one full floating mesa is inserted between the termination and the gap region to provide additional isolation.

In another variation at least one partial floating mesa is inserted between the termination and the gap region to provide additional isolation.

In accordance with another embodiment of the invention, a power device comprises an active region and a termination region surrounding the active region, and a plurality of pillars of first and second conductivity type alternately arranged in each of the active and termination regions, the pillars of first conductivity type in the active region being stripe-shaped, and the pillars of the first conductivity type in the termination region being arranged concentrically around the active area but not continuous, ends of the stripe-shaped pillars of first conductivity type being spaced from a first one of the concentric pillars of the first conductivity to form a gap region of the second conductivity type there between, wherein no diffusion region of the first conductivity type extends through the gap region thus allowing the gap region to float.

In one variation at least one concentrically arranged termination pillars is continuous.

In another variation at least one full floating mesa is inserted between the termination and the gap region to provide additional isolation.

In another variation at least one partial floating mesa is inserted between the termination and the gap region to provide additional isolation.

In accordance with another embodiment of the invention, a power device comprises an active region and a termination region surrounding the active region, a gate interconnect electrically contacting polysilicon gates in the active region, a source interconnect electrically contacting source regions in the active region, a plurality of pillars of first and second conductivity type alternately arranged in each of the active and termination regions, and a polysilicon field plate extending over but being insulated from one or more of the plurality of first and second conductivity type in the termination region closest to the active region, wherein the polysilicon field plate is connected to the source interconnect.

In one variation portions of the gate interconnect extend into the termination region, the polysilicon field plate being configured so as to extend between the gate interconnect and the pillars of second conductivity type in the termination region.

In another variation a diffusion region of the first conductivity type extends under portions of the gate interconnect that extend along an edge region of the active region.

In accordance with another embodiment of the invention, a power device comprises an active region and a termination region surrounding the active region, a gate interconnect electrically contacting polysilicon gates in the active region, a source interconnect electrically contacting source regions in the active region, a plurality of pillars of first and second conductivity type alternately arranged in each of the active and termination regions, and a polysilicon field plate extending over but being insulated from one or more of the plurality of first and second conductivity type in the termination region and an isolation region disposed between the termination and active area, wherein the polysilicon field plate is connected to the source interconnect.

In one variation portions of the gate interconnect extend into the isolation region, the polysilicon field plate being configured so as to extend between the gate interconnect and the pillars of second conductivity type in the isolation region.

In another variation portions of the gate interconnect extend into the termination region, the polysilicon field plate being configured so as to extend between the gate interconnect and the pillars of second conductivity type in the termination region.

In another variation a diffusion region of the first conductivity type extends under portions of the gate interconnect that extend along an edge region of the active region.

In accordance with another embodiment of the invention, a power device comprises an active region and a termination region surrounding the active region, a plurality of pillars of first and second conductivity type alternately arranged in each of the active and termination regions, the pillars of first conductivity type in the active region being stripe-shaped, body regions of first conductivity type extending through the stripe-shaped pillars of the first conductivity type in the active region but terminating prior to ends of the striped-shape pillars of the first conductivity type in the active, one or more diffusion regions of the first conductivity type extending at least in portions of the striped-shaped pillars of the first conductivity type in the active region where the body regions do not extend.

In one variation at least one diffused of first conductivity type region bridges an active body region.

In another variation none of diffused regions of first conductivity type bridges an active body region.

In another variation at least one diffused regions of first conductivity extends beyond the end of the stripe-shaped active pillars.

In another variation at least one diffused regions of first conductivity is coincident with the end of the stripe-shaped active pillars.

In another variation at least one diffused regions of first conductivity is contained within the bounds of the end of the stripe-shaped active pillars.

In accordance with another embodiment of the invention, a power device comprises an active region and a termination region surrounding the active region, a plurality of pillars of first and second conductivity type alternately arranged in each of the active and termination regions, and a plurality of conductive floating field plates in the termination region, each floating field plate extending over but being insulate from at least one of the pillars of the first conductivity type in the termination region.

In accordance with another embodiment of the invention, a power device comprises an active region and a termination region surrounding the active region, a plurality of active pillars of first and second conductivity type alternately arranged in the active region, the plurality of active pillars of first and second conductivity type extending into the termination region, a plurality of termination pillars of first and second conductivity type alternately arranged in the termination region, all the plurality of active and termination pillars of first and second conductivity type being parallel to one another, and a plurality of surface P-well rings of the first conductivity type extending in the termination region in a concentric fashion with substantially right angle corners, the plurality of surface P-well rings intersecting portions of the active pillars of first and second conductivity type in the active region that extend out of the active region, each ring further extending through an upper surface region of a corresponding one of a plurality of first conductivity type pillars that do not extend into the active region.

In one variation the plurality of active and termination pillars of first and second conductivity type are configured to have an N-rich charge balance condition.

In another variation the plurality of active and termination pillars of first conductivity type have substantially the same width and are spaced from one another by substantially the same distance.

In another variation the width of the plurality of active and termination pillars of the first conductivity type is smaller than the spacing between the plurality of active and termination pillars of the first conductivity type so as to create an N-rich charge balance condition in the active and termination regions.

In another variation portions of the plurality of active pillars of first and second conductivity type that extend into the termination region are configured to have an N-rich charge balance condition.

In another variation a portion of each of the plurality of active pillars of first conductivity type that extends in the termination region has a width that gradually narrows in the direction away from the active region.

In another variation a portion of each of the plurality of active pillars of first conductivity type that extends in the termination region has a narrower width than a portion that extends in the active region.

In accordance with another embodiment of the invention, a method of forming a power device comprises forming deep trenches in a silicon region of a first conductivity type, implanting dopants of a second conductivity type on a bottom of each trench, substantially filling each trench with silicon material of the second conductivity type, thus effectively increasing a depth of pillars of the second conductivity type comprising the implanted regions and the silicon material substantially filling each trench.

In one variation one or more temperature cycles is applied to diffuse out the implanted dopants.

In another variation the implant doping of second conductivity type is sufficiently high enough to create a P-rich imbalance condition at the bottom of the pillar.

In another variation the pillars of the same width and are spaced from one another by the same distance.

In another variation the width of the pillars is smaller than the spacing between the pillars.

In another variation the width of the pillars is greater than the spacing between the pillars.

In accordance with another embodiment of the invention, a power device comprises a plurality of pillars of first and second conductivity type alternately arranged in a silicon layer, a plurality of enrichment regions of the first conductivity type each formed at a bottom of one of the plurality of pillars of first conductivity type to thereby form a charge imbalance condition at the bottom of the plurality of pillars of first conductivity type so that an onset of avalanche breakdown occurs at the bottom of the plurality of pillars of first conductivity type.

In accordance with another embodiment of the invention, a method of forming a power device comprises forming a first silicon layer of first conductivity type over a substrate, implanting dopants to form enrichment regions of a second conductivity type in an upper portion of the first silicon layer, forming a second layer of silicon of the first conductivity type over the first layer of silicon, forming trenches extending through the second layer of silicon, and substantially filling each trench with silicon material of the second conductivity type such that dopants in the silicon material of the second conductivity in each trench merges with at least one of the enrichment regions thereby forming pillars of the second conductivity type each having a greater doping concentration at its bottom than the rest of the pillar.

In one variation the implant doping of second conductivity type is sufficiently high enough to create a P-rich imbalance condition at the bottom of the pillar.

In another variation the pillars of the same width and are spaced from one another by the same distance.

In another variation the width of the pillars is smaller than the spacing between the pillars.

In another variation the width of the pillars is greater than the spacing between the pillars.

In another variation the P-pillar extends through the P-enrichment region.

In accordance with another embodiment of the invention, a power device comprises an active region and a termination region surrounding the active region, a plurality of active pillars of first and second conductivity type alternately arranged in the active region, and a plurality of terminations pillars of first and second conductivity type alternately arranged in the termination region, enrichment regions of the first conductivity type formed in all or a subset of the plurality of active of pillars of first conductivity type, but none of the termination pillars of the first conductivity type.

In one variation the enrichment regions do not extend along the full length of the plurality of active pillars of the first conductivity type.

In another variation the enrichment regions are discontinuous along the length of the plurality of active pillars of the first conductivity type.

In another variation the enrichment regions are not parallel to the plurality of active pillars of the first conductivity type.

In another variation the enrichment regions are wider than the plurality of active pillars of the first conductivity type.

In another variation the enrichment regions are narrower than the plurality of active pillars of the first conductivity type.

In another variation the P-pillar extends through the P-enrichment.

In accordance with another embodiment of the invention, a power device comprises an active region and a termination region surrounding the active region, a plurality of active pillars of first and second conductivity type alternately arranged in the active region, and a plurality of terminations pillars of first and second conductivity type alternately arranged in the termination region, a compensation region of the first conductivity type extending through a portion of the plurality of active pillars of first and second conductivity type.

In one variation the compensation region further extends through a bottom portion of the plurality of termination pillars of first and second conductivity type.

In another variation the compensation regions are formed by one or more stripes that intersect at least two of the plurality of active pillars of first conductivity type.

In another variation the compensation regions are formed by one or more stripes that intersect at least two of the plurality of active pillars of second conductivity type.

In another variation the compensation regions are formed by one or more stripes not parallel to the plurality of active pillars of first conductivity type.

In another variation the P-pillars extend through the compensation regions.

In accordance with another embodiment of the invention, a power device comprises an active region and a termination region surrounding the active region, a plurality of active pillars of first and second conductivity type alternately arranged in the active region, and a plurality of terminations pillars of first and second conductivity type alternately arranged in the termination region, enrichment regions of the second conductivity type formed in all or a subset of the plurality of active of pillars of first conductivity type.

In one variation the N-enrichment regions do not extend along the full length of the plurality of active pillars of the first conductivity type.

In another variation the N-enrichment regions are discontinuous along the length of the plurality of active pillars of the first conductivity type.

In another variation the N-enrichment regions are not parallel to the plurality of active pillars of the first conductivity type.

In another variation the enrichment regions are also formed at a bottom of all or a subset of the plurality of termination pillars of first conductivity type.

In another variation the enrichment regions are wider than the plurality of active pillars of the first conductivity type.

In another variation the enrichment regions are narrower than the plurality of active pillars of the first conductivity type.

In another variation the N-enrichment regions are not parallel to the plurality of active pillars of the first conductivity type.

In accordance with another embodiment of the invention, a power device comprises an active region and a termination region surrounding the active region, a plurality of active pillars of first and second conductivity type alternately arranged in the active region, and a plurality of termination pillars of first and second conductivity type alternately arranged in the termination region, enrichment regions of the second conductivity type formed in all or a subset of the plurality of active of pillars of second conductivity type.

In one variation the N-enrichment regions do not extend along the full length of the plurality of active pillars of the second conductivity type.

In another variation the N-enrichment regions are discontinuous along the length of the plurality of active pillars of the second conductivity type.

In another variation the N-enrichment regions are not parallel to the plurality of active pillars of the second conductivity type.

In another variation the enrichment regions are also formed at a bottom of all or a subset of the plurality of termination pillars of second conductivity type.

In another variation the enrichment regions are wider than the plurality of active pillars of the second conductivity type.

In another variation the enrichment regions are narrower than the plurality of active pillars of the second conductivity type.

In another variation the N-enrichment regions are not parallel to the plurality of active pillars of the second conductivity type.

In accordance with another embodiment of the invention, a power device comprises an active region and a termination region surrounding the active region, a plurality of active pillars of first and second conductivity type alternately arranged in the active region, and a plurality of terminations pillars of first and second conductivity type alternately arranged in the termination region, an enhancement region of the second conductivity type extending through all or a portion of the plurality of active pillars of first and second conductivity type.

In one variation the enhancement region further extends through a bottom portion of the plurality of termination pillars of first and second conductivity type.

In another variation the N enrichment regions are formed by one or more stripes that intersect at least two of the plurality of active pillars of first conductivity type.

In another variation the N enrichment regions are formed by one or more stripes that intersect at least two of the plurality of active pillars of second conductivity type.

In another variation the N enrichment regions are formed by one or more stripes not parallel to the plurality of active pillars of first conductivity type.

In another variation the P-pillars extend through the N enrichment regions.

In accordance with another embodiment of the invention, a power device comprises an active region and a termination region surrounding the active region, a plurality of active pillars of first and second conductivity type alternately arranged in the active region, a gate pad area, and a plurality of polysilicon gates extending in the active region, wherein a predetermined number of the plurality of polysilicon gates also extend into the gate pad area.

In one variation the power device comprises well regions extending between and overlapping the plurality of polysilicon gates, the well regions further extending in the gate pad area.

In another variation the power device comprises polysilicon bridges for electrically connecting adjacent polysilicon gates.

In another variation the polysilicon bridges are located in the gate pad area.

In another variation the polysilicon bridges are located along an outer perimeter of the gate pad area.

In another variation well regions extend between adjacent ones of the plurality of polysilicon gates, wherein a width of each polysilicon bridge is selected so that well regions on opposite sides of each polysilicon bridge merge.

In another variation the gate pad area includes a gate pad metal, the power device further including a gate runner metal extending out from a side of the gate pad metal in a direction away from the gate pad area and perpendicular to a direction that the plurality of polysilicon gates extend.

In another variation the power device comprises a plurality of contacts each configured to bring the gate runner metal in contact with one of the plurality of polysilicon gates.

In another variation the power device comprises a plurality of contacts each configured to bring the gate pad metal in contact with one of the plurality of polysilicon gates that extend into the gate pad area.

In another variation the plurality of contacts are located along an outer perimeter of the gate pad area.

In another variation the plurality of contacts are located along a row extending through a middle section of the gate pad area.

In accordance with another embodiment of the invention, a power device comprises trenches in a semiconductor region, silicon material in each trench such that the silicon material and portions of the semiconductor region extending between adjacent trenches form pillars of alternating conductivity type, and gate electrodes insulated from the semiconductor region by a gate dielectric layer, wherein the trenches and the gate dielectric layer are configured so that the gate dielectric layer does not laterally overlap the trenches.

In accordance with another embodiment of the invention, a method of forming a power device comprises forming trenches in a semiconductor region, forming silicon material in each trench so that the silicon material and portions of the semiconductor region extending between adjacent trenches form pillars of alternating conductivity type, and forming gate electrodes insulated from the semiconductor region by a gate dielectric layer, wherein the trench and the gate dielectric layer are configured so that the gate dielectric layer does not laterally overlap the trench.

In accordance with another embodiment of the invention, a die housing a power device comprises an active region, a termination region surrounding the active region, a scribe line area along the outer perimeter of the die, a plurality of active pillars of first and second conductivity type alternately arranged in the active region, a plurality of concentric termination pillars of first and second conductivity type arranged in the termination region, and a plurality of concentric scribe line pillars of first and second conductivity type alternately arranged in the scribe line area.

In accordance with another embodiment of the invention, a die housing a power device comprises an active region, a termination region surrounding the active region, a scribe line area along the outer perimeter of the die, a plurality of active pillars of first and second conductivity type alternately arranged in the active region, a plurality of termination pillars of first and second conductivity type alternately arranged in the termination region, and a plurality of scribe line pillars of first and second conductivity type alternately arranged in the scribe line area, wherein the plurality of scribe line pillars of first and second conductivity type extend in a direction perpendicular to the direction that the scribe line area extends.

In one variation the die comprises an interconnect layer configured to contact the plurality of scribe line pillars of the first conductivity type so as to bias the plurality of scribe line pillars of the first conductivity type to a predetermined potential during operation.

In another variation the plurality of scribe line pillars of first and second conductivity type are spaced from the plurality of termination pillars of first and second conductivity type by a predetermined mesa spacing.

In another variation the plurality of active pillars of first and second conductivity type are stripe shaped, and the plurality of termination pillars of first and second conductivity type are concentric.

In another variation the plurality of active pillars of first and second conductivity type and the plurality of termination pillars of first and second conductivity type are stripe shaped.

In accordance with another embodiment of the invention, a power device comprises an active region and a termination region surrounding the active region, and a plurality of pillars of first and second conductivity type alternately arranged in each of the active and termination regions, the pillars of first conductivity type in the active region being stripe-shaped, and the pillars of the first conductivity type in the termination region being concentric, ends of the stripe-shaped pillars of first conductivity type being spaced from a first one of the concentric pillars of the first conductivity to form a gap region of the second conductivity type therebetween, wherein the gap region has a predetermined width selected so as to obtain a charge balance condition along the gap region relative to a charge balance condition in the active region that results in the active region having a lower breakdown voltage than a breakdown voltage along the gap region.

In one variation the pillars of first conductivity type in both the active and termination regions are formed in trenches, the trenches having tapered sidewalls, wherein the predetermined width of the gap region is dependent in part on the degree to which the trench sidewalls are tapered and a spacing between the pillars of first conductivity type in the active region.

In accordance with another embodiment of the invention, a power device comprises a lower epitaxial layer over a substrate, an upper epitaxial layer over and in contact with the lower epitaxial layer, a plurality of trenches extending through the upper epitaxial layer and terminating within the lower epitaxial layer, each trench having tapered sidewalls, and a silicon material formed in each trench such that the silicon material together with portions of the upper and lower epitaxial layers extending between adjacent trenches form pillars of alternating conductivity type, wherein the upper epitaxial layer has a higher doping concentration than the lower epitaxial layer.

In one variation the upper epitaxial layer includes a JFET implant region between adjacent trenches near a top surface of the upper epitaxial layer, the JFET implant region being of the same conductivity type as the upper epitaxial layer but having a higher doping concentration than the upper epitaxial layer.

In another variation a greater portion of the vertical depth of each trench extends in the upper epitaxial layer than in the lower epitaxial layer.

In another variation the silicon material in each trench has a doping concentration which increases in the direction from bottom of the trench toward the top of the trench.

In another variation the lower epitaxial layer has a doping concentration which increases in the direction from bottom toward top of the lower epitaxial layer.

In another variation the upper epitaxial layer has a doping concentration which increases in the direction from bottom toward top of the upper epitaxial layer.

In accordance with another embodiment of the invention, a method for transferring alignment marks from backside of a substrate to a topside of the substrate comprises forming alignment marks along a backside of a substrate, after forming the alignment marks, forming an epitaxial layer along a topside of the substrate, forming trenches in the epitaxial layer and after forming the trenches, transferring the alignment marks to the topside of the substrate.

In one variation prior to transferring the alignment marks to the topside of the substrate, planarizing a topside surface of the substrate.

In another variation prior to planarizing, filling the trenches with silicon material.

In another variation after planarizing the topside surface of the substrate, the silicon material remaining in the trenches together with portions of the epitaxial layer extending between adjacent trenches form pillars of alternating conductivity type.

In another variation the planarizing is carried out using chemical mechanical polish.

In another variation the alignment marks are formed in a polysilicon layer extending along the backside of the substrate.

In another variation prior to forming the epitaxial layer, forming a dielectric layer on the backside of the substrate over the polysilicon layer to prevent formation of an epitaxial layer over the polysilicon layer during the step of forming an epitaxial layer.

In accordance with another embodiment of the invention, a method for forming a power device comprises forming trenches in a semiconductor region, filling the trenches with silicon material, and after filling the trenches, carrying out a post-bake process.

In one variation the post bake process results in silicon migration in the silicon material to thereby minimize leakage due to silicon defects.

In another variation the post-bake process is carried out at a temperature within the range of 1150-1250° C. for at least a period of 30 minutes in an inert ambient.

In another variation the semiconductor region includes an epitaxial layer over a substrate, and the trenches extend into the epitaxial layer, the method comprises after carrying out the post-bake process, forming body regions in the epitaxial layer, and forming heavy body regions in the body regions.

In another variation the semiconductor region includes an epitaxial layer over a substrate, and the trenches extend into the epitaxial layer, the silicon material together with portions of the epitaxial layer extending between adjacent trenches form pillars of alternating conductivity type.

In accordance with another embodiment of the invention, a power device comprises a plurality of trenches extending in a semiconductor region, wherein a crystal orientation of the semiconductor region along each the trench sidewalls, the trench bottom and along mesa surfaces adjacent the trenches match one another, and silicon material in the trenches such that the silicon material and the portions of the semiconductor region extending between adjacent trenches form pillar of alternating conductivity type.

In accordance with another embodiment of the invention, a power device comprises a plurality of trenches extending in a semiconductor region, wherein a crystal orientation along all horizontally extending and vertically extending surfaces inside and outside the plurality of trenches match one another, and silicon material in the trenches such that the silicon material and the portions of the semiconductor region extending between adjacent trenches form pillar of alternating conductivity type.

In accordance with another embodiment of the invention, a method of forming a power device comprises forming trenches in a semiconductor region, forming a first epitaxial layer lining trench sidewalls and bottom, removing a portion of the first epitaxial layer, and after removing a portion of the second epitaxial layer, forming a final epitaxial layer substantially filling the trenches.

In one variation after removing a portion of the first epitaxial layer and before forming the final epitaxial layer, forming a second epitaxial layer over remaining portions of the first epitaxial layer, and removing a portion of the second epitaxial layer.

In another variation the first, second and final epitaxial layer in the trenches together with portions of the semiconductor regions extending between adjacent trenches form pillars of alternating conductivity type.

In another variation the removing steps are carried out using HCl.

In another variation after removing a portion of the second epitaxial layer and prior to forming the final epitaxial layer, forming a third epitaxial layer over remaining portions of the second epitaxial layer, and removing a portion of the third epitaxial layer.

In another variation prior to removing a portion of the first epitaxial layer, the first epitaxial layer has a non-uniform thickness but the remaining portions of the first epitaxial layer have a substantially uniform thickness.

In another variation prior to removing a portion of the second epitaxial layer, the second epitaxial layer has a non-uniform thickness but the remaining portions of the second epitaxial layer have a substantially uniform thickness.

In accordance with another embodiment of the invention, a method of forming a power device comprises forming trenches in a semiconductor region, performing a first anneal in hydrogen ambient to remove lattice damage from along trench sidewalls and to round corners of the trenches, and after the first anneal, forming a first epitaxial layer lining trench sidewalls and bottom.

In one variation removing a portion of the first epitaxial layer, after removing a portion of the first epitaxial layer, performing a second anneal in hydrogen ambient to remove lattice damage from along exposed sidewalls and bottom of remaining portions of the first epitaxial layer, and after the second anneal, forming a second epitaxial layer over the remaining portions of the first epitaxial layer.

In another variation removing a portion of the second epitaxial layer, after removing a portion of the second epitaxial layer, performing a third anneal in hydrogen ambient to remove lattice damage from along exposed sidewalls and bottom of remaining portions of the second epitaxial layer, and after the third anneal, forming a final epitaxial layer substantially filling the trenches.

In another variation the first, second and final epitaxial layer in the trenches together with portions of the semiconductor regions extending between adjacent trenches form pillars of alternating conductivity type.

In another embodiment of the invention, a method of forming a power device comprises forming trenches in a semiconductor region, and forming an epitaxial layer in the trenches using ramped HCl flow.

In one variation the ramped HCl flow results in formation of epitaxial layer with a substantially uniform thickness.

In another variation the HCl gas is ramped from a small flow during initial trench filling to a high flow at the final closing of the trench.

In another variation the epitaxial layer in the trenches together with portions of the semiconductor regions extending between adjacent trenches form pillars of alternating conductivity type.

BRIEF DESCRIPTION OF THE DRAWINGS

FIGS. 18A and 18B are simplified cross section views at two process steps for forming P-pillars in accordance with an exemplary embodiment of the invention;

FIG. 19 is a simplified cross section view in accordance with an exemplary embodiment of the invention where P-enrichment regions are formed at the bottom of all P-pillars to create a local charge imbalance thereby inducing the onset of avalanche breakdown at the pillar bottoms;

FIGS. 27A-27C are simplified cross section views illustrating various techniques for ensuring that the active channel is not formed over the area where the pillar trench is etched and filled, in accordance with embodiments of the invention;

FIG. 40 is a top view of a wafer, illustrating a 45 degrees rotation of the wafer relative to its flat;

FIGS. 41A and 41B show silicon results for the cases where no wafer rotation was use (FIG. 41A) and where wafer rotation was used (FIG. 41B);

DETAILED DESCRIPTION OF THE INVENTION

The power switch can be implemented by any one of power MOSFET, IGBT, various types of thyristors and the like. Many of the novel techniques presented herein are described in the context of the power MOSFET for illustrative purposes. It is to be understood however that the various embodiments of the invention described herein are not limited to the power MOSFET and can apply to many of the other types of power switch technologies, including, for example, IGBTs and other types of bipolar switches and various types of thyristors, as well as diodes. Further, for the purposes of illustration, the various embodiments of the invention are shown to include specific P and N type regions (e.g., for an n-channel MOSFET). It is understood by those skilled in the art that the teachings herein are equally applicable to devices in which the conductivities of the various regions are reversed.

Figure 1A:
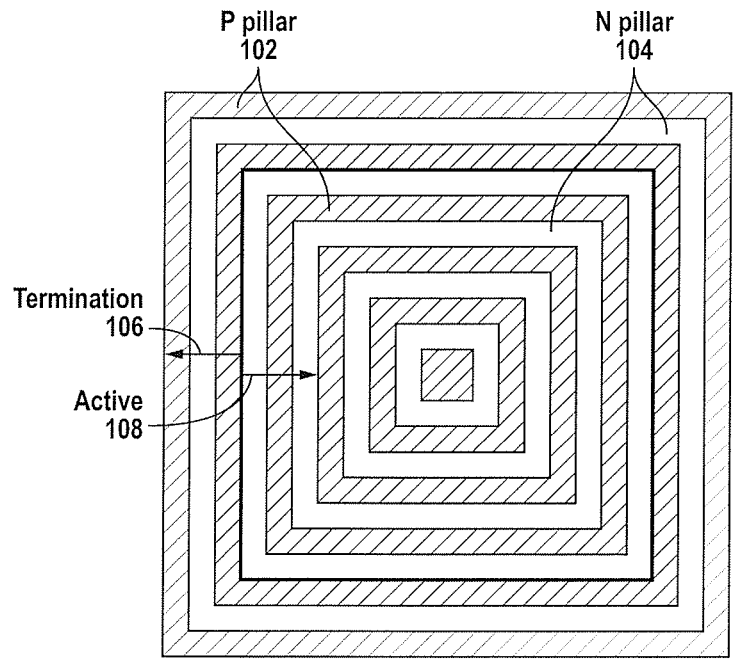
FIGS. 1A-1C show three different layout configurations for a superjunction FET in accordance with embodiments of the invention.
Figure 1B:
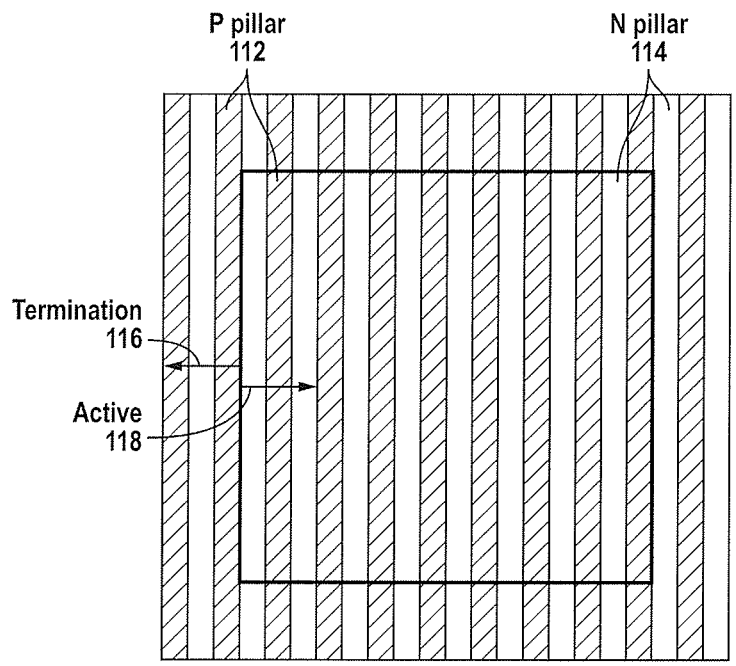
Figure 1C:
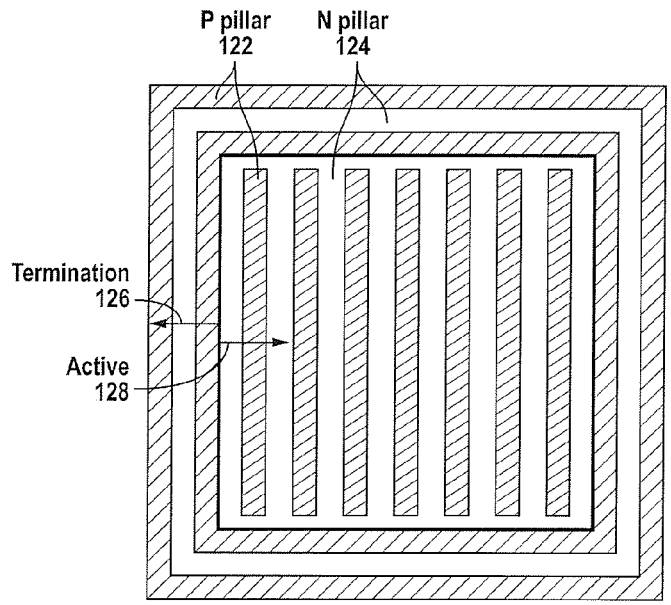

In the super junction technology, the alternating P/N pillars in the active and termination regions may be arranged in a number of different layout configurations. FIGS. 1A-1C show three such layout configurations. In FIG. 1A, P/N pillars 102 and 104 in both active region 108 and termination region 106 are arranged in a concentric configuration (hereinafter referred to as "full concentric" configuration); in FIG. 1B, P/N pillars 112 and 114 in both active region 118 and termination region 116 are arranged in a parallel (or striped) configuration (hereinafter referred to as "full parallel" design"); and in FIG. 1C, P/N pillars 122 and 124 in active region 128 are arranged in a parallel (or striped) configuration, and P/N pillars 122 and 124 in termination region 126 are arranged in a concentric configuration (hereinafter referred to as "parallel-concentric" configuration). Each of these layout configurations has its own merits and drawbacks. Some of the inventions and embodiments described in this disclosure address various drawbacks of each of these layout configurations.

The full concentric configuration shown in FIG. 1A enjoys uniform charge balance throughout the active and termination regions 108 and 106, but the active channel area may be reduced because the gate feeds must extend into the interior of active area 108 to feed the concentric active polysilicon gates. The channel may need to be removed at all the corners to prevent areas of lower threshold voltage and parasitic NPN turn-on. Thus, as the die size is reduced, the penalty in on-resistance (Rdson) attributed to these corners in the active area may become greater.

The full parallel configuration shown in FIG. 1B also enjoys uniform charge balance throughout the active and termination regions 118 and 116 but without the Rdson penalty of the full concentric configuration. However, the P/N pillar design in the full parallel configuration may be limited to an N-rich balance condition to insure that the pillars extending out into the termination area 116 from the active area 118 become fully depleted somewhere along their length. By using concentric pillars for the termination, as in FIG. 1C, the electric field can be distributed across the termination without full pillar depletion.

In the design where pillars (e.g., P-pillars) are formed using a trench etch and fill process, corners of the concentric pillars may be difficult to etch and fill resulting in voids in the epi fill that cause charge imbalance. These corners may thus become areas of high electric field stress. If they are shorted to source potential, either of the FIG. 1A and FIG. 1C layout configuration may have a lower breakdown voltage at these corners. In the parallel-concentric configuration shown in FIG. 1C, these corners may be moved outside active area 128 where they can float and are thus not fixed at source potential thereby minimizing or eliminating them as a source of localized lower breakdown voltage. Also, the active channel area can be maximized and gate feeds used that are more conventional only requiring a perimeter gate runner to make connection to the active polysilicon gates.

Figure 2:
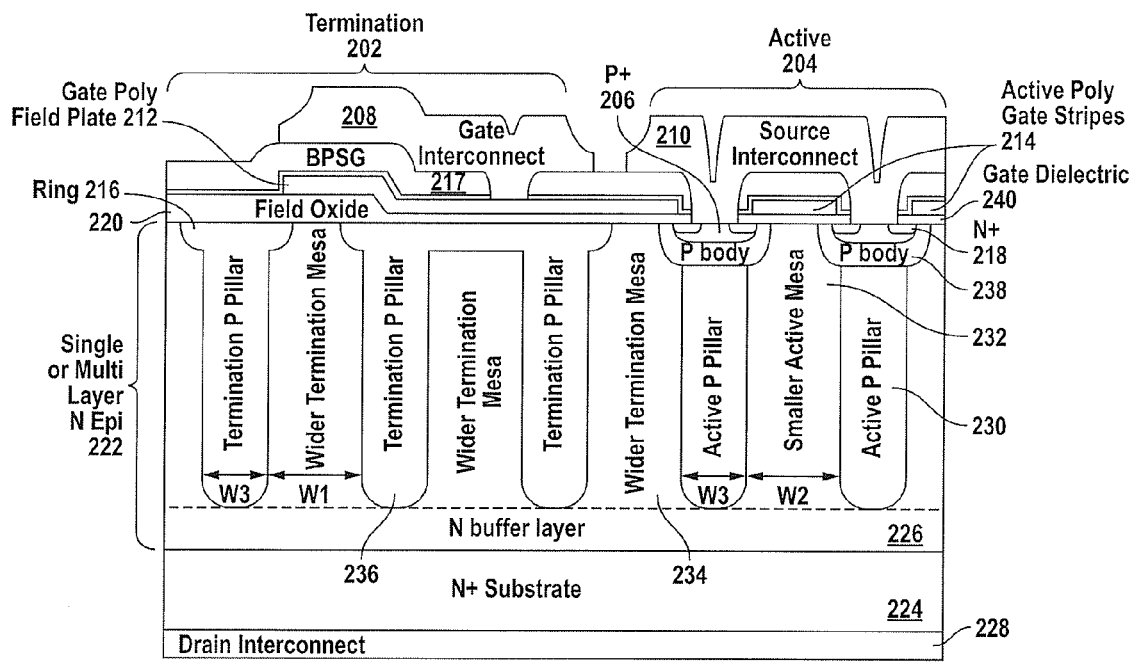
FIG. 2 shows a simplified cross section view of a superjunction FET that is configured so that breakdown first occurs in the active region, in accordance with an embodiment of the invention.

In order to achieve good Unclamped Inductive Switching (UIS) characteristics, it is desirable to design the device so that breakdown first occurs in the active region as opposed to any other region of the device including the termination region. One way to achieve this is to make sure that all regions of the device have sufficiently higher breakdown voltage than the active area by locally modifying the charge balance in these regions. FIG. 2 shows an exemplary embodiment of the present invention where this is achieved. In FIG. 2, P-pillars 230, 236 in both active region 204 and termination region 202 have the same width W3. Further, P-pillars 230, 236 in both active region 204 and termination region 202 may be trench filled pillars that are filled with the same doped material. Mesa regions 232, 234 (alternatively referred to as N-pillars in this disclosure) in both active region 204 and termination region 202 are also grown with the same epitaxial layer or layers.

Using known techniques, mesa width W1 and P-pillar width W3 as well as the doping profiles in P-pillars 230, 236 and N-type mesas 232, 234 may be designed to achieve a charge balance condition resulting in termination region 202 having a high breakdown voltage. In contrast, mesa width W2 in active region 204 may be adjusted to obtain a different charge balance condition that results in a lower breakdown voltage than other areas of the device including termination region 202. In one embodiment, mesa width W2 may be made narrower in active region 204 than mesa width W1 in termination region 202 so that active region 204 is more P-rich. In another embodiment, mesa width W2 in active region 204 may be made larger than mesa width W1 in termination region 202 so that active region 204 is more N-rich. Thus, initiating breakdown in active region 204 first results in a more stable breakdown characteristic and a more uniformly distributed current flow during a UIS event. Accordingly, both the breakdown and UIS characteristics of the device are improved. Note that an N-rich active region may result in a lower Rdson at the expense of UIS performance, and a P-rich active region may provide a better UIS performance at the expense of Rdson. Depending on the design goals, one approach may be preferred to the other.

In one embodiment, the active pillars are stripe-shaped with the termination pillars surrounding the active region in a concentric fashion similar to that shown in FIG. 1C. In another embodiment, the active and termination pillars are all concentric similar to that shown in FIG. 1A. In still another design, the termination pillars are extensions of the active pillars and include pillars parallel to the active region similar to that shown in FIG. 1B.

In some embodiments, active pillars extending parallel to the termination pillars must transition into the termination pillars without causing charge imbalance in order to ensure that the active region remains the area where breakdown initiates first. However, the pillars in the transition region between active and termination regions cannot be physically contacted and connected to the source potential due to metal-contact design rule limitations. Without properly biasing the transition pillars, the transition regions may become the regions that limit breakdown voltage.

Figure 3:
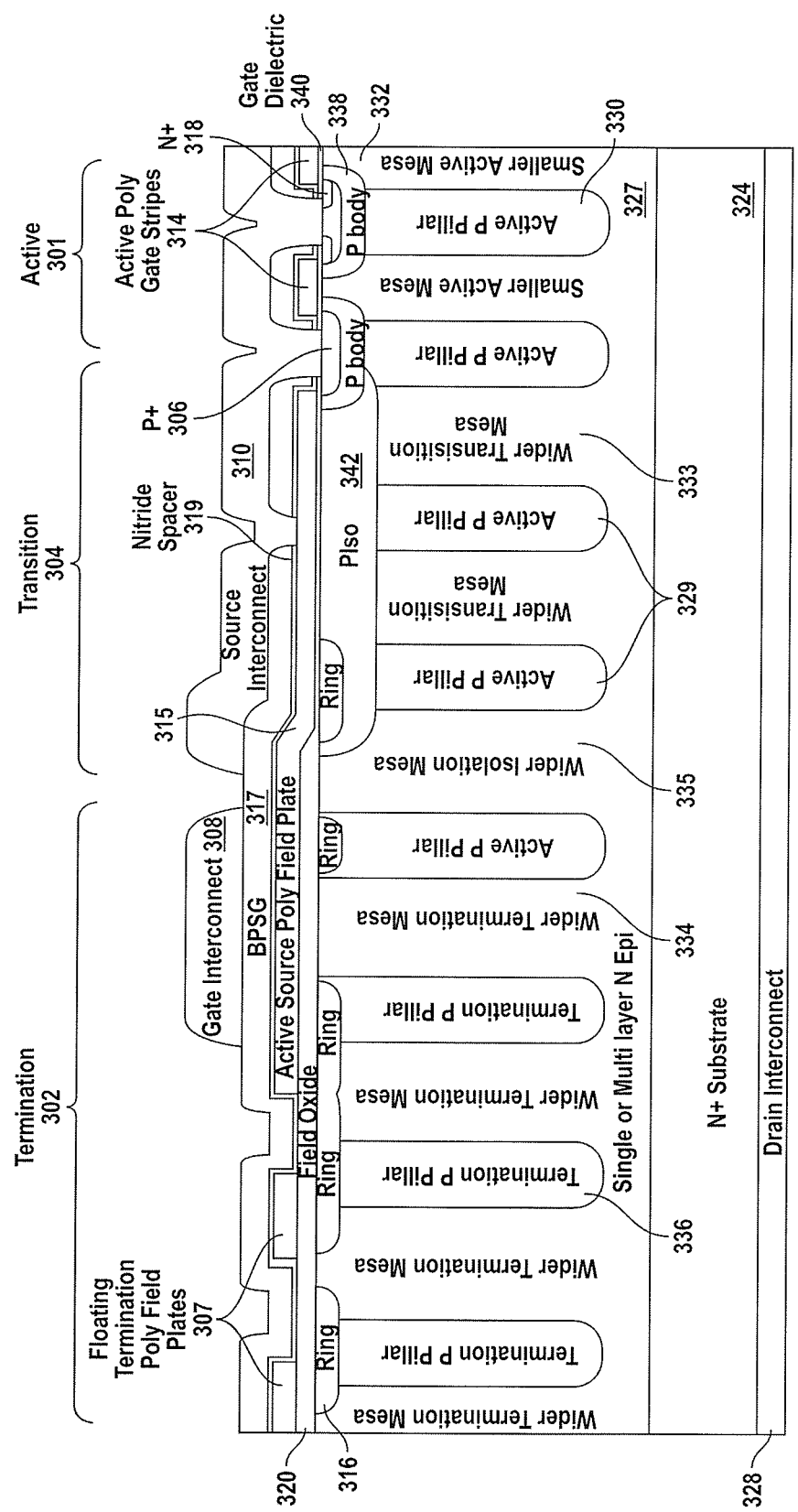
FIG. 3 shows a simplified cross section view of a superjunction FET where the transition pillars in the transition region are bridged to the first contacted pillar in the active area through a diffusion region, in accordance with an embodiment of the invention.

FIG. 3 shows an exemplary embodiment of the invention where transition pillars 329 in transition region 304 are bridged to first contacted pillar 330 in active area 301 through a diffusion region 342 marked as PIso in FIG. 3. This bridging diffusion may extend over N-type mesa regions 333 between transition pillars 329. When N-type mesa regions 333 have the same or smaller width than active N-type pillars 332, an increase in P charge in transition region 304 occurs. This increase in P charge can reduce the breakdown voltage below the rest of active area 301. To compensate for this increase in P charge, the width of N-type mesa regions 333 may be made greater than the width of N-type pillars 332. This can ensure that the breakdown of transition region 304 remains higher than active area 301. In the embodiment shown in FIG. 3, transition region 304 is defined by the span of the bridging diffusion 342.

As with the FIG. 2 embodiment, the width of the P-type pillars in all regions (the termination, transition and active regions) may be substantially the same, and the width of the termination mesa regions may be greater than the width of the active mesa regions. However, the width of the termination mesa regions may be greater than, the same as, or smaller than the width of the transition mesa regions.

In one embodiment, the bridging diffusion PIso may have a similar doping concentration to that of the P-well in the active region, and may be formed prior to gate oxidation and polysilicon deposition. In another embodiment, the active and transition pillars may be stripe-shaped with termination pillars surrounding the active and transition regions in a concentric fashion similar to the layout configuration shown in FIG. 1C. In yet another embodiment, the active, transition, and termination pillars may be concentric similar to the layout configuration shown in FIG. 1A.

In another embodiment not shown, instead of the PIso diffusion, a shallower P diffusion similar to the P diffusion regions marked in FIG. 3 as "Ring" may be used to bridge the transition pillars to the first contacted pillar in the active region. The shallower P diffusions are more lightly doped than the P-wells in the active region, and thus require less compensation in terms of transition mesa width.

Figure 4A:
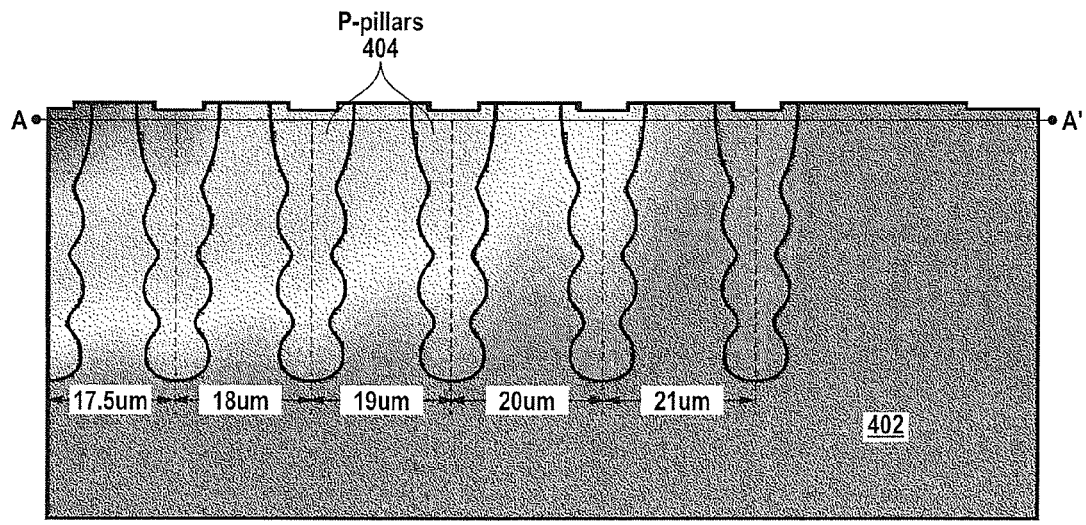
FIGS. 4A and 4B show simulation results for a conventional termination design with five termination P-pillar rings.
Figure 4B:
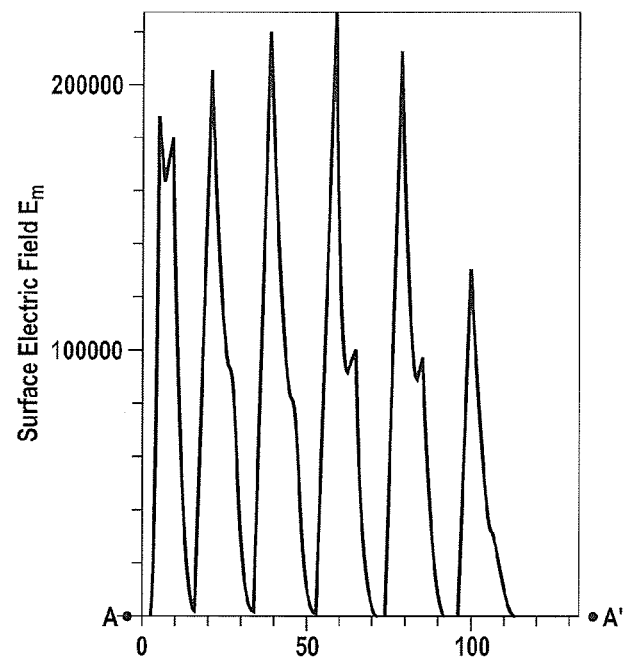

FIGS. 4A and 4B show simulation results for a conventional termination design with termination P-pillars 404. P-pillars 404 may be formed using conventional multi-epi processes. For example, a first N-type epitaxial layer is grown over a suitable substrate 402 followed by an aligned boron implantation into epi regions where P-pillars are to be formed. The steps of growing N-epi and an aligned boron implantation are repeated until the desired pillar height is obtained. In this process, pillar spacing can easily be adjusted by mask patterning during boron implantation to achieve a desired surface electric field profile. An exemplary set of spacing between adjacent pillars, which gradually increase in the direction away from the active, is shown in FIG. 4A. The corresponding surface electric field profile is shown in FIG. 4B.

Figure 5:
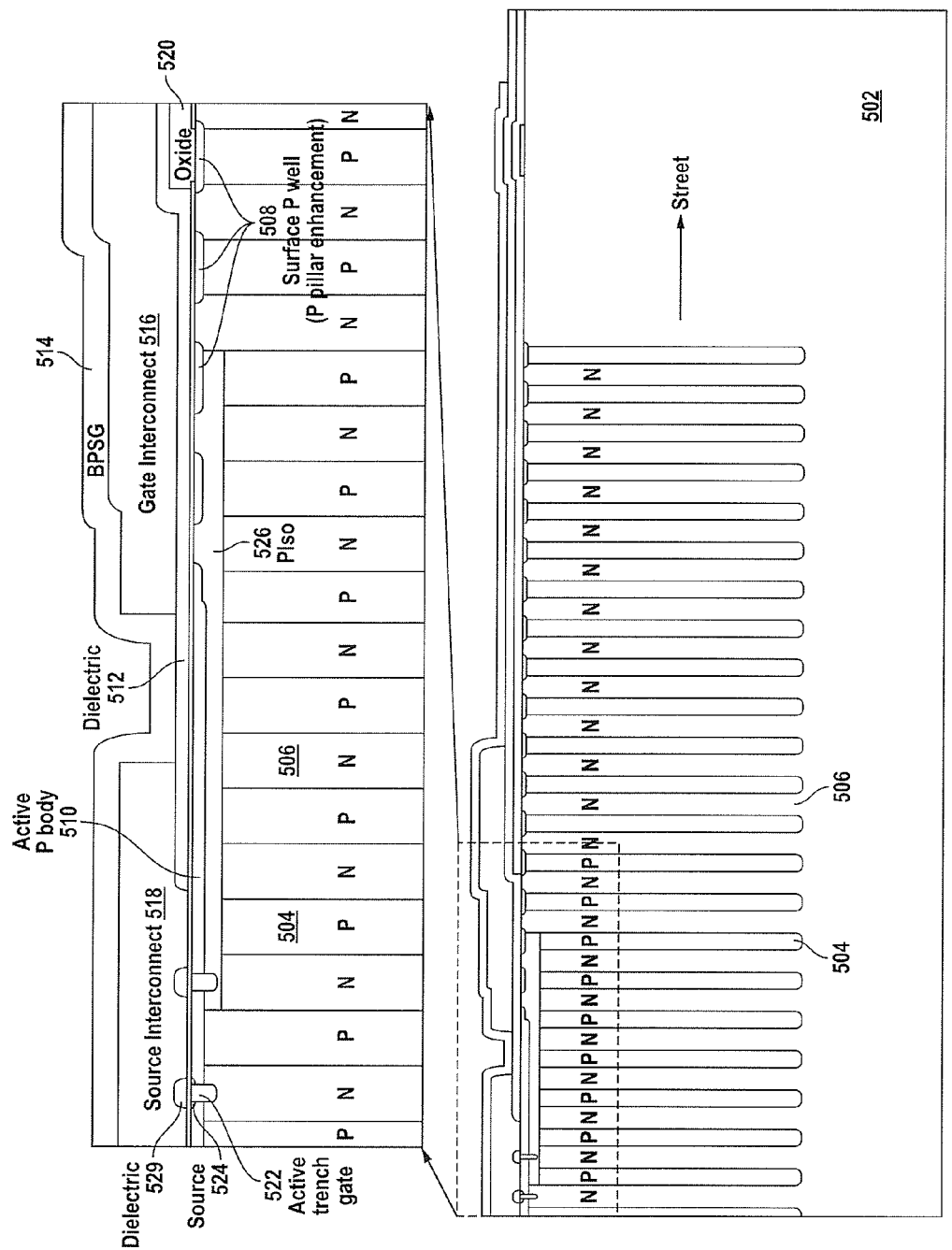
FIG. 5 shows a simplified cross section view of a superjunction FET where the desired surface electric profile is obtained using surface P-well regions that are centered about the P-pillars, in accordance with an embodiment of the invention.

In the process technology where pillars are formed by etching deep trenches and filling them with silicon, varying the mesa width is undesirable as it results in non-uniform trench etch and filling. Therefore, center-to-center pillar spacing needs to be maintained constant to the extent possible. However, with a constant pillar spacing other provisions need to be made to obtain the desired surface electric field profile. FIG. 5 shows an exemplary embodiment in accordance with the invention where the desired surface electric profile is obtained using surface P-well regions 508 that are centered about P-pillars 504 (also referred to herein as "P rings" or "P-enrichment of P-pillar surfaces"). As shown in FIG. 5, active P-body region 510 (in which source regions 524 are formed) may extend deeper than the surface well regions 508, and may have a higher doping concentration than surface well regions 508. The doping and depth of surface well regions 508 may be designed to obtain a charge balance state resulting in a high breakdown voltage with a low peak electric field and substantially evenly distributed electric field across the termination region.

It has been found that if the surface well widths are made too wide, most of the potential may be dropped across the last pillar and the street so that the electric field at the last pillar is high resulting in low breakdown voltage. When the well widths are made too small, most of the potential may be dropped across one of the pillars or only a few pillars close to the active area, so that the peak electric field at the termination pillars near the active region becomes high resulting in low breakdown voltage. Further, while FIG. 5 shows surface P-wells 508 to be of equal width, the invention is not so limited as illustrated next.

Figure 6A:
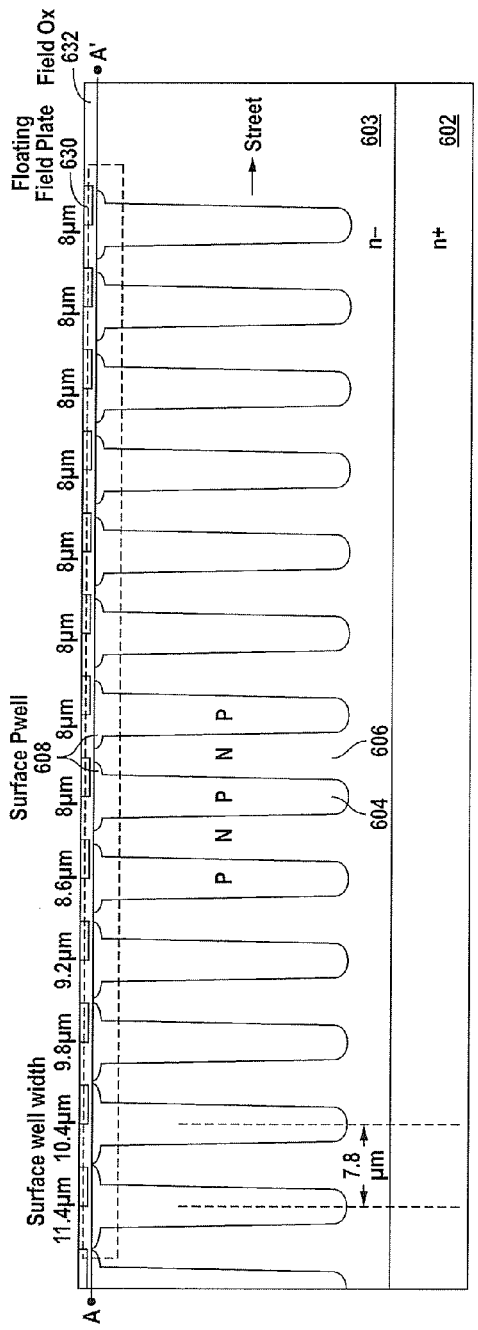
FIG. 6A shows a simplified cross section view of a superjunction FET where the width of the pillars is kept constant while the widths of the surface wells are gradually reduced in the direction away from the active region, in accordance with an embodiment of the invention.
Figure 6B:
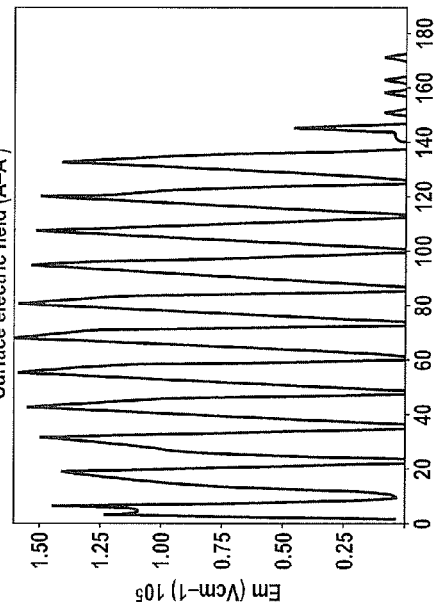
FIG. 6B shows the surface electric profile for the structure in FIG. 6A.

FIG. 6A shows a variation of the invention wherein the width of pillars 604 may be kept constant while the width of surface wells 608 may be gradually reduced in the direction away from the active region. Note that surface wells 608 are maintained centered about P-pillars 604. As can be seen from the surface electric field profile shown in FIG. 6B, a relatively low and uniform electric field peak is maintained along the top surface. The simulation results in FIG. 6B correspond to an embodiment of the invention where center-to-center P-pillar 604 spacing is maintained at 7.8 µm with the surface well widths gradually reducing from 11.4 µm to 8 µm in the direction away from the active area. While this specific embodiment yields good results, the invention is not limited to the particular set of dimensions shown in FIG. 6A.

In one embodiment, the surface well regions are formed prior to field oxidation. Also, the particular design shown in FIGS. 5 and 6A and their variations discussed herein may be implemented in all three layout configurations shown in FIGS. 1A-1C.

Note that while the exemplary embodiment in FIG. 5 shows trench gate 522 in the active region, the invention can similarly be implemented in devices with planar gate structures or other types of active structures. Further, while surface well regions 508 are shown to be wider than P-pillars 504, they can alternatively be the same width as or narrower than P-pillars 504. Moreover, as FIG. 5 shows, P-body region 510 in the active area may extend deeper than surface P-well regions 508.

Figure 7:
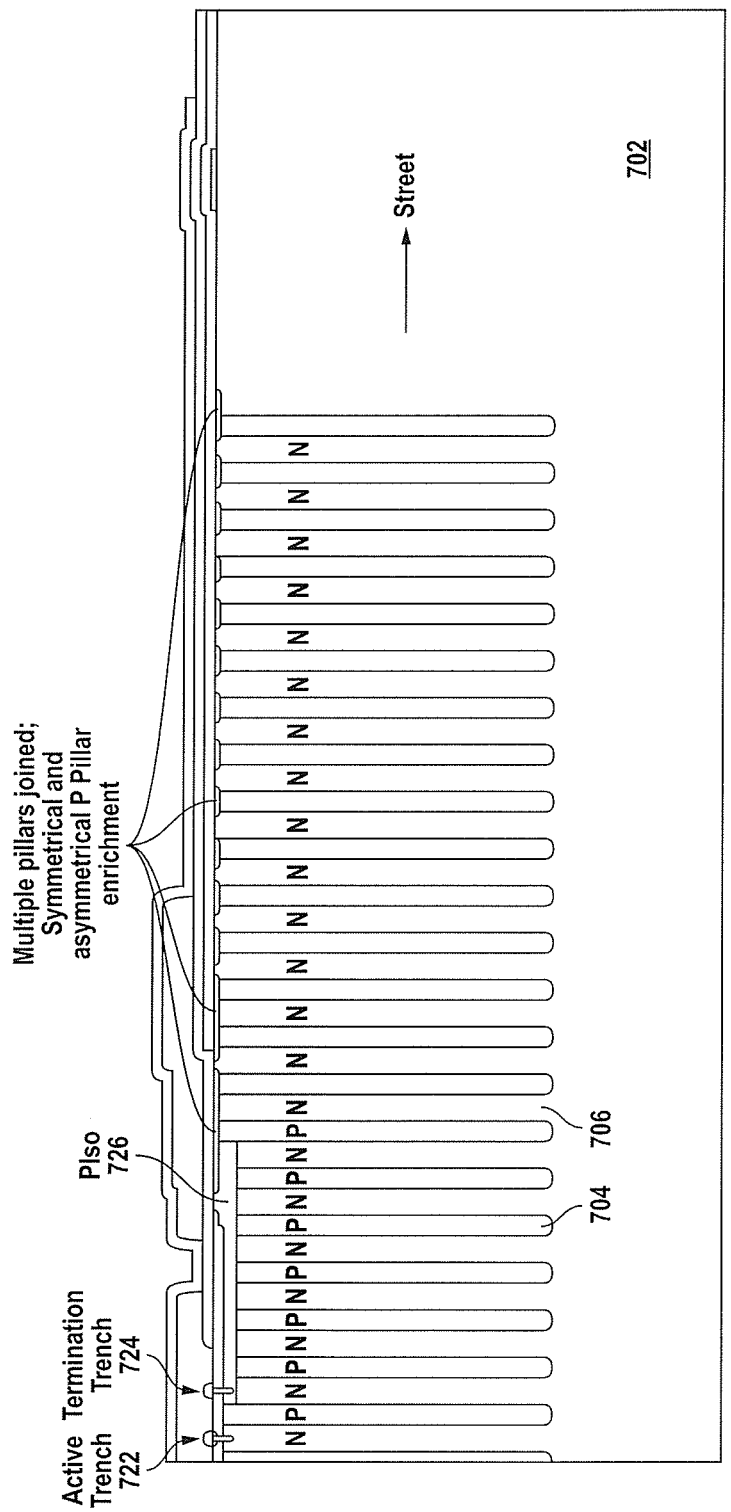
FIG. 7 shows a simplified cross section view of a superjunction FET where a desired surface electric field is obtained by using surface P-wells that are asymmetrical about the P-pillars, and in some instances are joined together, in accordance with an embodiment of the invention.

FIG. 7 shows yet another exemplary embodiment of the invention where a desired surface electric field is obtained using surface P-wells that are asymmetrical about P-pillars 704, and in some instance are joined together. In all other respects, FIG. 7 is similar to FIG. 5. As shown in FIG. 7, some of the surface P-wells are offset to the right relative to P-pillars 704, some are offset to the left, and some are joined together. The ability to offset the surface P-well relative to its P-pillar provides flexibility in designing a transition region between the active and termination regions, examples of which are described further below.

Figure 8A:
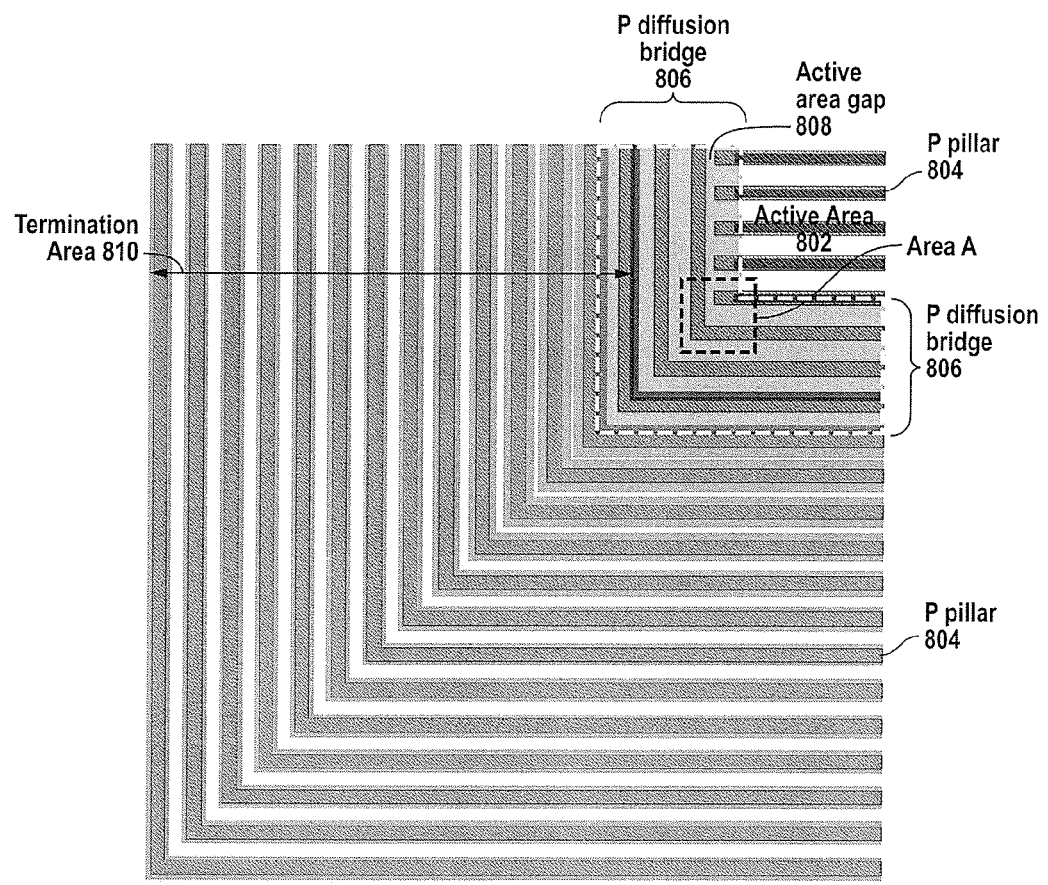
FIG. 8A is a simplified top layout view of a corner of a die showing a gap region between ends of active P-pillar stripes and the concentric P-pillars, in accordance with an embodiment of the invention.
Figure 8B:
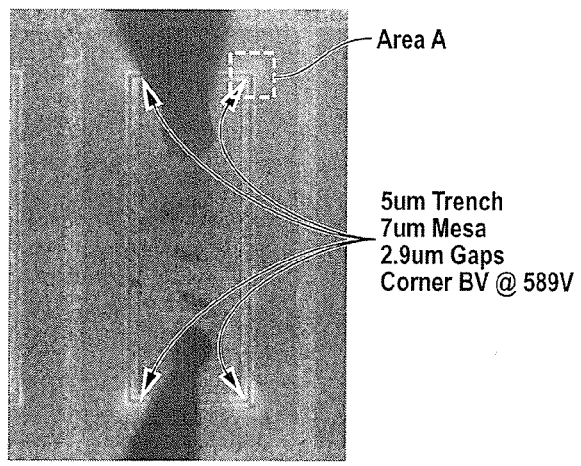
FIG. 8B is a snapshot of a die with corner design similar to that shown in FIG. 8A, wherein the die is under bias, and the lighter areas near the four corners of the die indicate the location where breakdown first occurs.

In super junction charge balance designs it is desirable to not have areas of charge balance disruption. These areas can become localized breakdown locations that can result in inferior breakdown voltage for a desired Rdson, poor dynamic switching performance, and even failure under dynamic conditions. FIGS. 8A and 8B show such regions of a die. FIG. 8A shows a corner of a die with striped active P-pillars 804 that are surrounded by concentric termination P-pillars. A gap region 808 may be formed between an end of the active P-pillars 804 and the first concentric P-pillar in termination region 810. A P-diffusion region 806 may be used to bridge a number of the concentric P-pillars in the termination region to active P-pillars 804 in order to maintain these concentric P-pillars near source potential. P-diffusion bridge 806 extends through gap region 808 and into active area 802 thus maintaining gap region 808 near source potential. When gap regions 808 and the corners are not maintained at exactly the same charge balance state as active area 802, this design can create the potential to have undesirable localized lower breakdown voltage areas in both gap region 808 and corners of the concentric P-pillars. FIG. 8B is a snap shot of a die under bias, and as can be seen by the lighter regions, breakdown may occur first at the four corners of the active region.

Figure 9A:
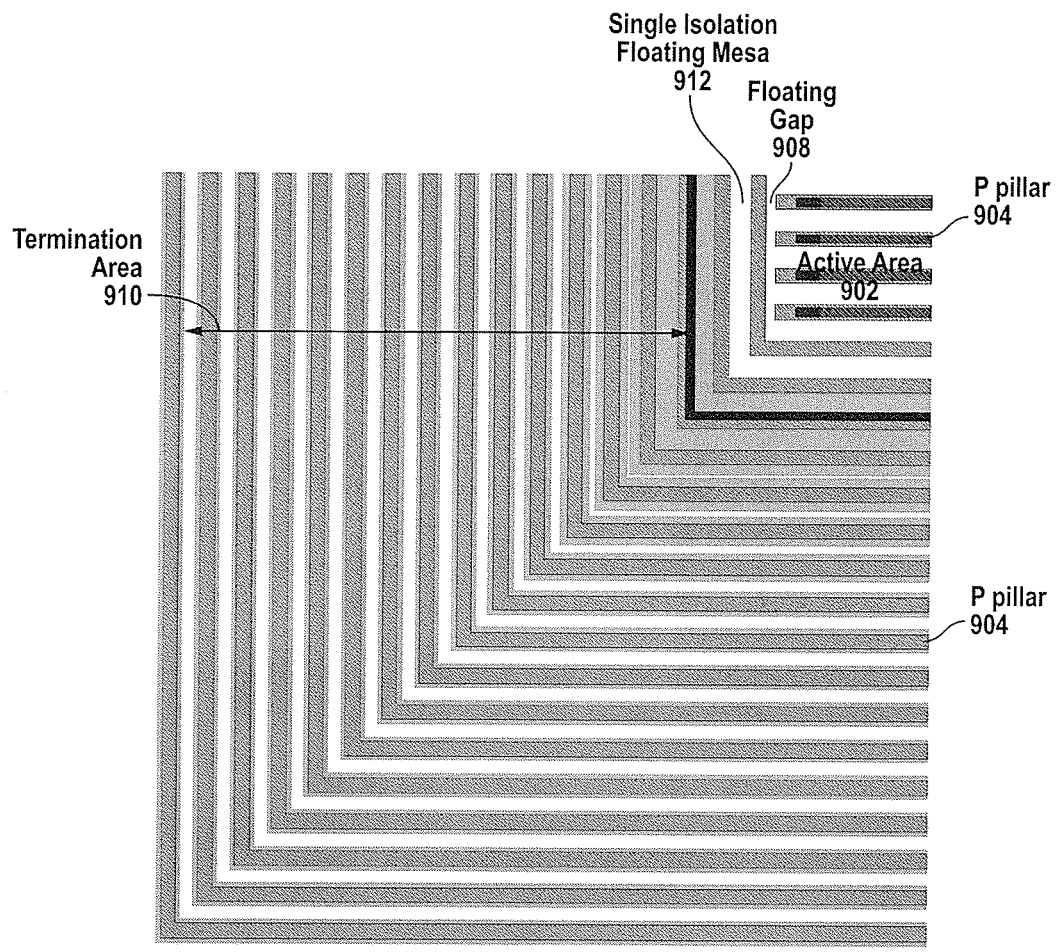
FIG. 9A shows a top layout view in accordance with an exemplary embodiment of the invention where charge imbalance areas such as the active area gaps and the corners of the concentric termination pillars are disconnected from the active region, allowing them to float to a potential higher than the source.

FIG. 9A shows a top layout view in accordance with an exemplary embodiment of the invention where charge imbalance areas such as active area gaps 908 and the corners of the concentric termination pillars may be disconnected from the active region, thus allowing them to float to a potential higher than the source. In addition a single full floating N-mesa 912 may be inserted between gap 908 or corner area and the termination region 910. As part of termination region 910, they can float to a potential higher than the source so that a charge balance condition does not have to be maintained exactly the same as the active region thus eliminating these areas as sources of localized low breakdown voltage.

Figure 9B:
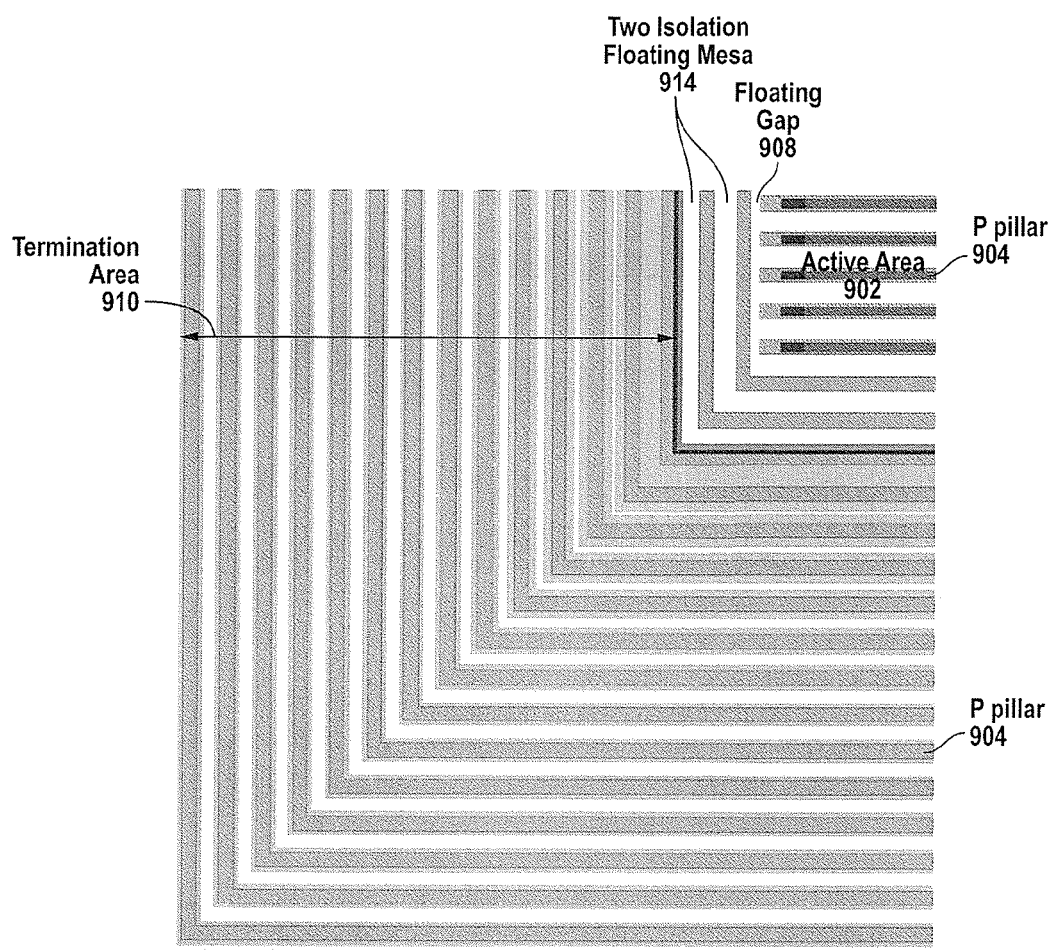
FIG. 9B is a top layout view where, in accordance with another exemplary embodiment of the invention, a second full floating mesa is inserted to provide additional isolation between the gap and corner areas and the termination.
Figure 9C:
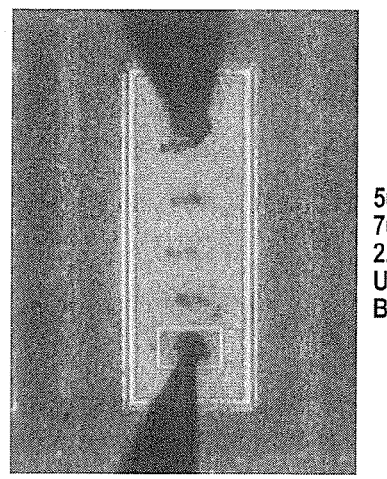
FIG. 9C is a snap shot of a die with corner design similar to that shown in FIG. 9A, where the die is under bias and the lighter areas near the four corners of the die indicate the location where breakdown first occurs.

FIG. 9B is top layout view where, in accordance with another exemplary embodiment of the invention, a second full floating mesa 914 of second conductivity type may be inserted to provide additional isolation between gap 908 and corner areas and termination 910. Good UIS performance may be obtained by the designs shown in FIGS. 9A and 9B as evidenced by a uniform active area breakdown voltage illustrated in the snap shot of a die under bias in FIG. 9C.

Figure 10:
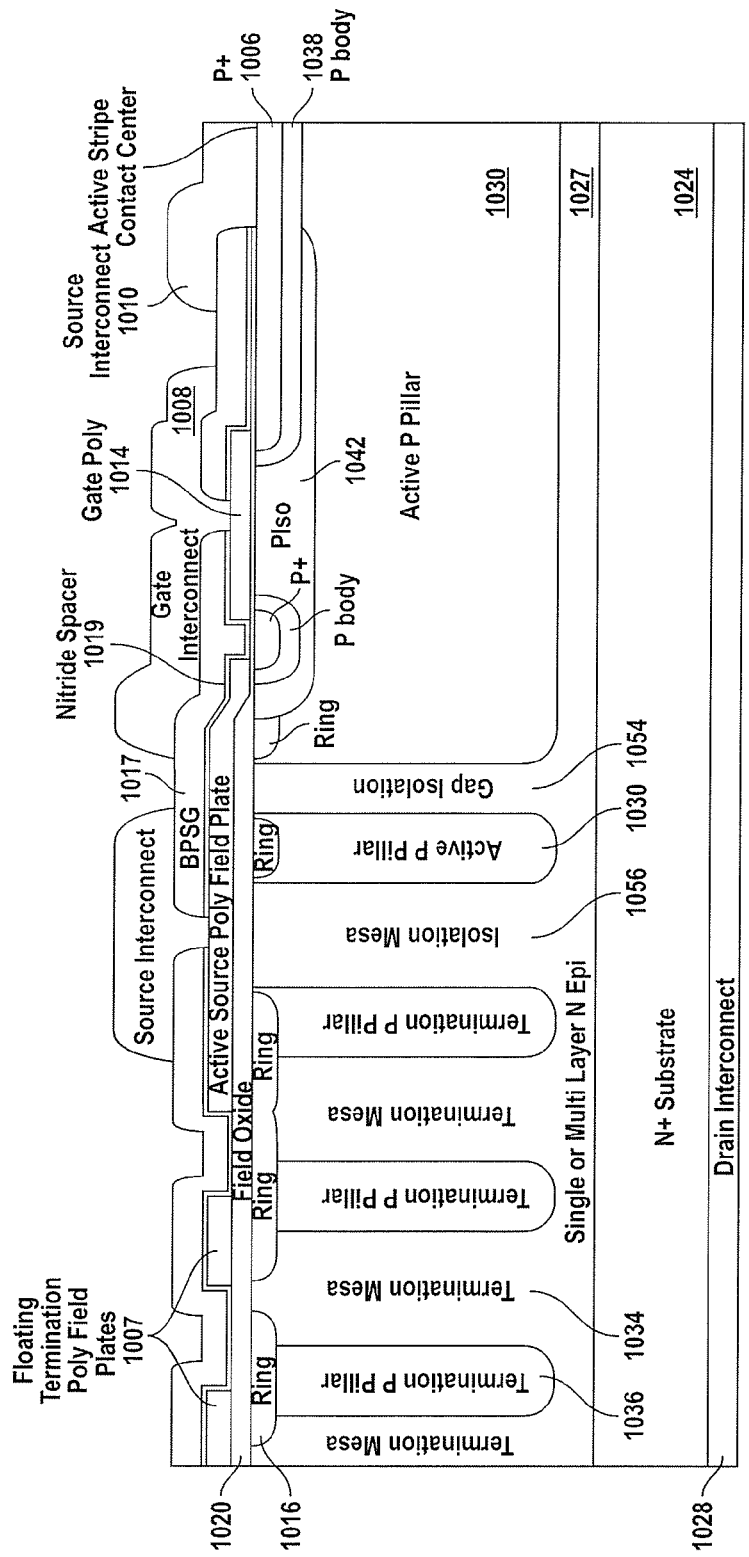
FIG. 10 is a simplified cross section view showing the gap region in the corner area, in accordance with an embodiment of the invention.

FIG. 10 is a cross section view that more clearly illustrates the gap region. This cross section view is through a region of the die where a striped active P-pillar intersects with concentric termination P-Pillars. Gap region 1054 (labeled as "Gap Isolation") may be disposed between the end of striped active P-pillar 1030 and the first concentric termination P-pillar 1036. Also, depicted in FIG. 10 is a full floating mesa 1056 (labeled as "Isolation Mesa"), which may be inserted between the gap region and termination mesas 1034. As can be seen, no bridging diffusion is present between active pillars 1030 and termination pillars 1036, thus allowing gap region 1054, isolation mesa region 1056, and termination pillars 1036 to float.

As the cell pitch of trench epi-filled based charge balanced devices is reduced, the mesas and pillars may deplete at a lower voltage. Thus giving rise to a dv/dt of greater than $1 \times 10^{11}$ V/sec. Stray gate to drain capacitance (Cgd) due to gate feeds and/or termination field plates can cause large currents to flow into the gate. These currents may flow through the parasitic resistance in the gate of the device causing localized areas of the device to be turned on, resulting in device failure. Thus, eliminating or minimizing parasitic Cgd is generally desired.

In accordance with the invention, structures outside and within the active region, such as the gate runners (e.g., metal and polysilicon lines connecting gate pad to active gates) and termination field plates, are carefully designed so as to eliminate or substantially minimize Cgd. In one embodiment, the field plates in termination regions extending over the drain regions that are normally connected to the gate metal may instead be connected to the source metal. FIG. 3 shows a cross section view of an exemplary embodiment where active polysilicon field plate 315 extends through the transition or isolation region 335 and into termination region 302. Polysilicon field plate 315 may be connected to source metal 310 instead of gate metal 308, thus substantially reducing the Cgd contribution by the active area field plate, and converting the Cgd contribution to a more desirable Cds. This connection may further convert the Cgd contribution by gate metal 308 to a more desirable Cgs as shown in FIG. 3, since a field plate that is tied to the source potential extends between the gate metal and its underlying drain regions.

Figure 11:
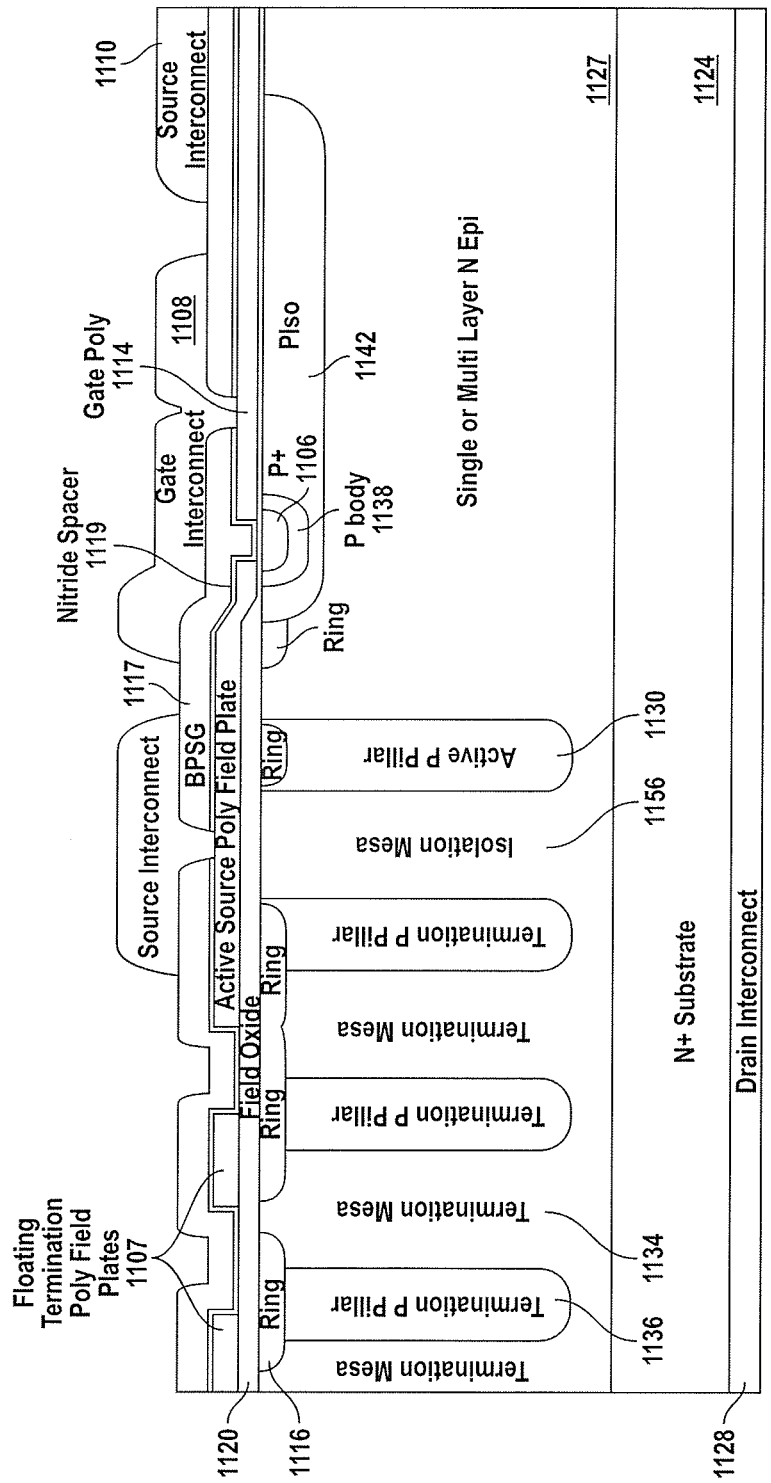
FIG. 11 is a simplified cross section view of another exemplary embodiment where a bridging PIso diffusion discussed in connection with the FIG. 3 embodiment is extended under the gate metal so that no portion of the gate metal extends over the drain region.
Figure 12:
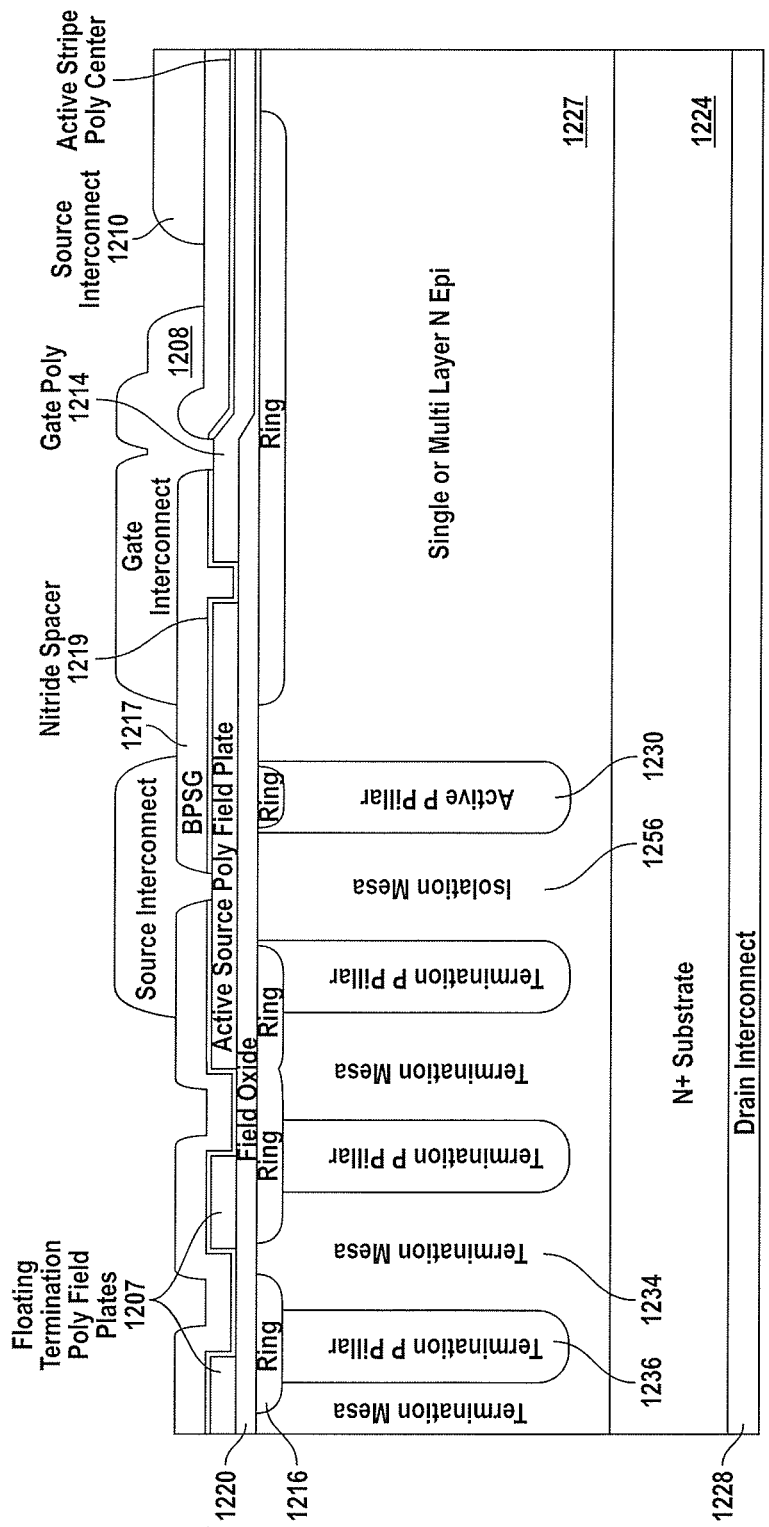
FIG. 12 is a simplified cross section view in accordance with yet another exemplary embodiment where the surface well regions discussed in connection with the FIGS. 5-7 embodiments are extended under the gate metal so that no portion of the gate metal extends over the drain region.

FIG. 11 shows a cross section view of another exemplary embodiment where bridging PIso diffusion 1142 (discussed in connection with FIG. 3) may be extended under gate metal 1108 such that no portion of gate metal 1108 extends over the drain region. FIG. 12 shows a cross section view of yet another exemplary embodiment where the surface well regions (discussed in connection with FIGS. 5-7) may be extended under gate metal 1208 so that no portion of gate metal 1208 extends over the drain region.

In the active region, the P-type body regions may not extend the full length of the P-pillars, but may terminate prior to reaching the ends of the striped P-pillars. To maintain a breakdown voltage equal to or higher than that of the active area at the ends of the active P-pillars where the P-type body regions do not extend, various P enrichment techniques can be utilized to compensate for the absence of the body region. The P enrichment enriches the surface of the P-pillar where the boron dopant is leached into the oxide. Surface leaching refers to the phenomenon where, during growth of an oxide layer, the boron dopants along the surface of the P-pillars segregate into the oxide. In embodiments where the P-pillars are lightly doped, the leaching effect can cause the surface of the P-pillars to become N-type. Thus, the P enrichment of those surface portions of the active P-pillars where the body region does not extend may reduce the possibility of those surface regions becoming N-type due to surface leaching.

Figure 13:
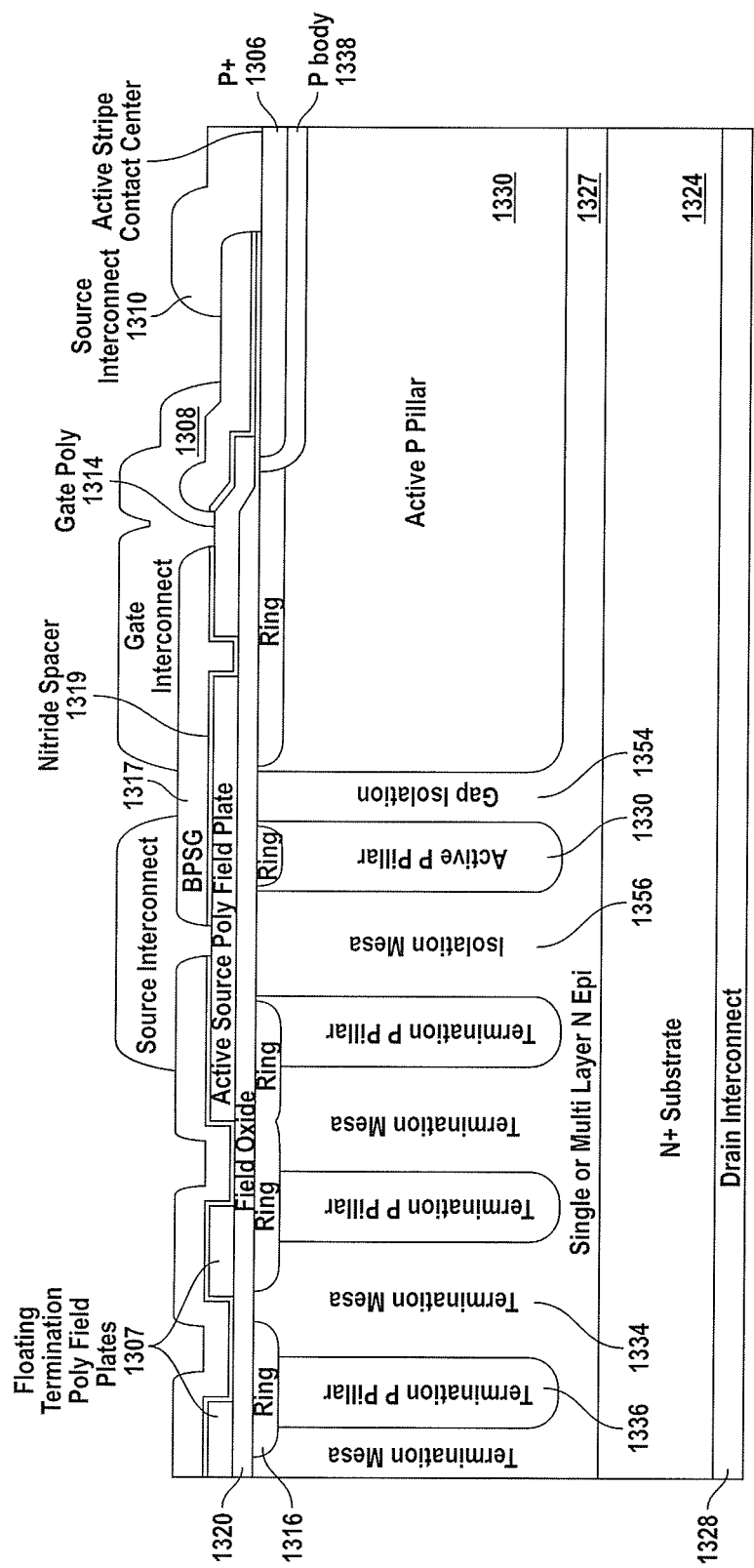
FIG. 13 is a simplified cross section view in accordance with another exemplary embodiment where a shallower, more lightly doped surface P-well region extends along the end of the striped active P-pillar where the P-body region terminates.

FIG. 10 shows one exemplary embodiment of the invention where a P-type diffusion region PIso 1042 extends along an end of striped active P-pillar 1030 where P-body region 1038 terminates. FIG. 13 shows another exemplary embodiment where a shallower, more lightly doped surface P-well region extends along the end of striped active P-pillar 1330 where P-body region 1038 terminates. Note that a combination of the PIso and surface P-well can be used as needed. For example, in FIG. 10, a surface P-well region is used at the very end of the active P-pillar where the PIso could not be extended due to process limitations.

Figure 14A:
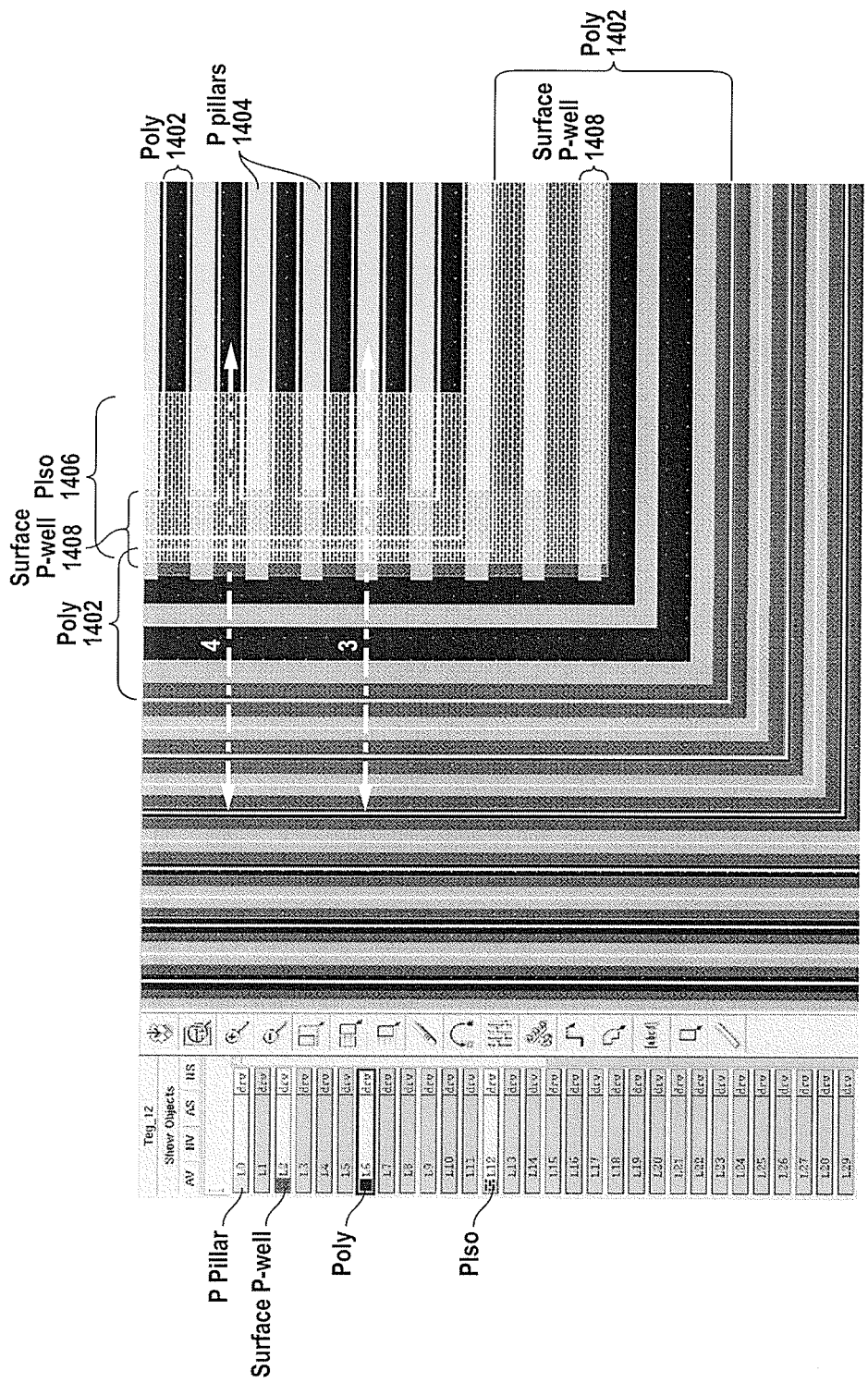
FIGS. 14A-14G are simplified layout views illustrating various implementations of the PIso and surface P-well regions, in accordance with embodiments of the invention.
Figure 14B:
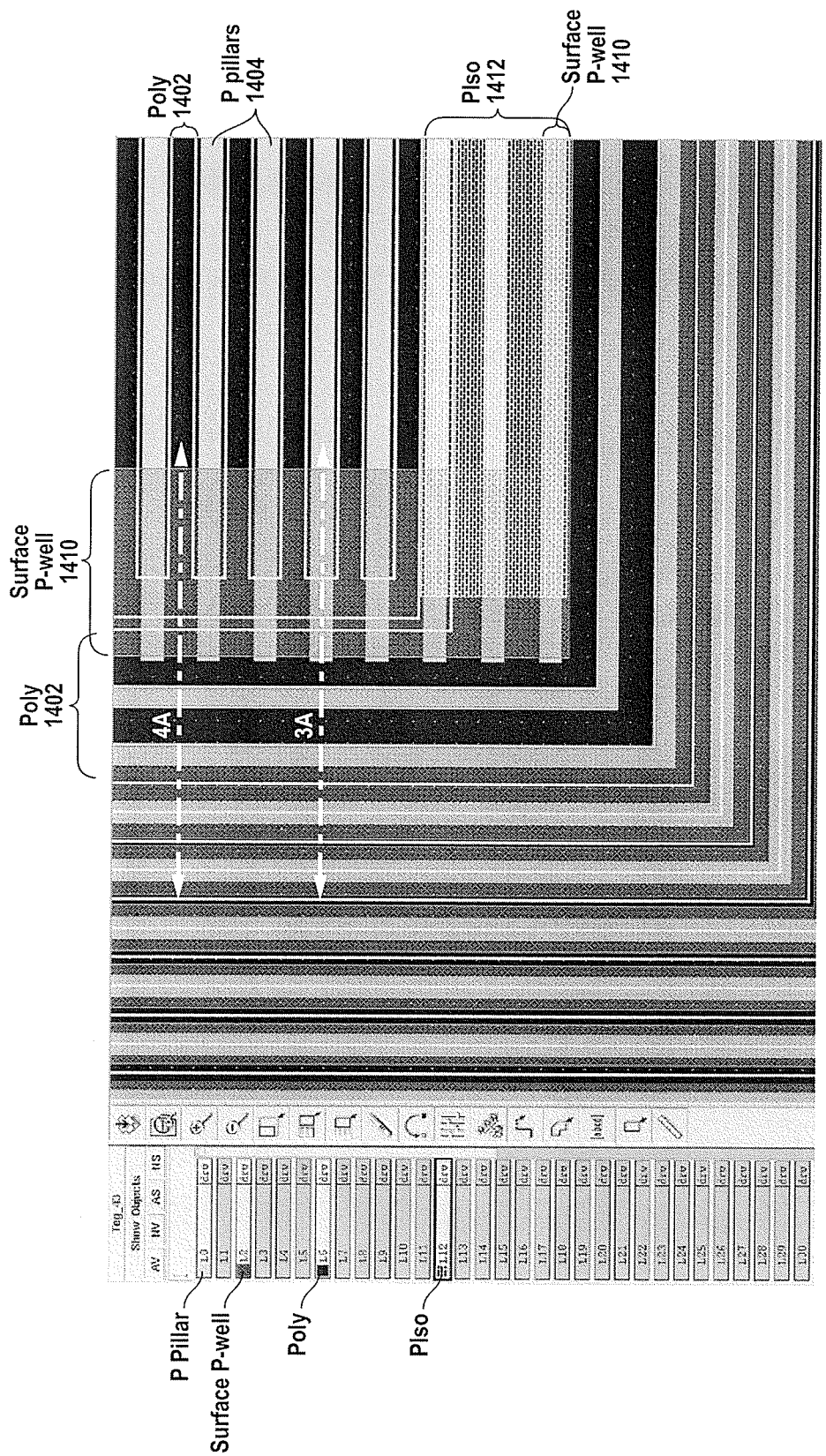
Figure 14C:
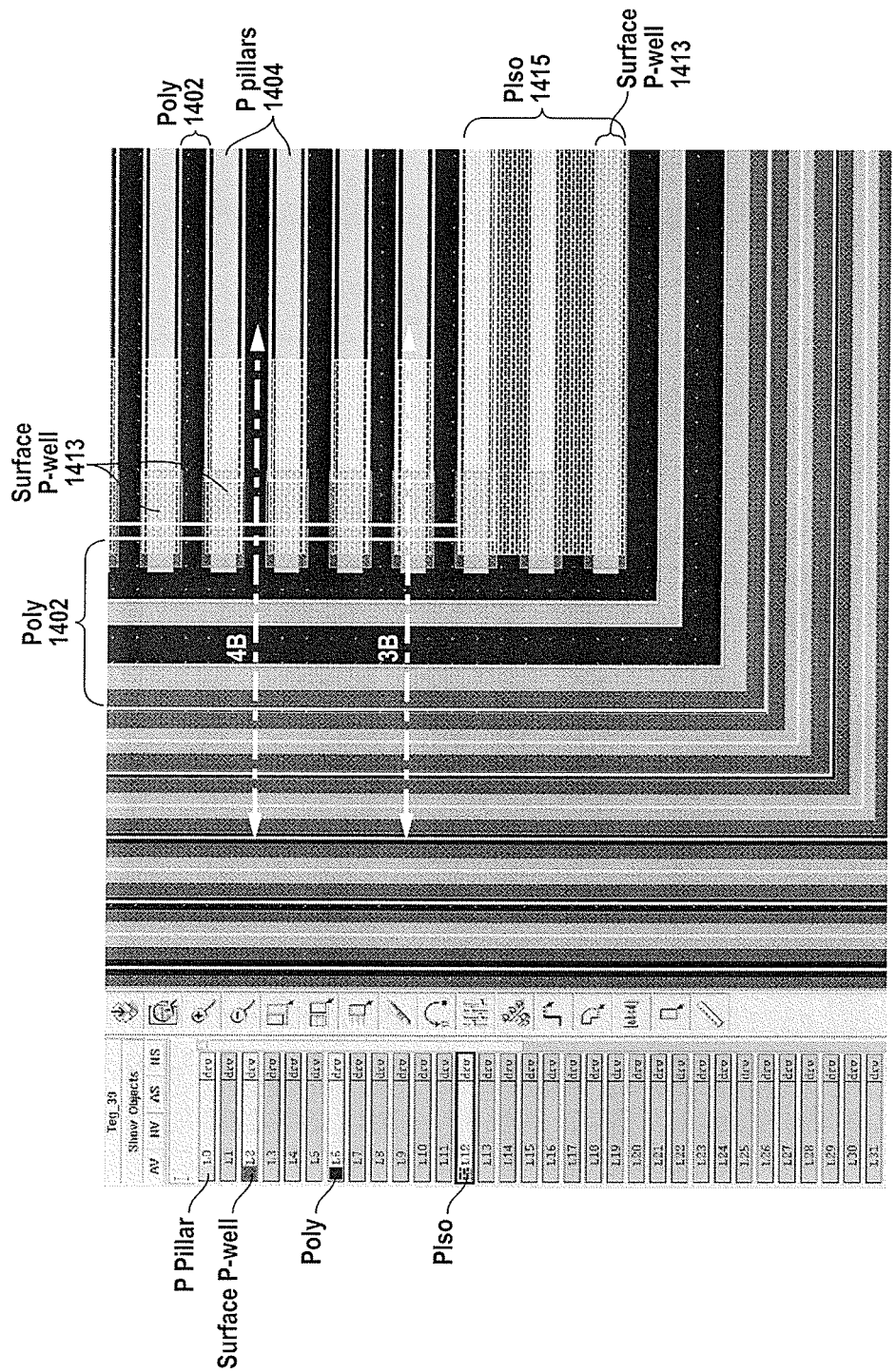
Figure 14D:
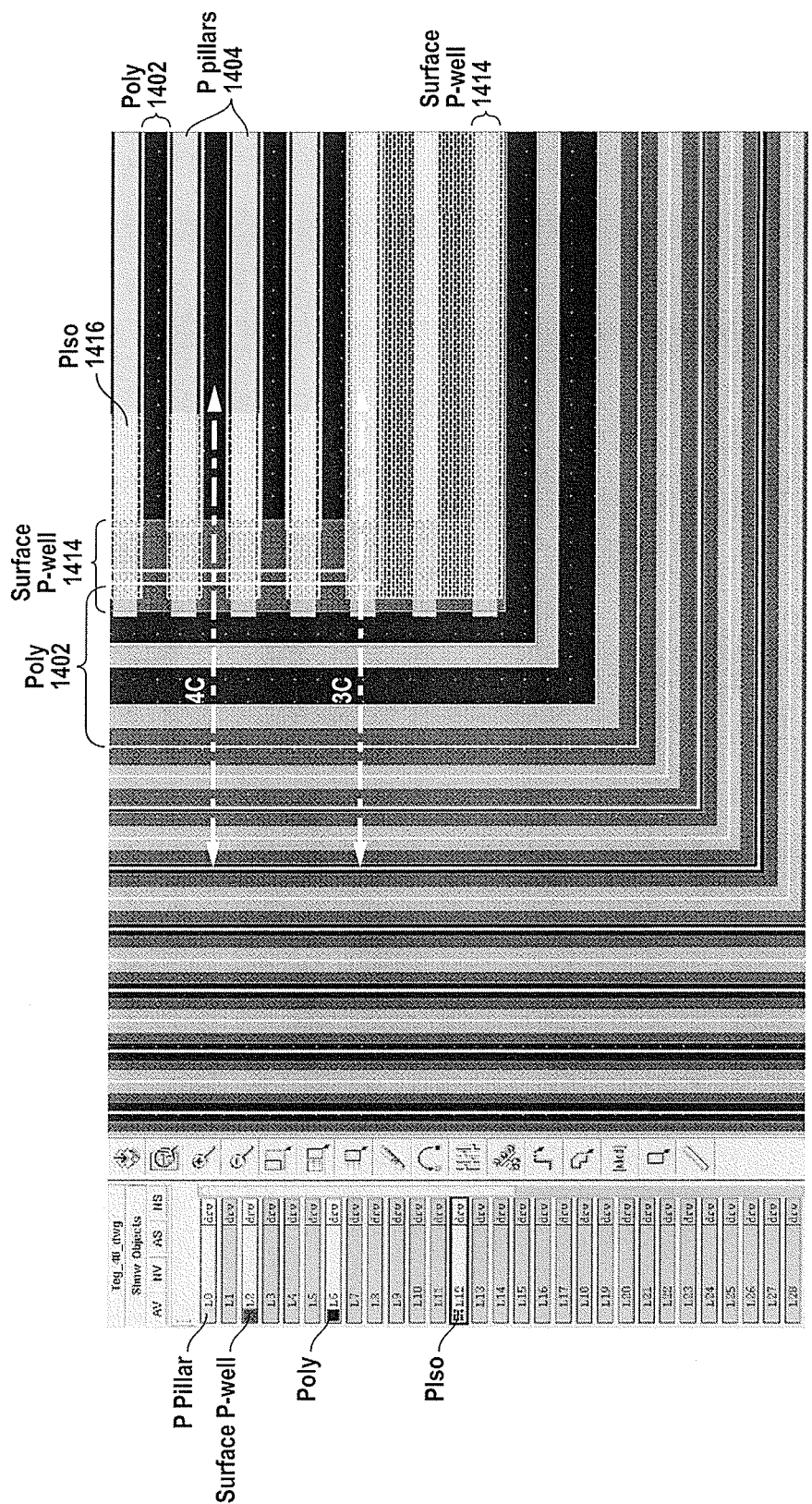
Figure 14E:
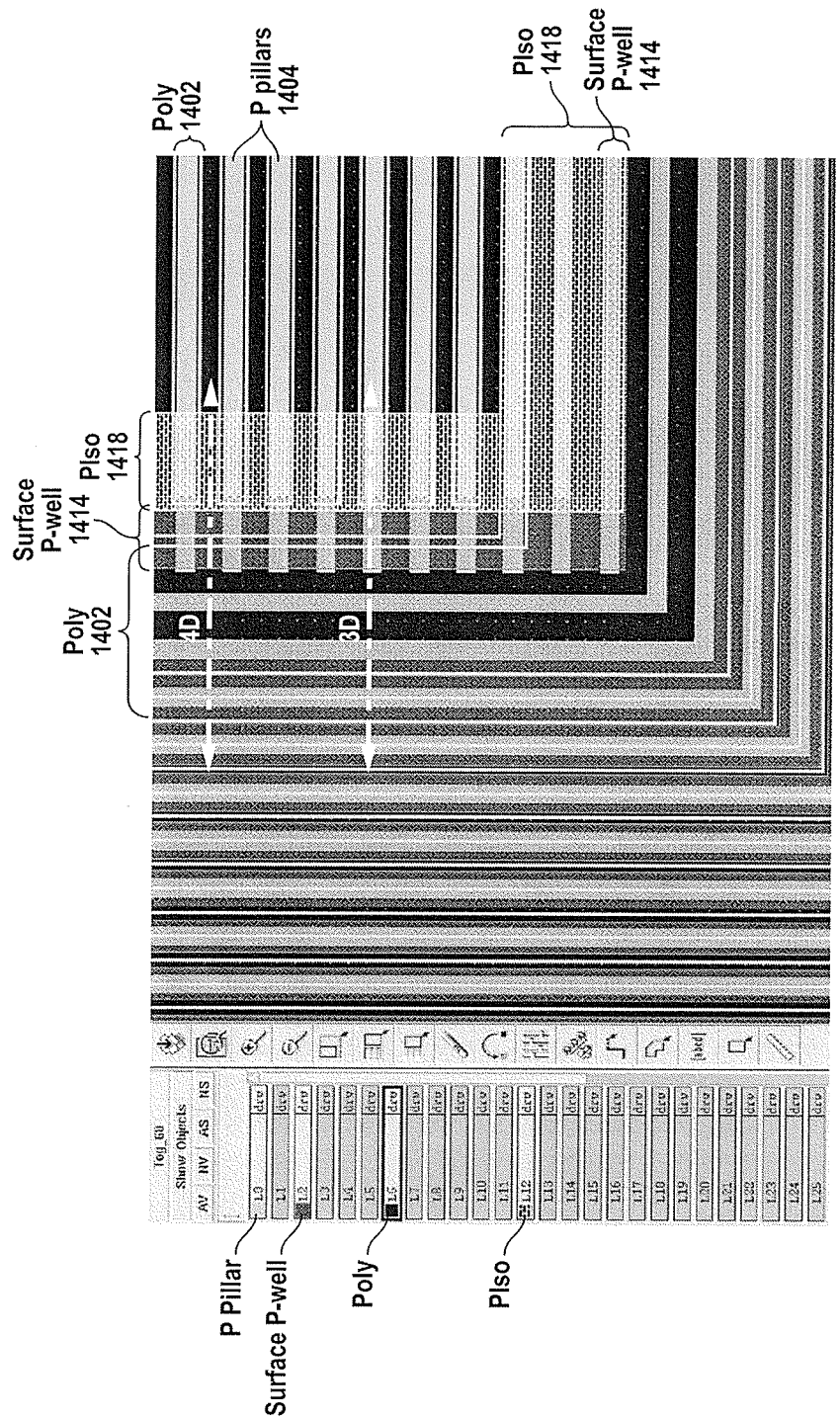
Figure 14F:
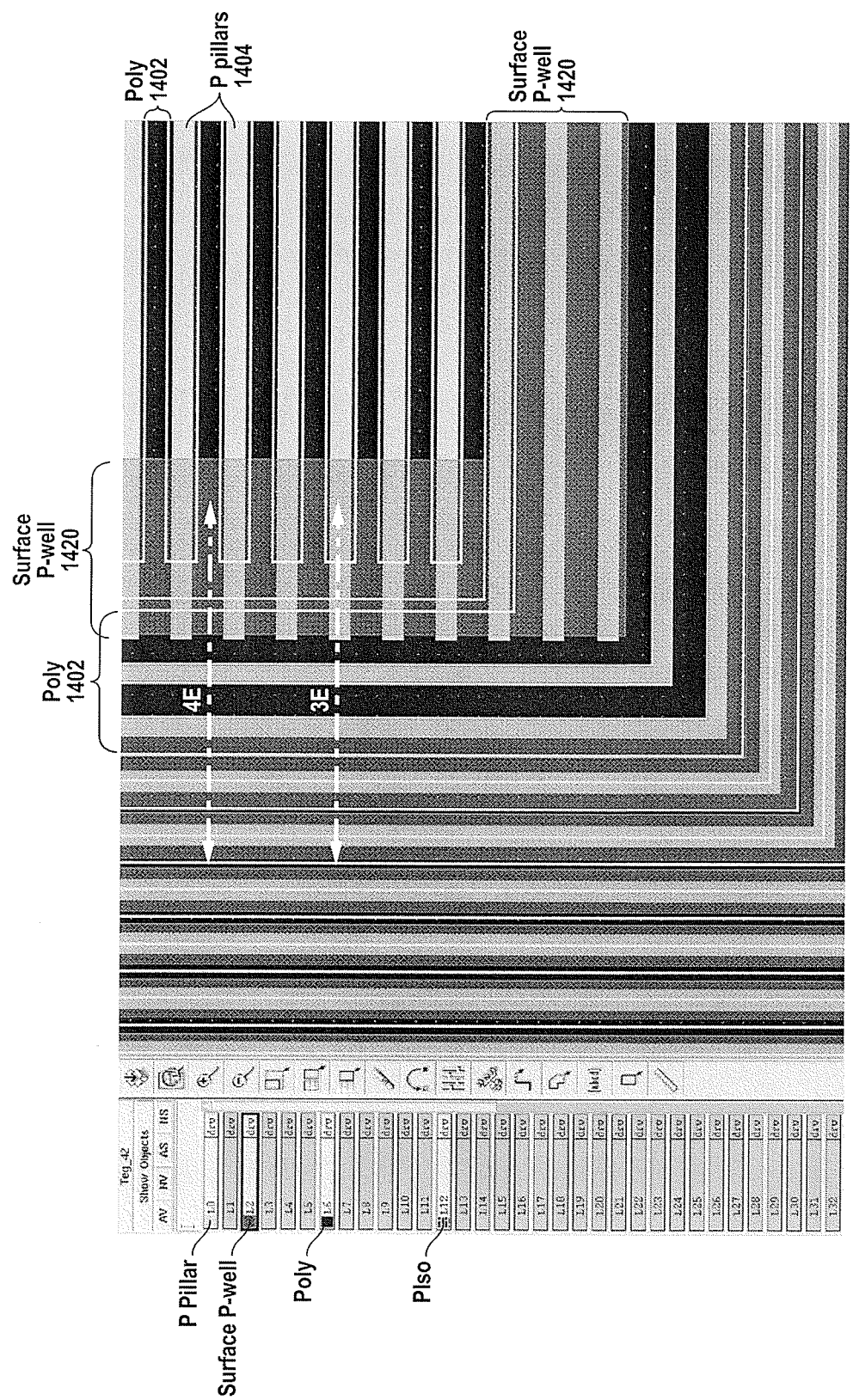
Figure 14G:
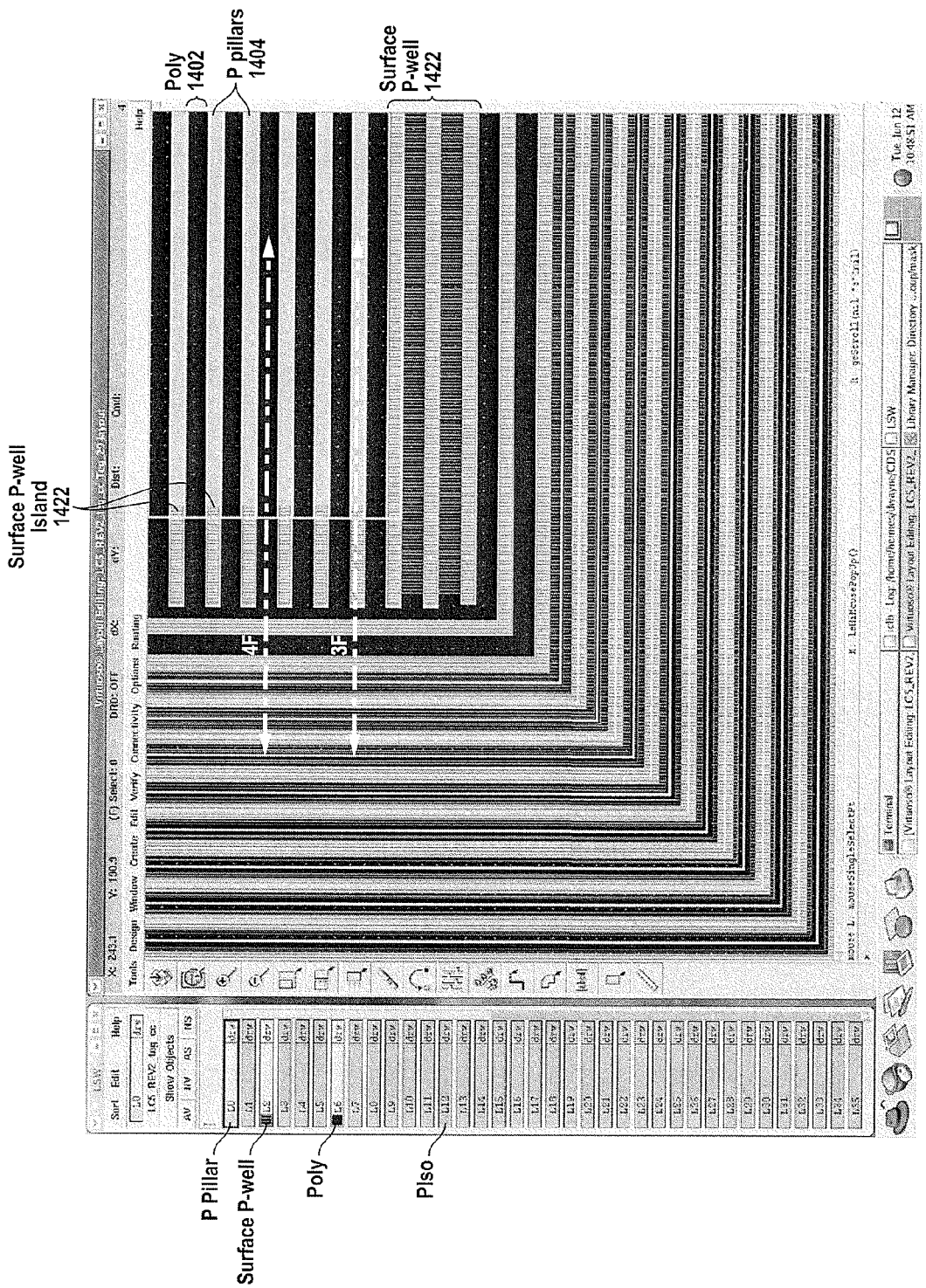

A number of layout implementations of the PIso region and the surface P-well regions are possible, some of which are shown in FIGS. 14A-14G. For example, PIso regions 1406, 1418 can be extended as a continuous region along the ends of active P-pillars 1404 as shown in FIGS. 14A and 14E. In this implementation, the PIso region may extend into the N-type mesa regions between adjacent active P-pillars 1404. This may result in some charge imbalance at both ends of the striped active P-pillars 1404. However, islands of PIso regions can be formed along the ends of active P-pillars 1404 instead of a continuous PIso region, such that the PIso islands do not bridge adjacent mesas or are contained within the bounds of P-pillars 1404, as show in FIGS. 14C and 14D. Similarly, either a continuous surface P-well region 1408, 1410, 1414, 1420 (FIGS. 14A, 14B, and 14D-14F), or islands of surface P-well regions 1413, 1422 (FIGS. 14C and 14G) can be used along the ends of active P-pillars 1404. Alternatively, a continuous surface P-well 1408 together with islands of PIso regions 1416 may be used along the ends of active P-pillars 1404 (FIG. 14D), or vice versa.

Figure 15:
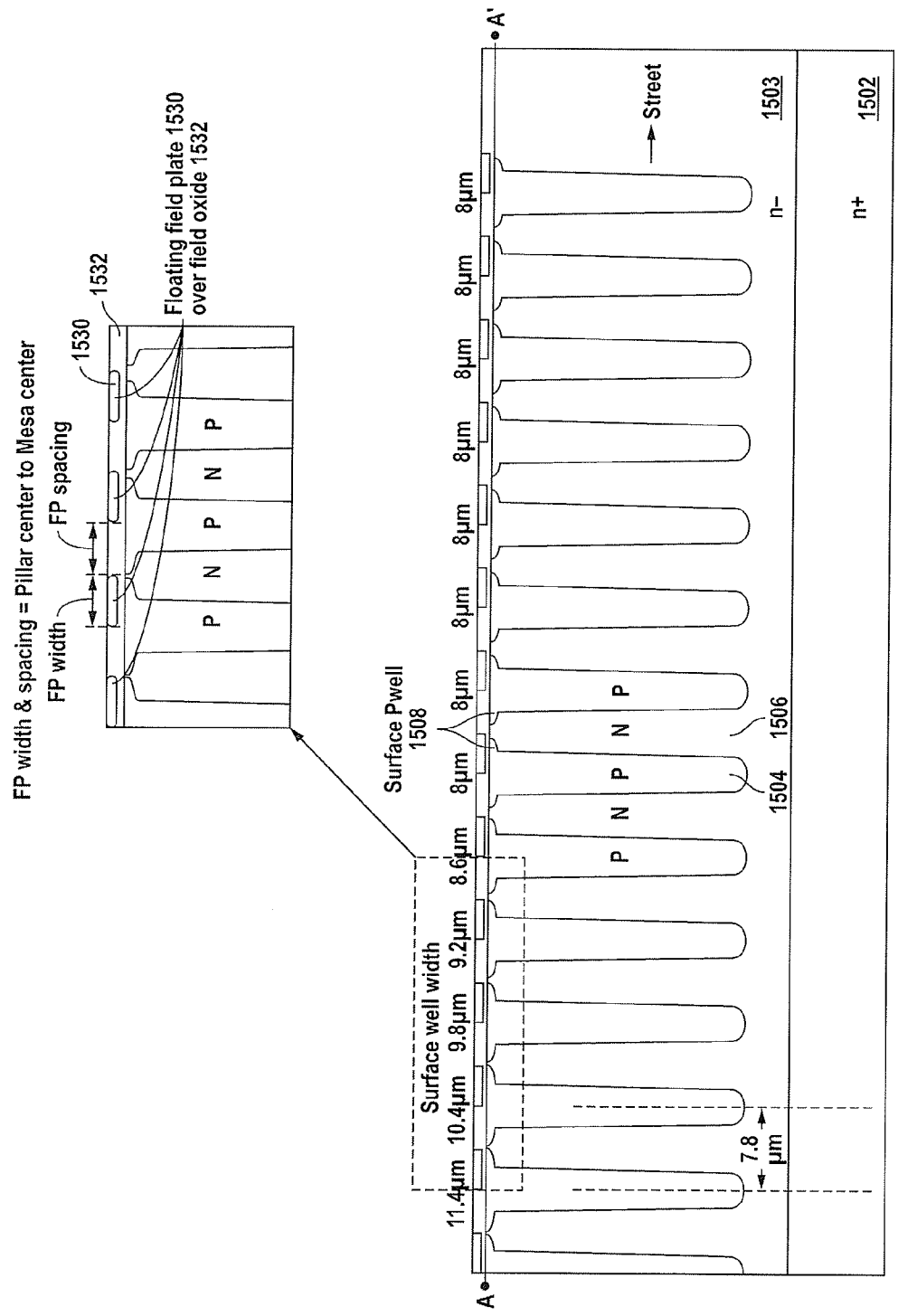
FIG. 15 is a simplified cross section view illustrating implementation of floating field plates in the termination region in accordance with an exemplary embodiment of the invention.

Conductive field plates are used in the termination region to spread the electric field more uniformly in the termination region. The field plates are typically electrically connected to the underlying pillars so that they can assume the potential of their corresponding pillar. However, as cell pitch is reduced, forming a contact between the field plate and its underlying pillar becomes more difficult. It has been found that using field plates that are not electrically connected to the underlying silicon (i.e., using floating field plates) are still effective in distributing the electric field in the termination region. FIG. 15 shows integration of floating field plates 1530 in the termination region in accordance with an exemplary embodiment of the invention.

FIG. 15 is similar to FIG. 6A. An expanded view of a portion of the cross section view is included in FIG. 15 to more clearly show some of the relevant details. Conductive field plates 1530 (e.g., comprising polysilicon or metal) that may extend over each P-pillar and its adjacent mesa region are included. Field plates 1530 are insulated from the underlying silicon region by insulating layer 1532. The thickness of insulating layer 1532 may be optimized to ensure sufficient capacitive coupling so that floating field plates 1530 can assume the potential of an underlying pillar or pillars. In one embodiment, an oxide layer about 1 μm thick is used as insulating layer 1532 to enable the necessary capacitive coupling.

In the example shown in FIG. 15, a width of each field plate 1530 may be equal to the distance between the center of pillar 1504 and the center of mesa 1506, and thus the spacing between adjacent field plates 1530 will be the same as the width of field plates 1530. These particular dimensions are merely exemplary and not intended to be limiting. For example, the field plate width may be more or less than the distance between the center of pillar 1506 and the center of mesa region 1506.

Floating field plates 1530 may eliminate the need for forming contacts between field plates 1530 and underlying silicon 1503, and the field plate width may be defined by the poly photo masking and etching process. This may allow the field plate width to be precisely controlled.

Figure 16B:
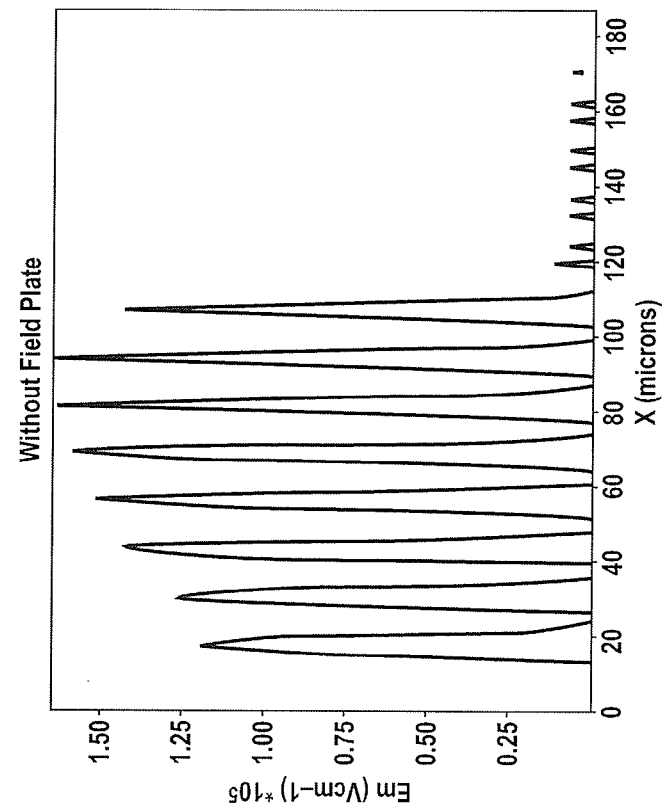
FIGS. 16A and 16B show the electric field profile for a structure with field plates (FIG. 16A) and a structure without field plates (FIG. 16B).
Figure 16A:
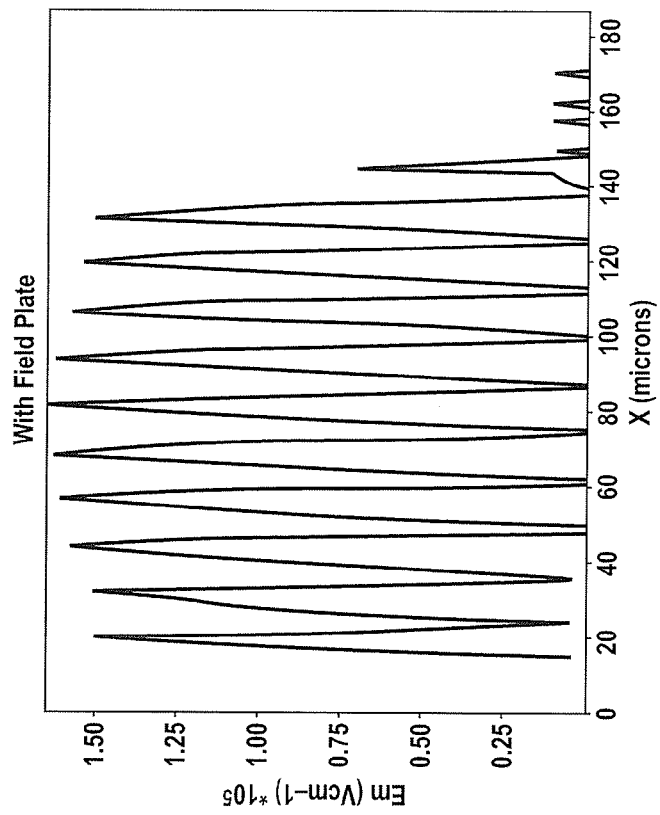

FIGS. 16A and 16B are simulation results illustrating the effectiveness of floating field plates. FIGS. 16A and 16B show the electric field profile for a structure with field plates and a structure without field plates, respectively. As can be seen the floating field plates distribute the potential over a larger distance resulting in a lower and more uniform peak electric field than the structure without field plates. Note that the invention depicted by FIG. 15 and its variations may be implemented in any of the layout configurations shown in FIGS. 1A-1C.

For charge balance designs it is important not to have areas were charge balance is disrupted. These disruptions occur where there are gaps and corners when transitioning from the active area to the termination area. Fully parallel pillar designs (as in FIG. 1B) do not have these imbalanced areas because pillars consist only of parallel stripes. Further, in the trench epi-fill pillar process, the full parallel designs having no gaps and corners make etching and filling of deep trenches easier. However, in the full parallel design the electric field does not spread uniformly on all four sides of the die because of the floating termination pillars that do not intersect with the active area. This results in non-uniform electric field distribution and reduced breakdown voltage. As stated before, to achieve good UIS performance, it is desirable that breakdown occur uniformly in the active area.

Figure 17:
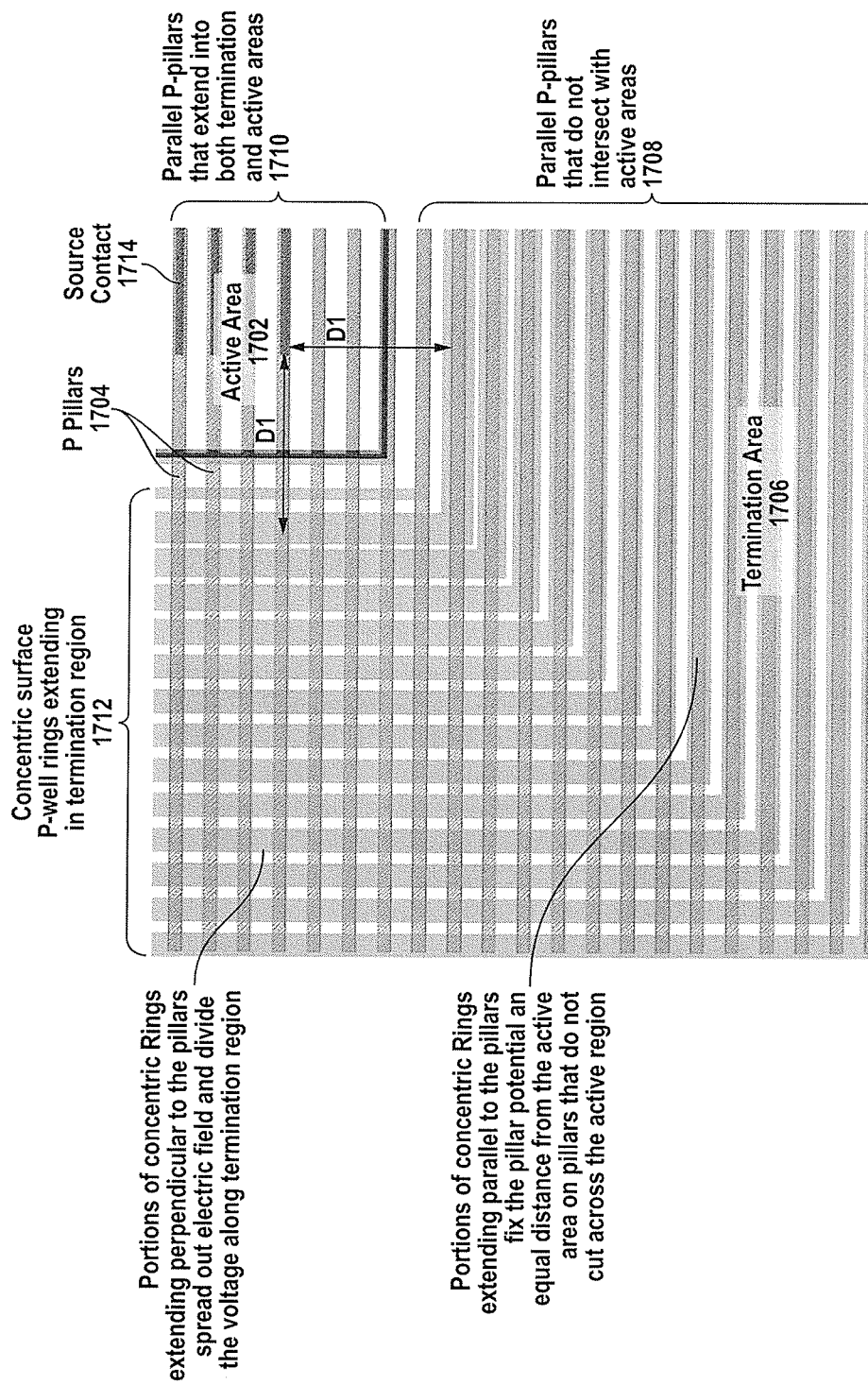
FIG. 17 is a simplified top layout view of a corner of the die where, in accordance with an exemplary embodiment of the invention, surface P-well rings are used to fix the potential of the pillars that do not intersect the active area and would otherwise be floating.

FIG. 17 shows a top layout view at a corner of the active region where, in accordance with an exemplary embodiment of the invention, surface P-well rings 1712 may be used to fix the potential of pillars 1708 that do not intersect active area 1702 and would otherwise be floating. As can be seen, rings 1712 intersect those portions of active P-pillars 1710 that extend into termination region 1706 and spread out the electric field and divide the voltage along the termination region 1706. Rings 1712 also extend along a surface region of P-pillars 1708 that do not extend in active region 1702, thus fixing the potential of P-pillars 1708 at an equal distance from active area 1702 on all four sides of the die. In this manner, P-pillars 1708 that do not intersect with active area 1702 are biased to the same potential as those portions of active pillars 1710 extending in termination region 1706 in an equidistance manner from active region 1702. This is illustrated by dimensions marked as D1 in FIG. 17.

Note that one feature of the present invention is the right angle corners of P-rings 1712. Corners with right angles can improved charge balance at the corners compared to rounded corners.

In the exemplary fully parallel design shown in FIG. 17, the P/N pillars may be designed so that an N-rich charge balance condition is created in active region 1702 or only in termination region 1706. This can ensure that some portion of the section of active P-pillars 1710 that extend into termination region 1706 are fully depleted. In the embodiment shown, P-pillars 1710, 1708 may be spaced the same distance from one another, have the same width, and have a similar doping profile. In one embodiment, 5 μm wide P-pillars 1710, 1708 with 8 μm spacing therebetween yield a uniform breakdown voltage in active region 1702 of 646V, thus achieving a high and stable breakdown voltage with good UIS characteristics. The embodiment where it is desirable to have an N-rich condition only in termination region 1706 may be implemented by gradually tapering the width of P-pillars 1710 as they exit active region 1702 and extend into termination region 1706. In an alternate implementation, the width of P-pillars 1710 can be narrowed in a step fashion in termination region 1706.

In embodiments where the pillars are formed by etching deep trenches and filling them with silicon, process reliability may be directly related to the trench depth to width ratio (i.e., the trench aspect ratio). As trench aspect ratio increases, epi filling of the trenches becomes more difficult and the filling process may need to be improved.

FIGS. 18A and 18B show cross section views at two process steps for forming P-pillars in accordance with an exemplary embodiment of the invention. In FIG. 18A, deep trench 1808 may be etched in N-type silicon, and P-well 1806 may be formed at the bottom of trench 1808 using conventional implant techniques. Trench 1808 may be filled with P-epi 1804A. The cross-section view in FIG. 18B shows the resulting P-pillar 1804B after completion of the process. As can be seen, the dopants implanted at the bottom of trench 1808 may effectively extend P-pillar 1804B deeper, thus eliminating the need for modifying the epi-filling process. Also, by increasing the implant dose used to form P-well 1806 at the bottom of trench 1808, the onset of avalanche breakdown can be induced at the implanted area resulting in higher UIS capability. This feature is explored in further detail below.

In one embodiment, N mesa 1802 has a doping concentration of $3.02 \times 10^{15}$ and boron is implanted along the bottom of trench 1808 at a dose of $2 \times 10^{12}$ and energy of 200 Kev. Trench 1808 is filled with P-epi 1804A having a doping concentration in the range of $5 \times 10^{15}$ to $7 \times 10^{15}$. The resulting structure has a P-pillar width of 5 um and a pillar spacing of 7.5 um.

As discussed above, it is advantageous to induce the onset of avalanche breakdown at the bottom of the P-pillars. FIG. 19 shows a cross section view in accordance with an exemplary embodiment of the invention where P-enrichment regions 1921 may be formed at the bottom of P-pillars 1930 to create a local charge imbalance thereby inducing the onset of avalanche breakdown at the pillar bottoms. P-enrichment regions 1921 preferably have a higher doping concentration than P-pillars 1930 to create the charge imbalance.

Figure 20A:
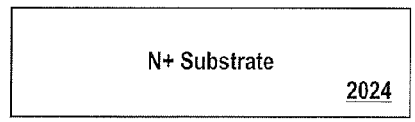
FIGS. 20A-20H are simplified cross section views depicting a process flow for forming the structure in FIG. 19 in accordance with an exemplary embodiment of the invention.
Figure 20B:
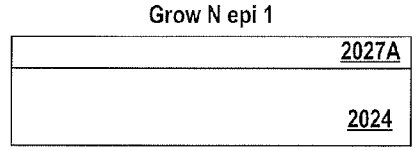
Figure 20C:
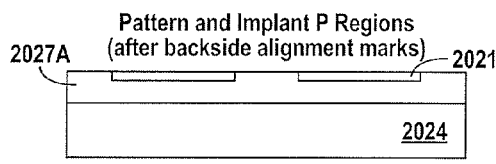

FIGS. 20A-20H are cross sectional views depicting a process flow for forming the structure in FIG. 19 in accordance with an exemplary embodiment of the invention. FIG. 20A shows N+ starting substrate 2024. In FIG. 20B, a first N-epi layer 2027A may be grown using conventional techniques. In FIG. 20C, a P-enrichment implant may be carried out to form P-enrichment regions 2021 where bottoms of the P-pillars will terminate. A conventional masking and implant process may be used to form the P-enrichment regions. Note that the P-enrichment implant may be carried out after forming the backside alignment marks. The significance of this will become more clear below. The implant doping concentration and energy may be set in accordance with the target charge imbalance condition at the pillar bottoms.

Figure 20D:
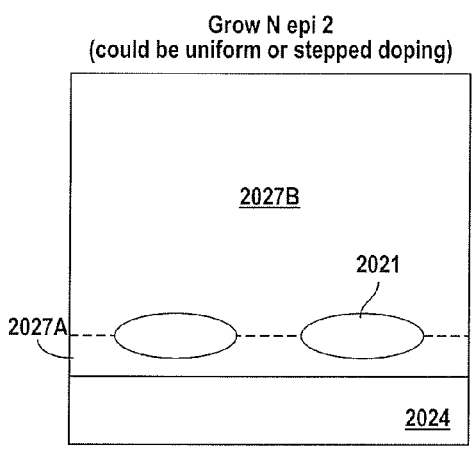
Figure 20E:
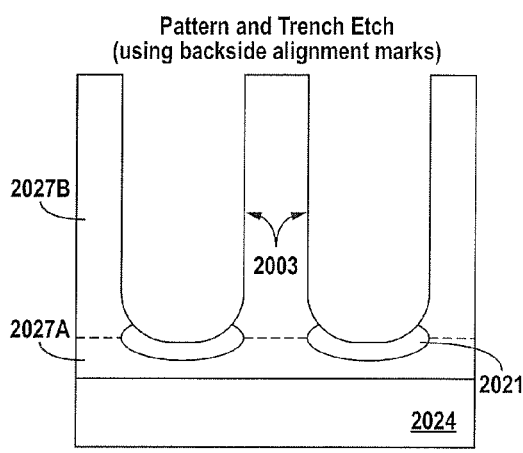
Figure 20F:
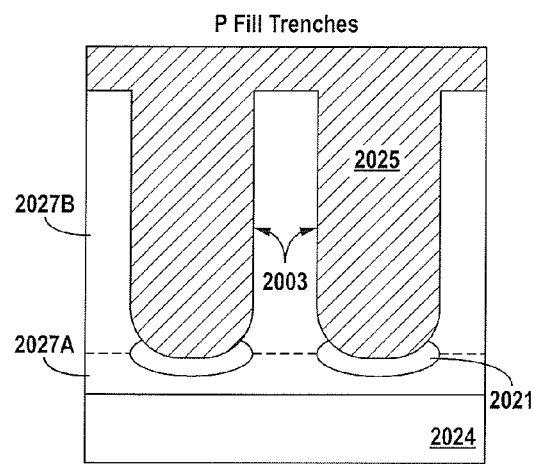

In FIG. 20D, a second N-epi 2027B may be grown using conventional techniques. Second epi layer 2027B may be formed with a uniform or stepped doping concentration. In FIG. 20E, trenches 2003 may be patterned and etched deep enough to reach P-enrichment regions 2021. A backside alignment technique (described more fully further below) may be used to ensure alignment of trenches 2003 with P-enrichment regions 2021. In FIG. 20F, trenches 2003 may be filled with P-epi 2005 using the techniques described further below, or using other known techniques.

Figure 20G:
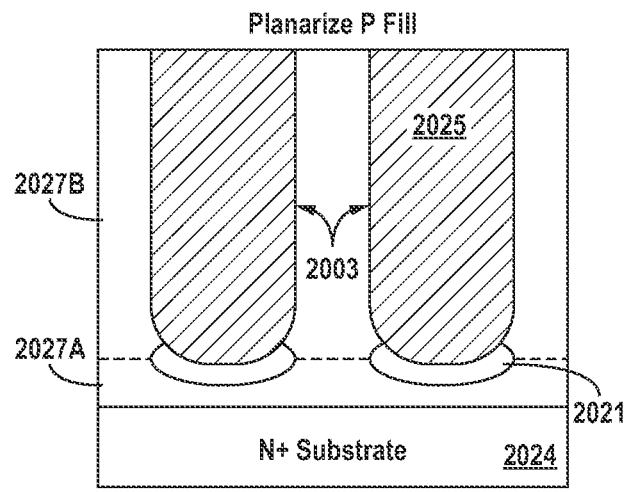
Figure 20H:
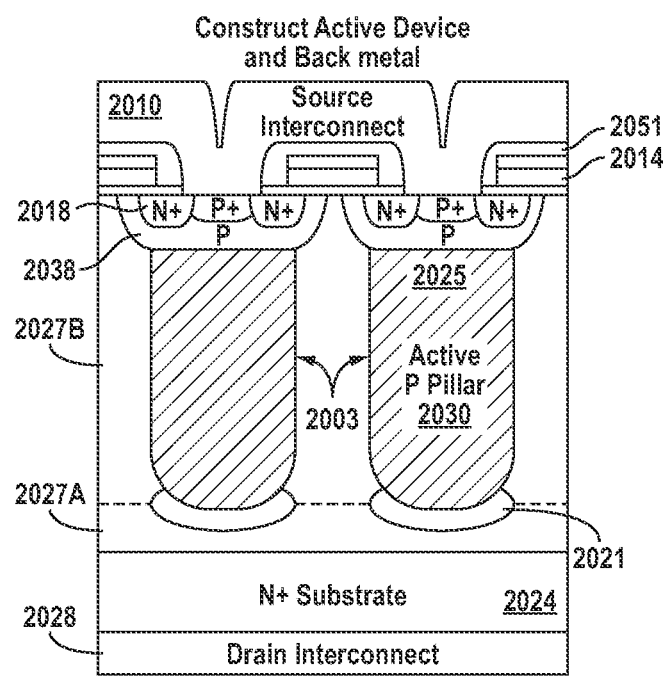

In FIG. 20G, P-epi 2005 may be planarized using, for example, a conventional chemical mechanical polishing (CMP) process. In FIG. 20H, P-body region 2038, N+ source regions 2018, the P+ heavy body regions as well as the gate structure and its overlying layers may be formed using known techniques. FIG. 20H is similar to FIG. 19.

As can be seen, this process yields a super-junction device with P-enrichment regions 2021 at the bottom of P-pillars 2030. This can induce avalanche breakdown at the bottom of pillars 2030 and result in a device with improved UIS capability.

In one embodiment, P-pillars 2030 have the same width and are spaced from one another by the same distance. However, the width of P-pillars 2030 is preferably smaller than the spacing between P-pillars 2030, thus providing a N-rich condition in the active region.

As discussed above, device ruggedness can be improved in trench epi fill charge balance devices by initiating breakdown in the active area and having the breakdown voltage be substantially lower than other areas, such as termination regions, gate runner areas, and other areas that are likely to be a potential source of charge imbalance. In accordance with an embodiment of the invention, this can be achieved by growing two or more epi layers. Similar to the process shown in FIGS. 20A-20H, the first epi layer is grown and a P enrichment implant is formed in the first epi layer where the trenches will terminate. The P enrichment regions need not extend along the full length of the P-pillar, be continuous along the P-pillar, or be parallel to the P-pillar. This implanted enrichment area can disrupt charge balance in the active region and create a location of lower breakdown voltage so that avalanche initiates in this area.

Figure 21A:
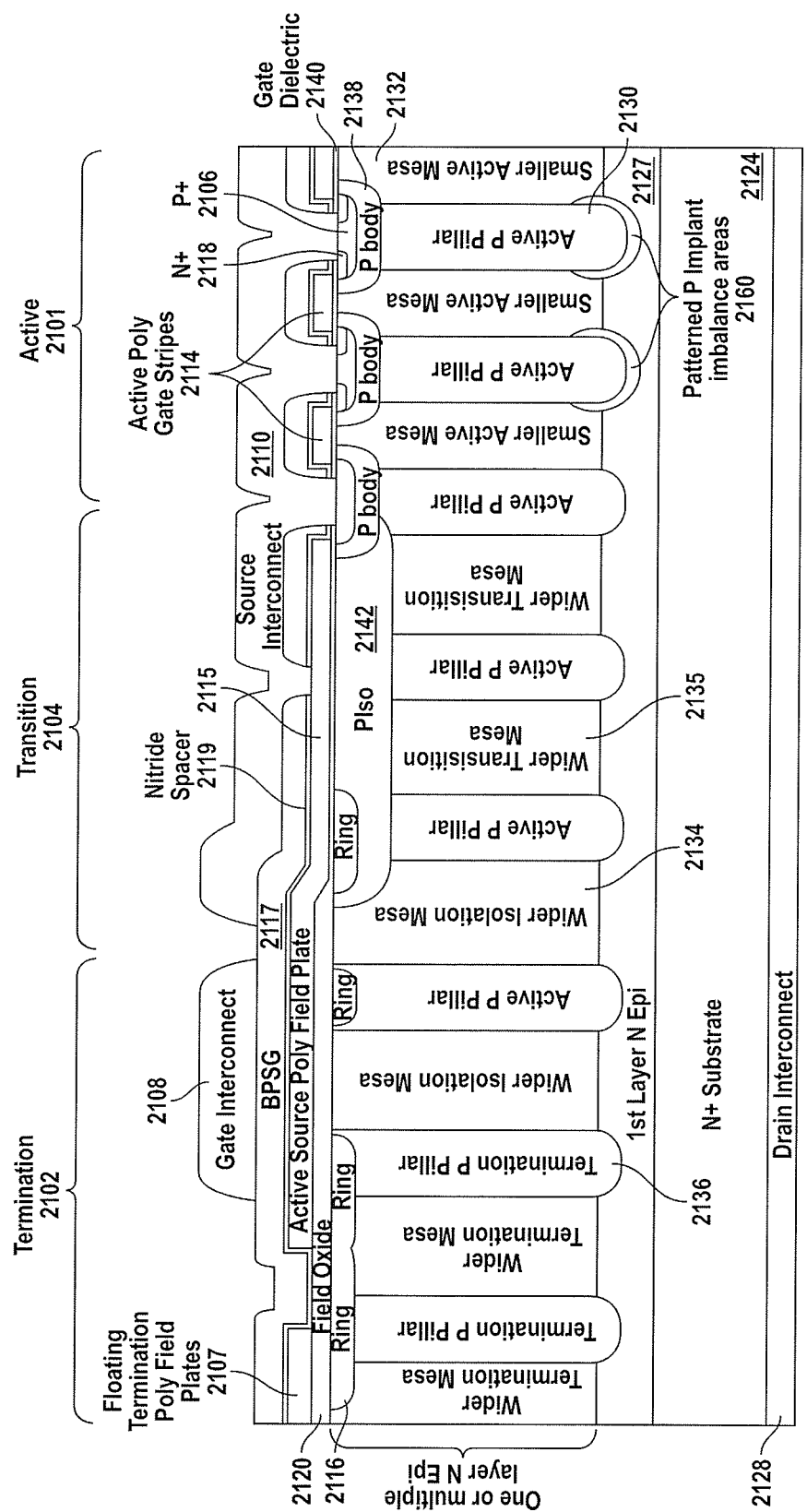
FIGS. 21A-21F are simplified cross section views illustrating various implementations of P-enrichment regions at or near the bottom of all or select group of P-pillars in the active and/or termination regions, in accordance with embodiments of the invention.
Figure 21B:
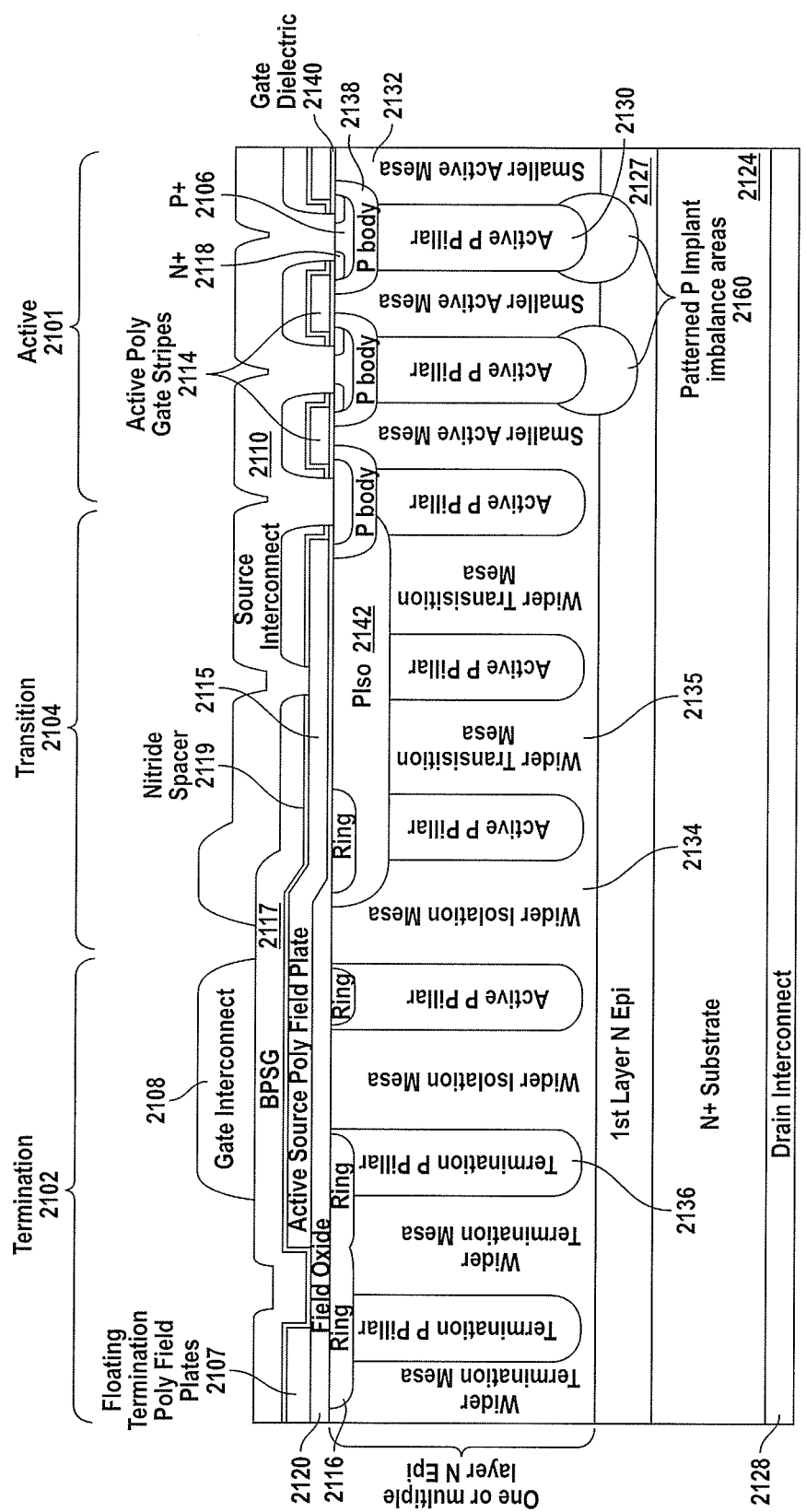
Figure 21C:
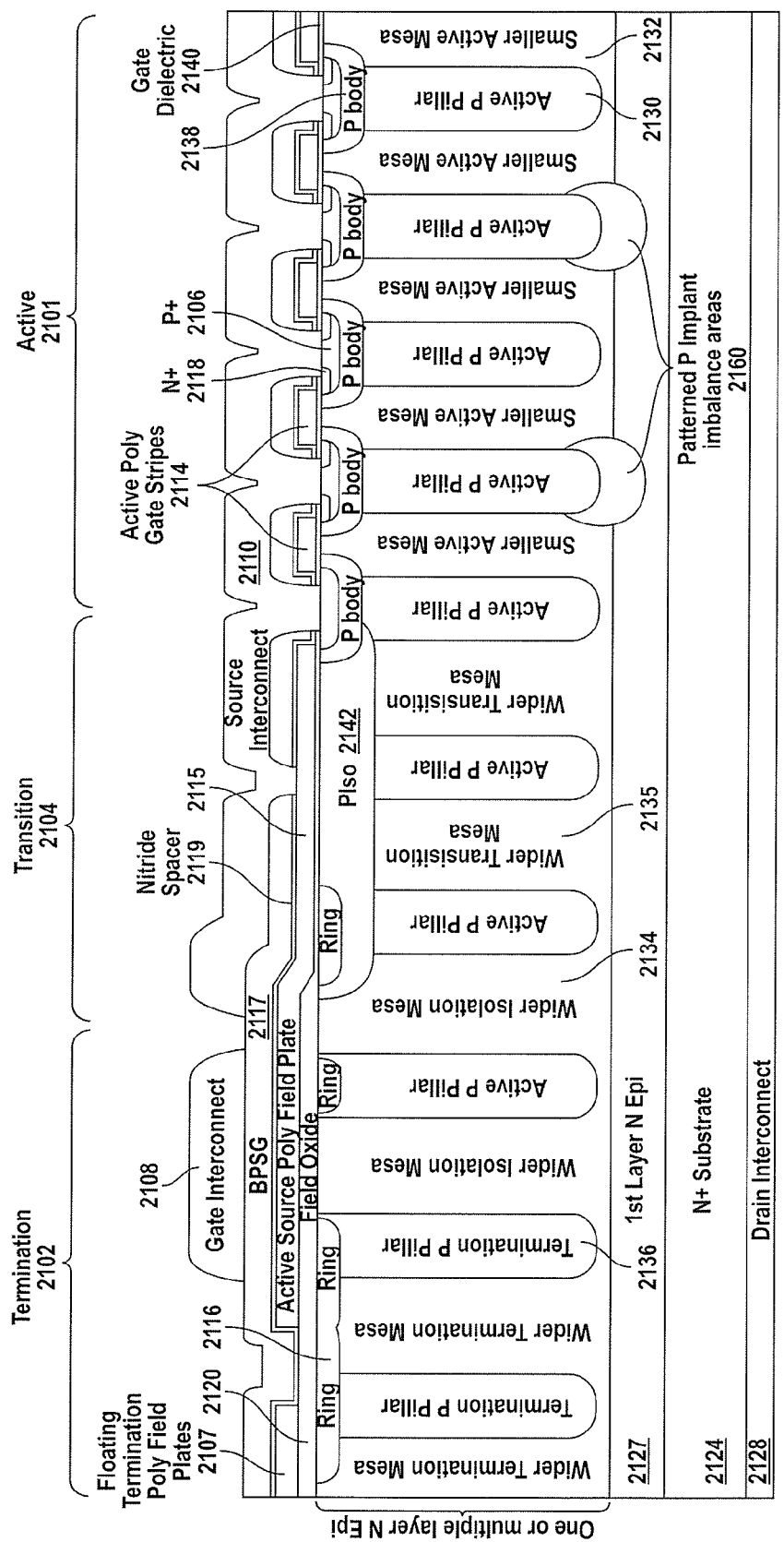

FIG. 21A is a cross section view of an exemplary embodiment of the invention where P enrichment regions 2160 may be formed at the bottom of pillars 2130 in active region 2101 only. In this example, P enrichment regions 2160 may be wider than active P Pillar 2130. FIG. 21A is similar to FIG. 3 except for the inclusion of P enrichment regions 2160. FIG. 21B shows a variation where active P pillars 2130 do not extend as deep into P enrichment regions 2160, thus resulting in a higher P-rich imbalance condition to pin the onset of avalanche breakdown. FIG. 21C shows another variation where P enrichment regions 2160 may be formed at the bottom of every other active P pillar 2130. This embodiment is advantageous in that P enrichment regions 2160 do not pinch off the current path at the bottom of pillars 2130 thus improving Rdson. Note that P enrichment regions 2160 could also be formed at the bottom of every third pillar or every fourth pillar or some other pattern so long as breakdown occurs in a uniform manner in the active region.

Figure 21D:
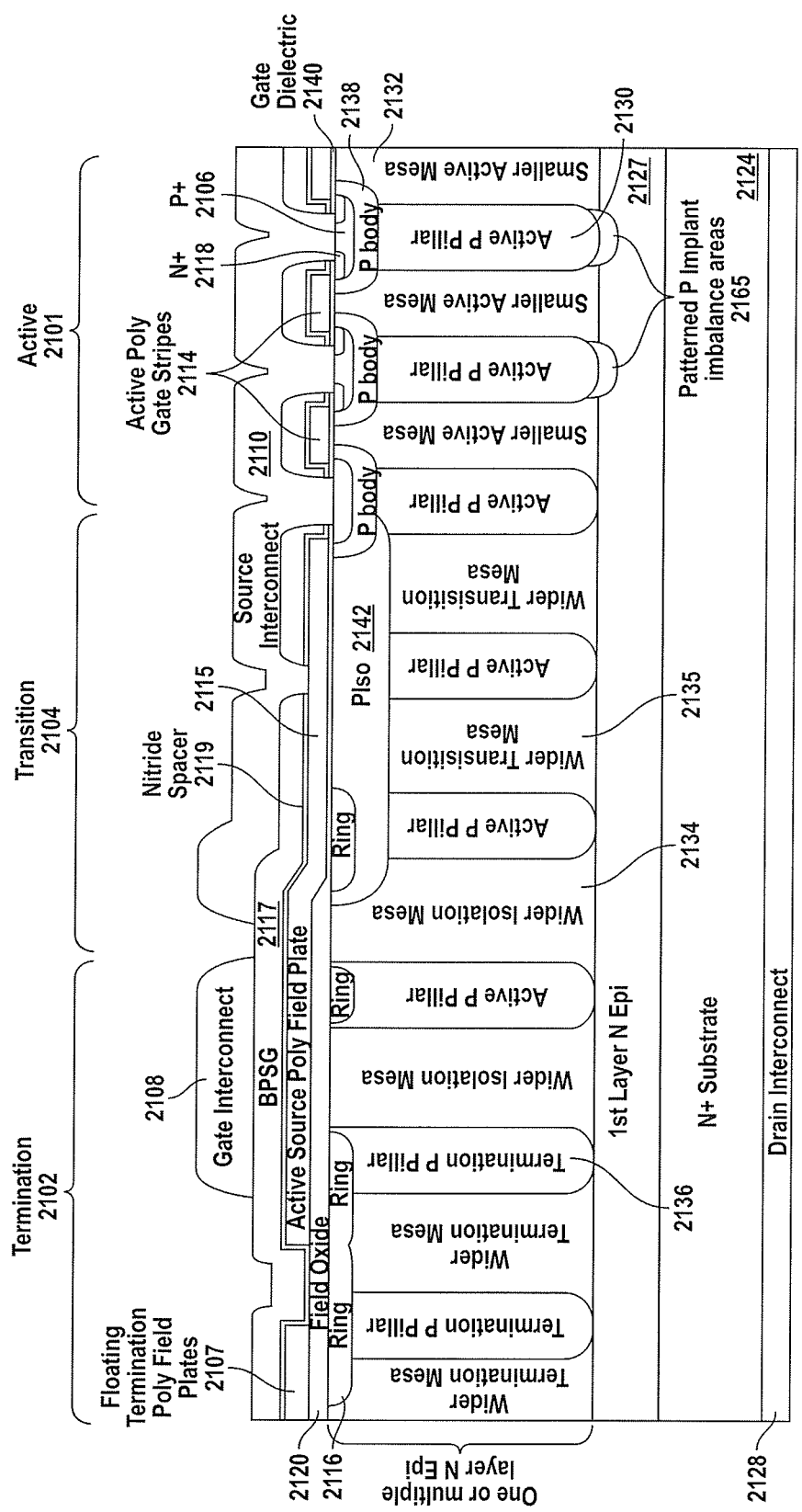
Figure 21E:
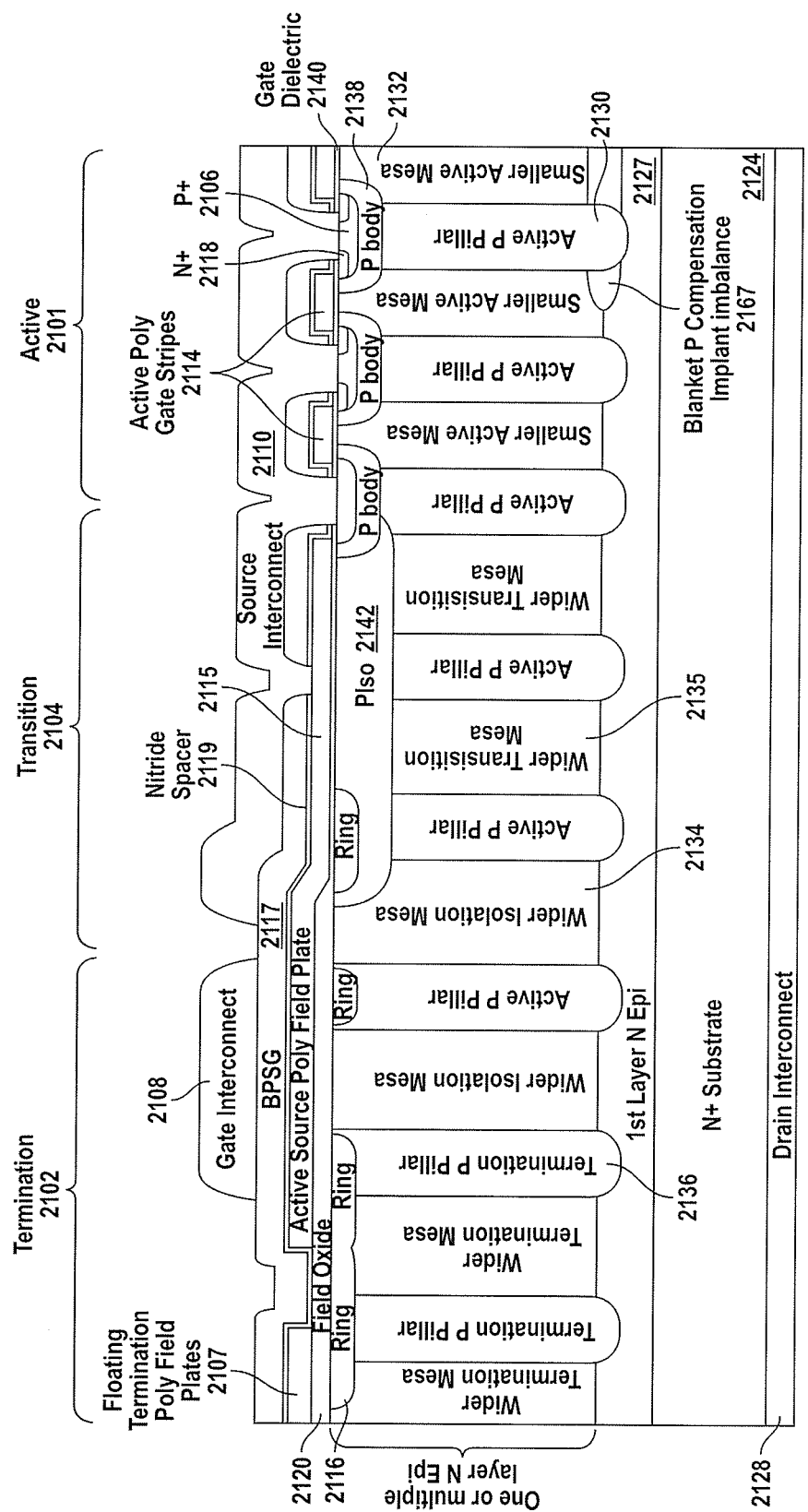
Figure 21F:
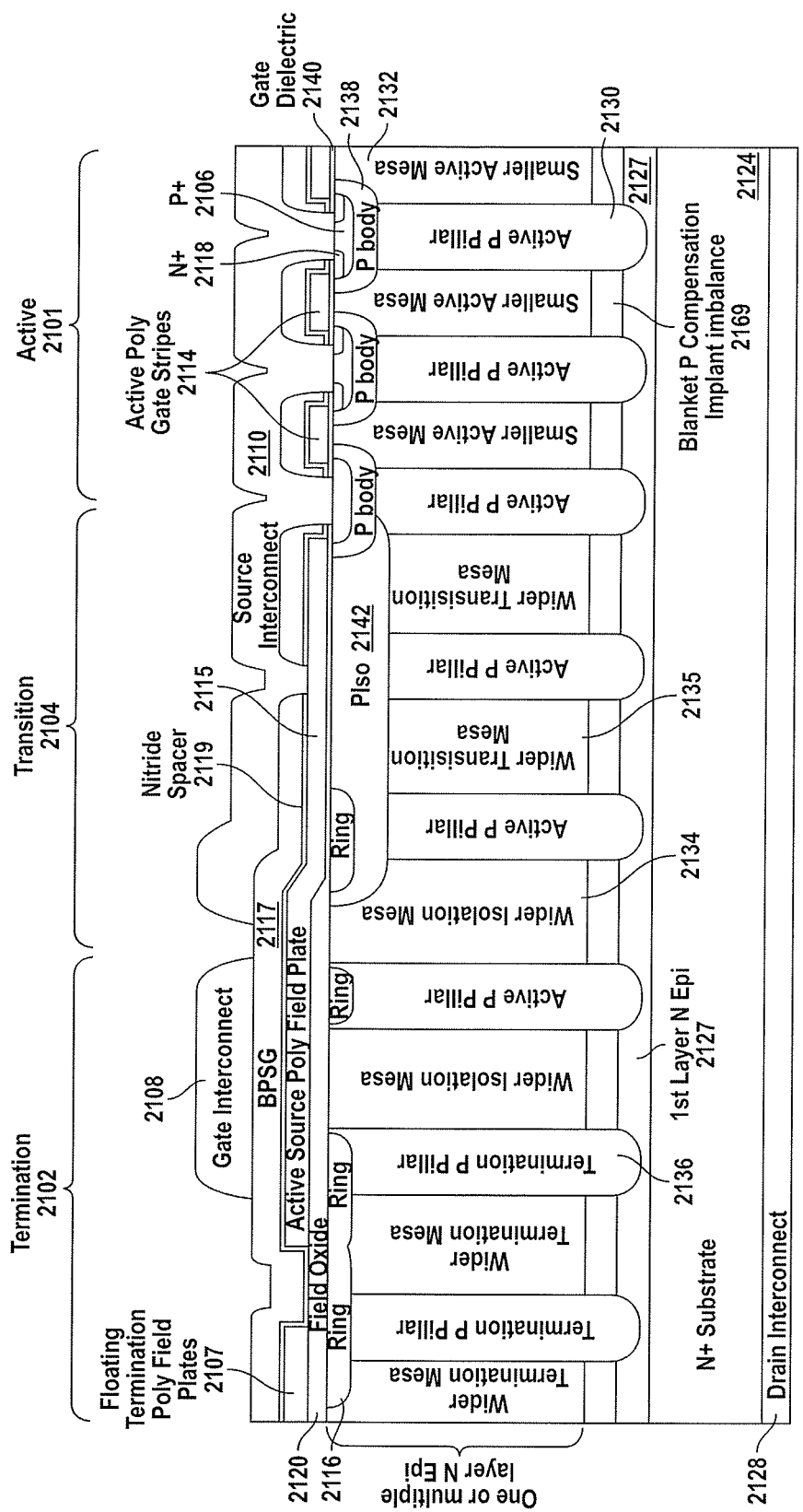

FIG. 21D shows yet another variation where P enrichment regions 2165 may be narrower than active P pillars 2130. This embodiment can eliminate pinch-off of the current path present in the FIG. 21A embodiment. FIG. 21E shows another exemplary embodiment where P enrichment region 2167 may be formed in a blanket manner in active region 2101. As can be seen, blanket P compensation region 2167 extends along the bottom of active P pillars 2130 and N mesa regions 2132. The doping concentration of P compensation region 2167 can be carefully selected to ensure that N mesa regions 2132 remain N-type. For MOSFET and IGBT devices, the P implant is chosen based on the trade-off of increasing N mesa region resistivity versus increasing Rdson or Vce(sat). Further, in an embodiment not shown, the P enrichment regions could also be formed by using one or more stripes that are not parallel to the plurality of active pillars. One advantage of this embodiment is that the alignment to the pillar trenches is not critical. FIG. 21F shows a variation of FIG. 21E where blanket P compensation region 2169 extends along the bottom of both active and termination pillars 2130 and 2136, respectively. This implementation can advantageously eliminate the need for a mask so that P compensation region 2169 can be formed by a blanket implant.

The various embodiments of this invention may be applied to any of the three layout configurations shown in FIGS. 1A-1C, and may easily be implemented in the process technology where pillars are formed using multi-layer epi and implant steps.

In accordance with another embodiment of the invention, regions of N-enrichment are formed at the bottom of the P-pillars or in the mesa regions adjacent the bottom of the P-pillars to disrupt charge balance and thereby create a location of lower breakdown voltage so that avalanche initiates at this localized area.

The same process technique for forming the P-enrichment regions described above in connection with FIGS. 21A-21F can also be used, with slight modifications, to form the N-enrichment regions. The N-enrichment regions may be implemented in both the active and termination regions, thus ensuring that breakdown occurs near the bottom of the pillars and is far from the silicon surface. Alternatively, the N-enrichment regions may be implemented in the active region only, so that the charge balance is disrupted in the active region to ensure breakdown in the active region. Further, the N enrichment regions need not extend along the full length of the active pillars, be continuous along the active pillar length, or be parallel to the active pillars. A thermal diffusion cycle can be used directly after the N-enrichment implant or after subsequent epi layers of same doping type are grown. Various ways of implementing the N-enrichment regions are shown in FIGS. 22A-22N in accordance with exemplary embodiments of the invention.

Figure 22A:
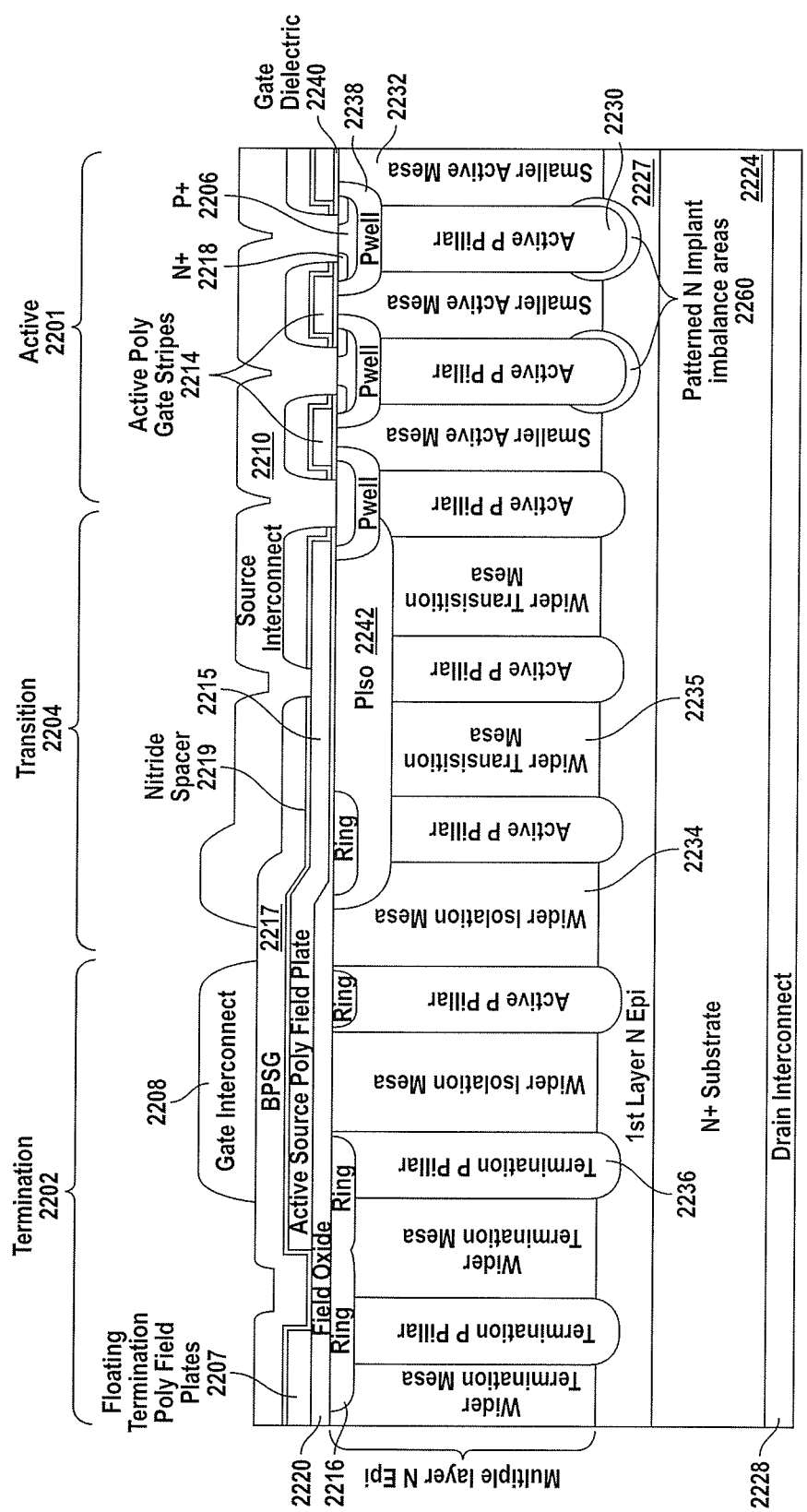
FIGS. 22A-22N are simplified cross section views illustrating various implementations of N-enrichment regions at or near the bottom of all or select group of P-pillars in the active and/or termination regions, in accordance with embodiments of the invention.
Figure 22B:
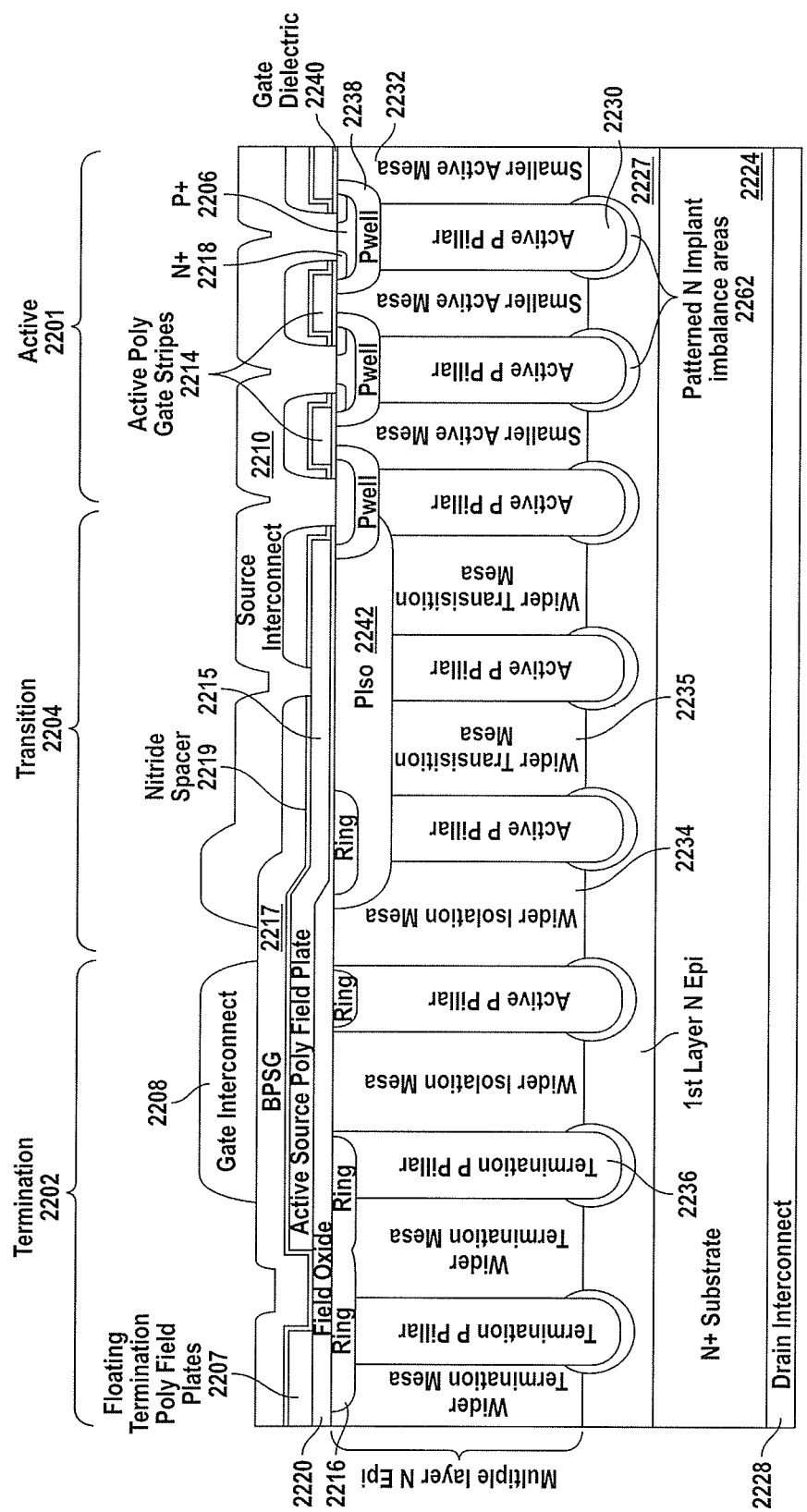
Figure 22C:
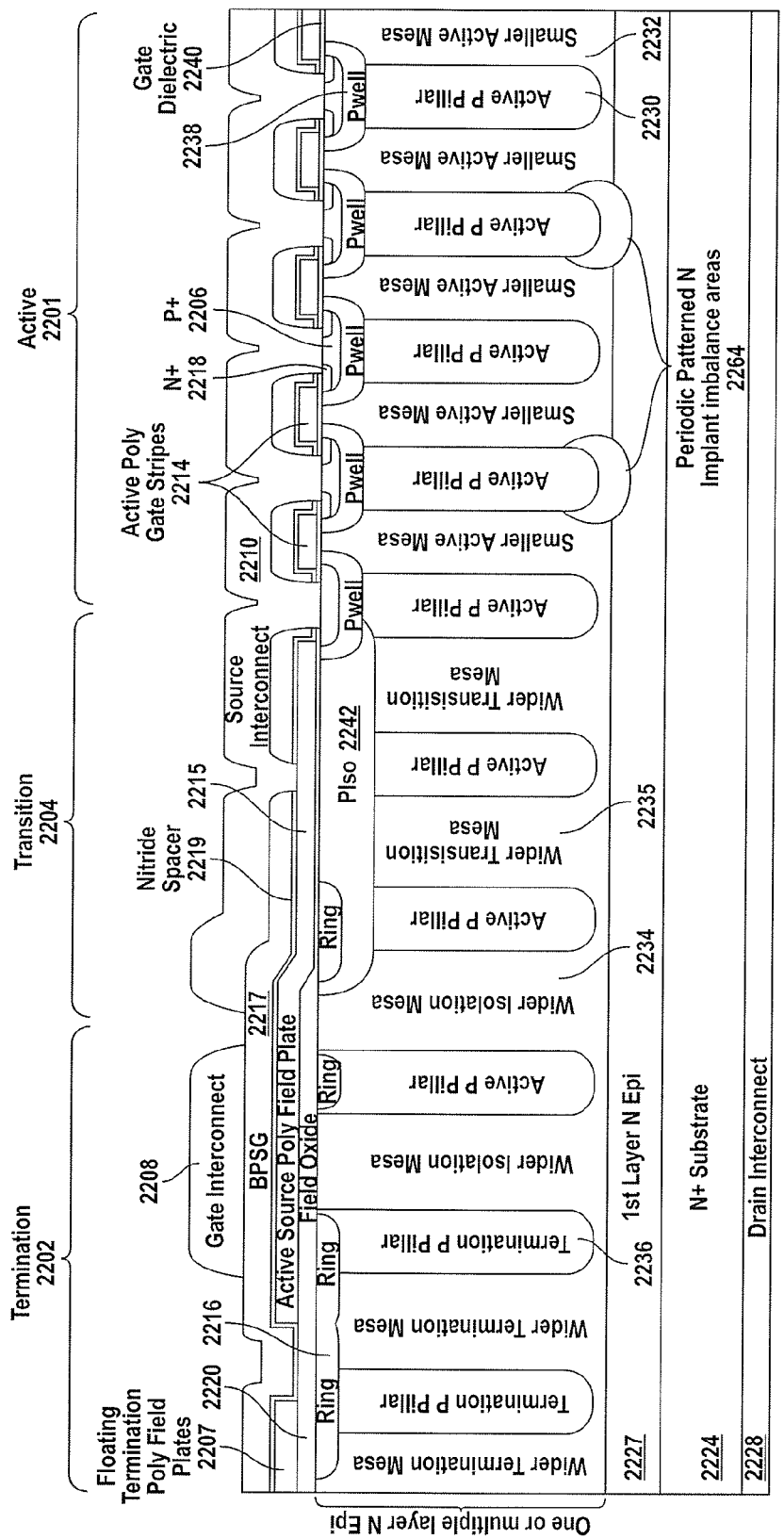
Figure 22D:
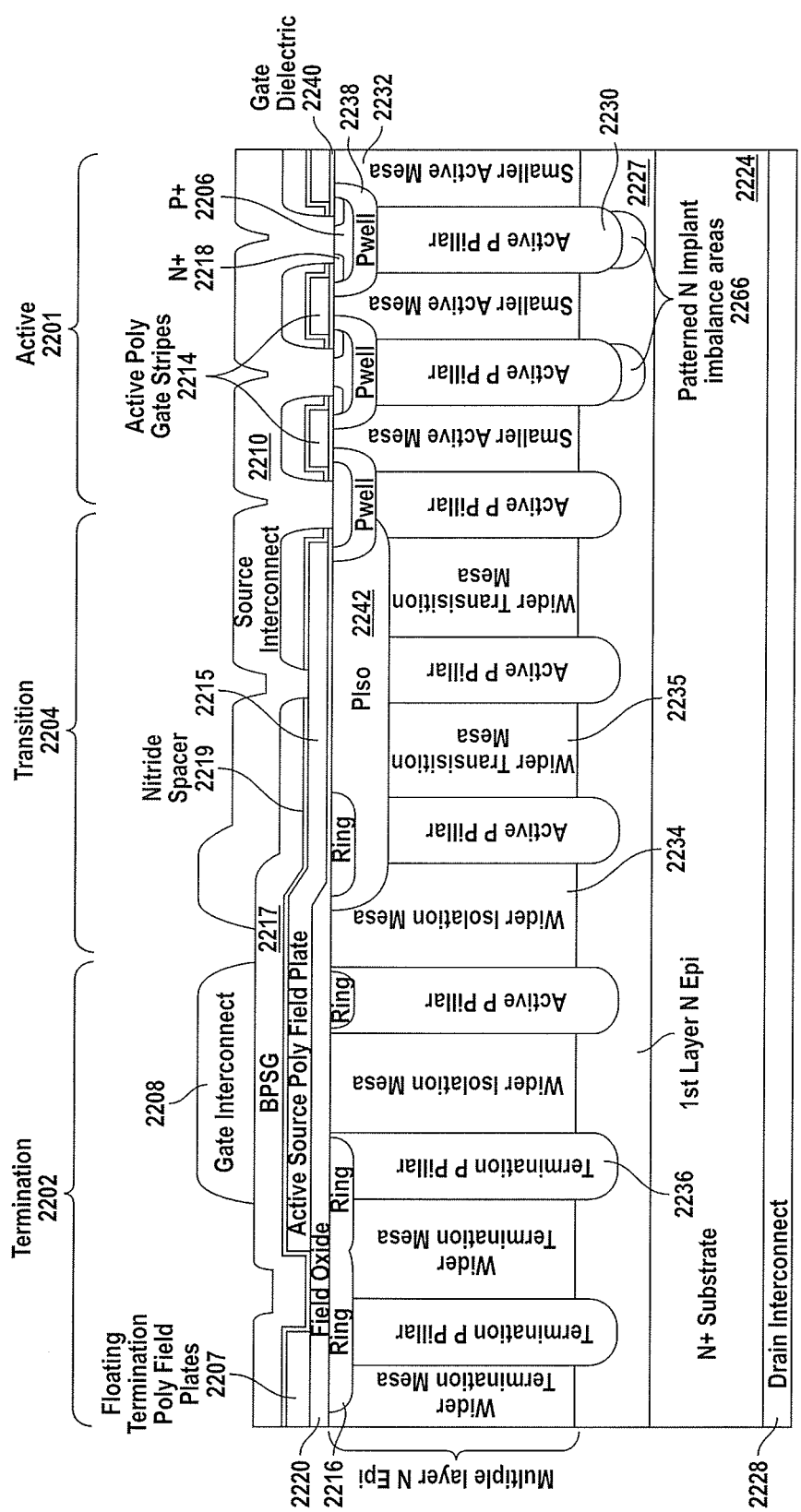
Figure 22E:
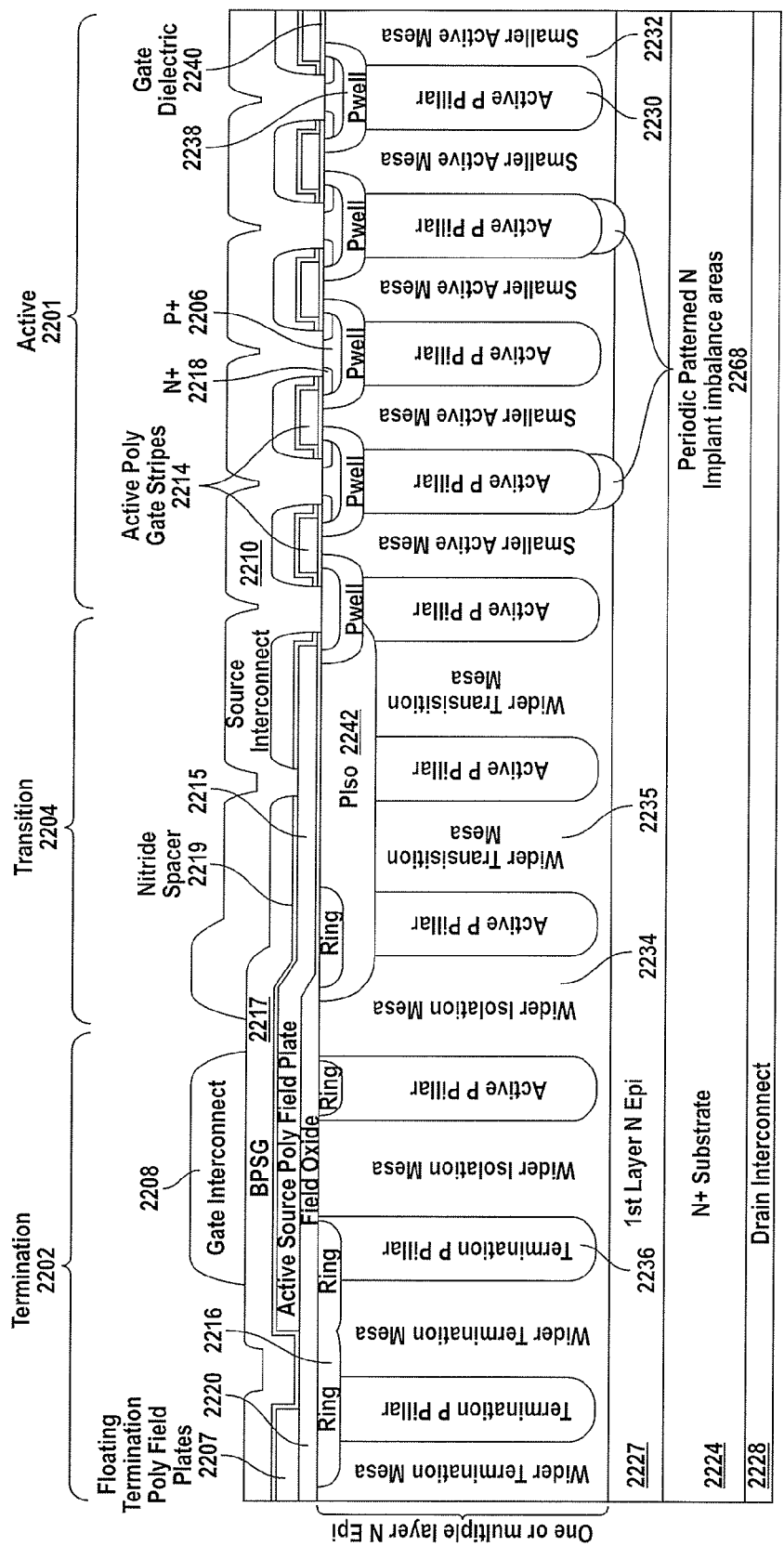
Figure 22F:
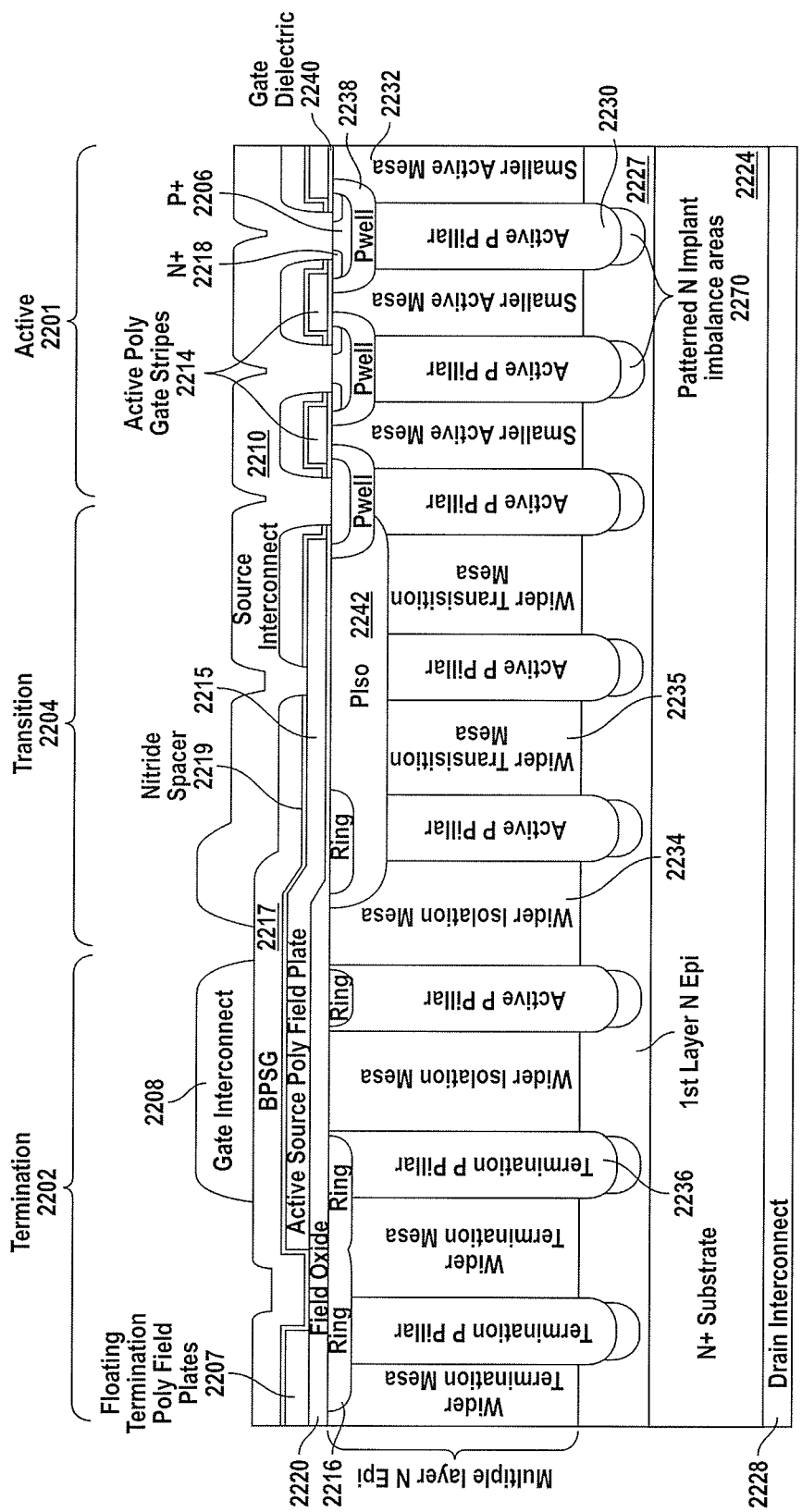
Figure 22G:
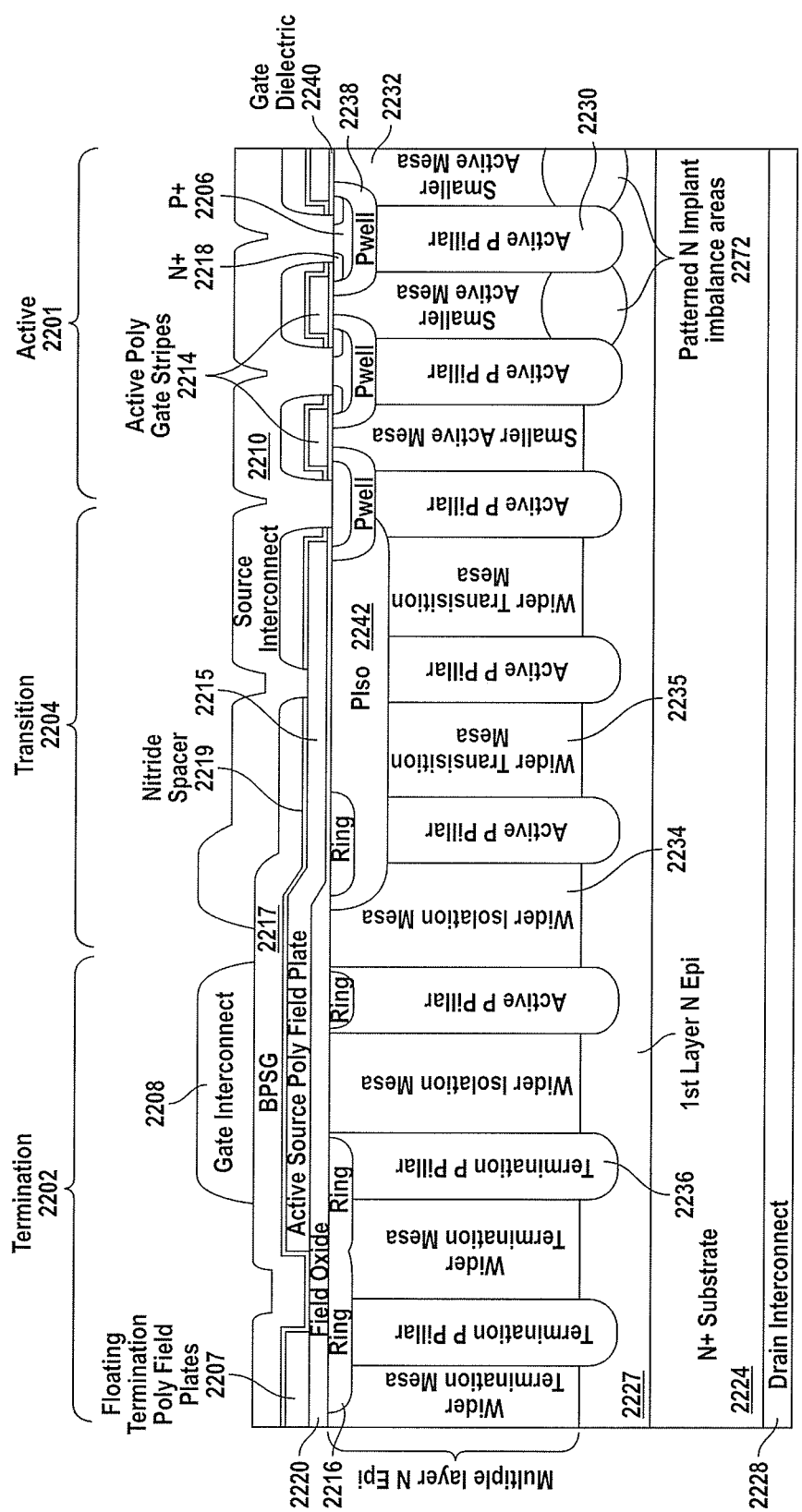
Figure 22H:
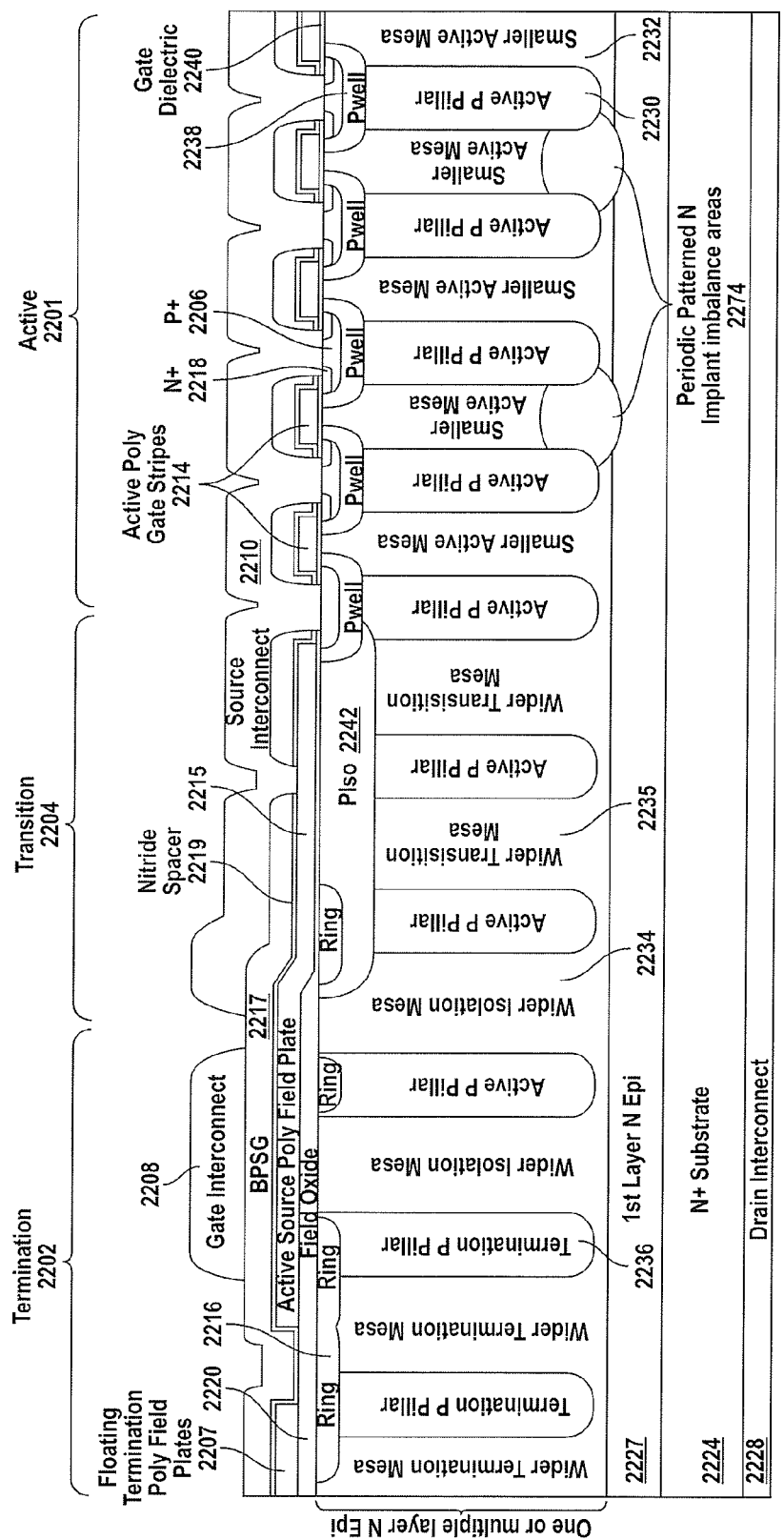
Figure 22I:
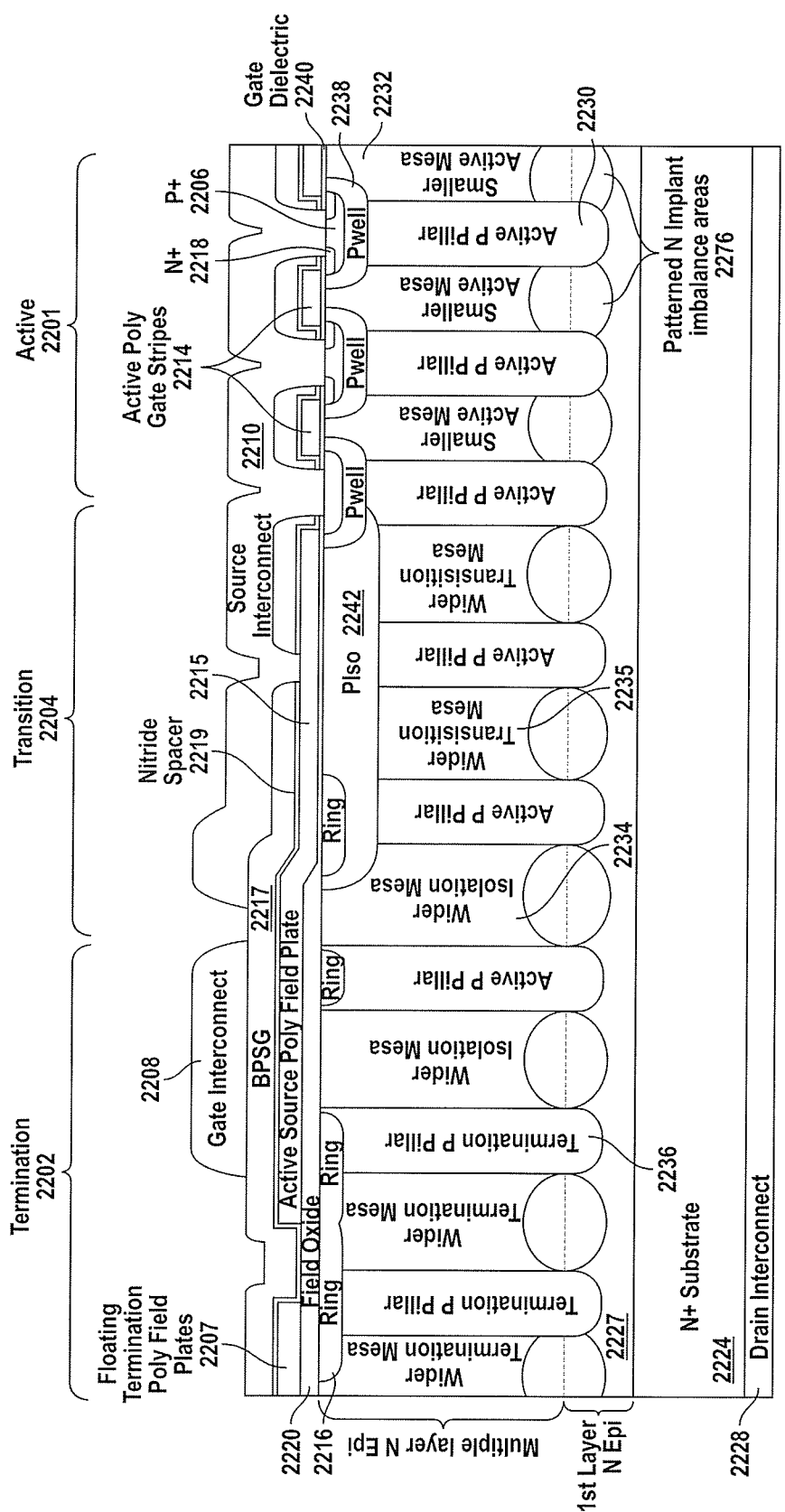
Figure 22J:
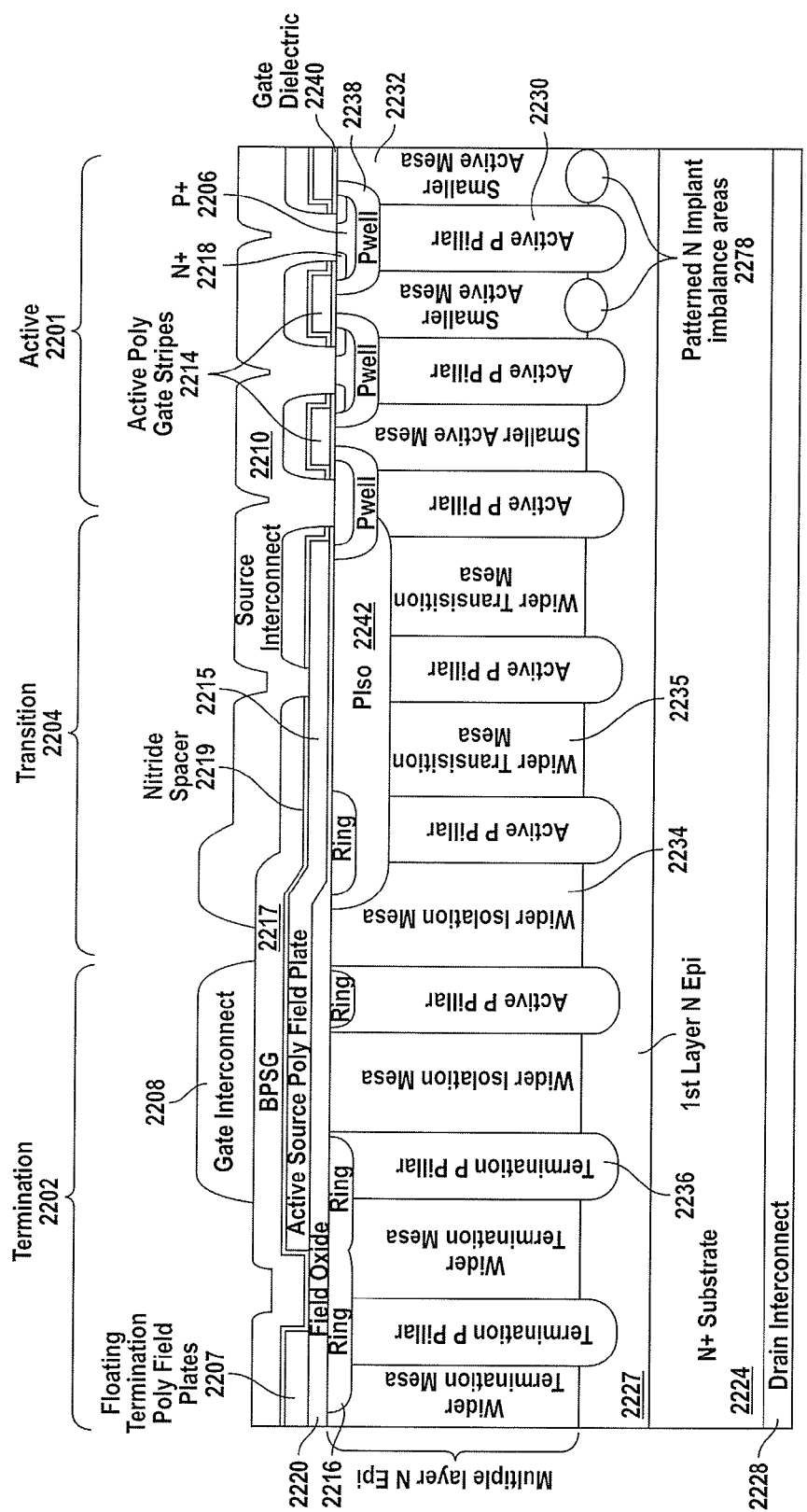
Figure 22K:
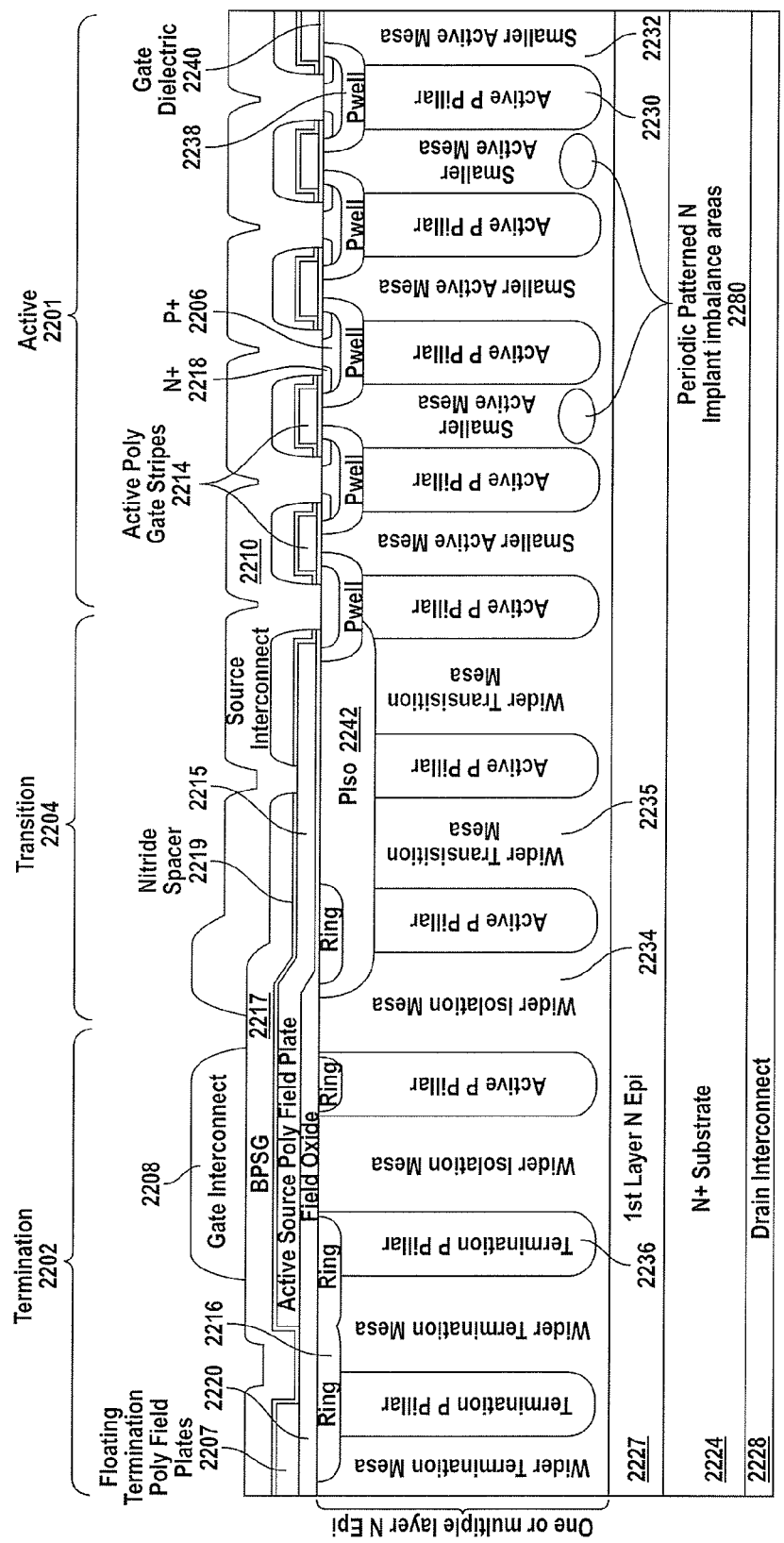
Figure 22L:
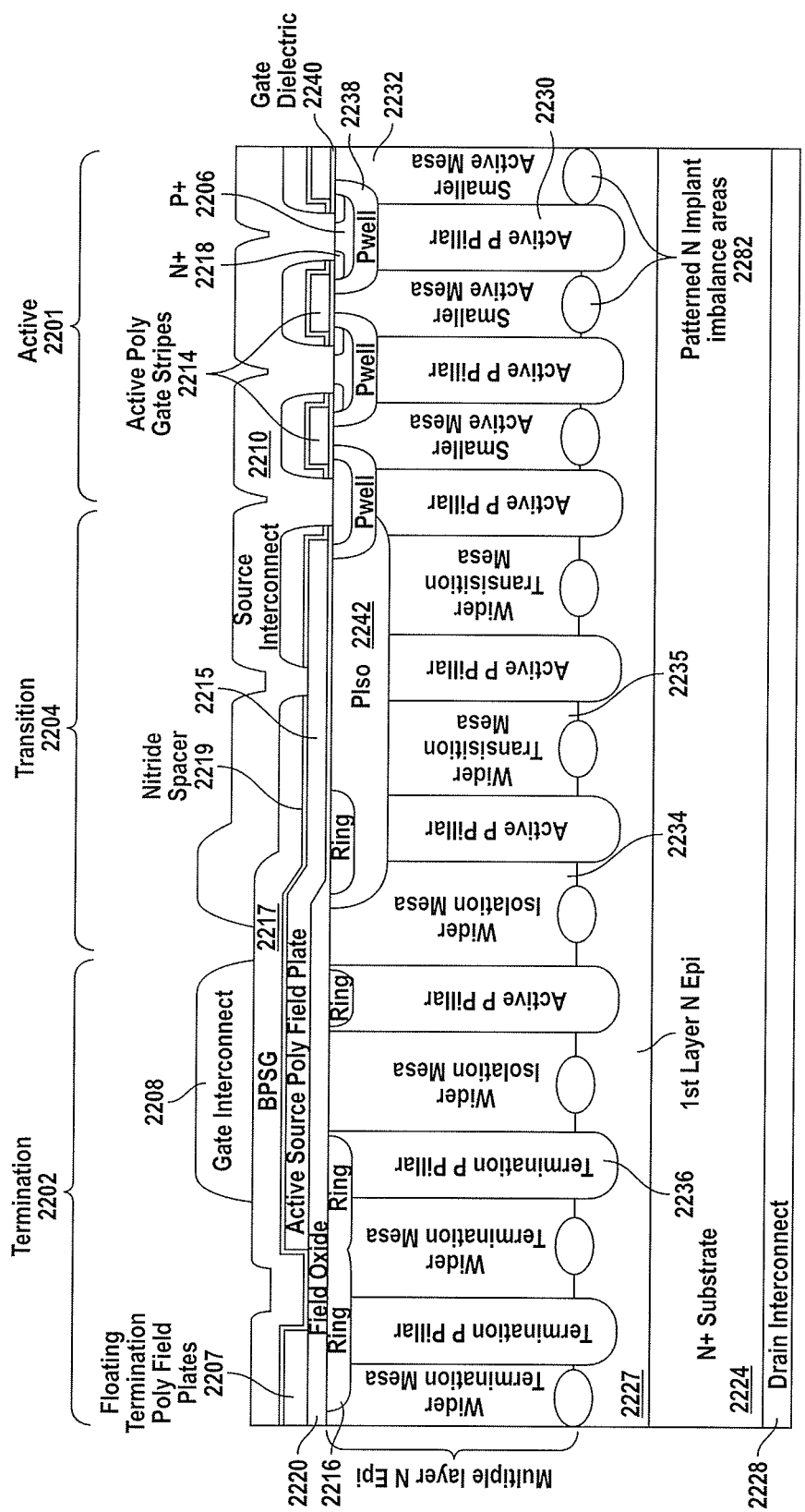
Figure 22M:
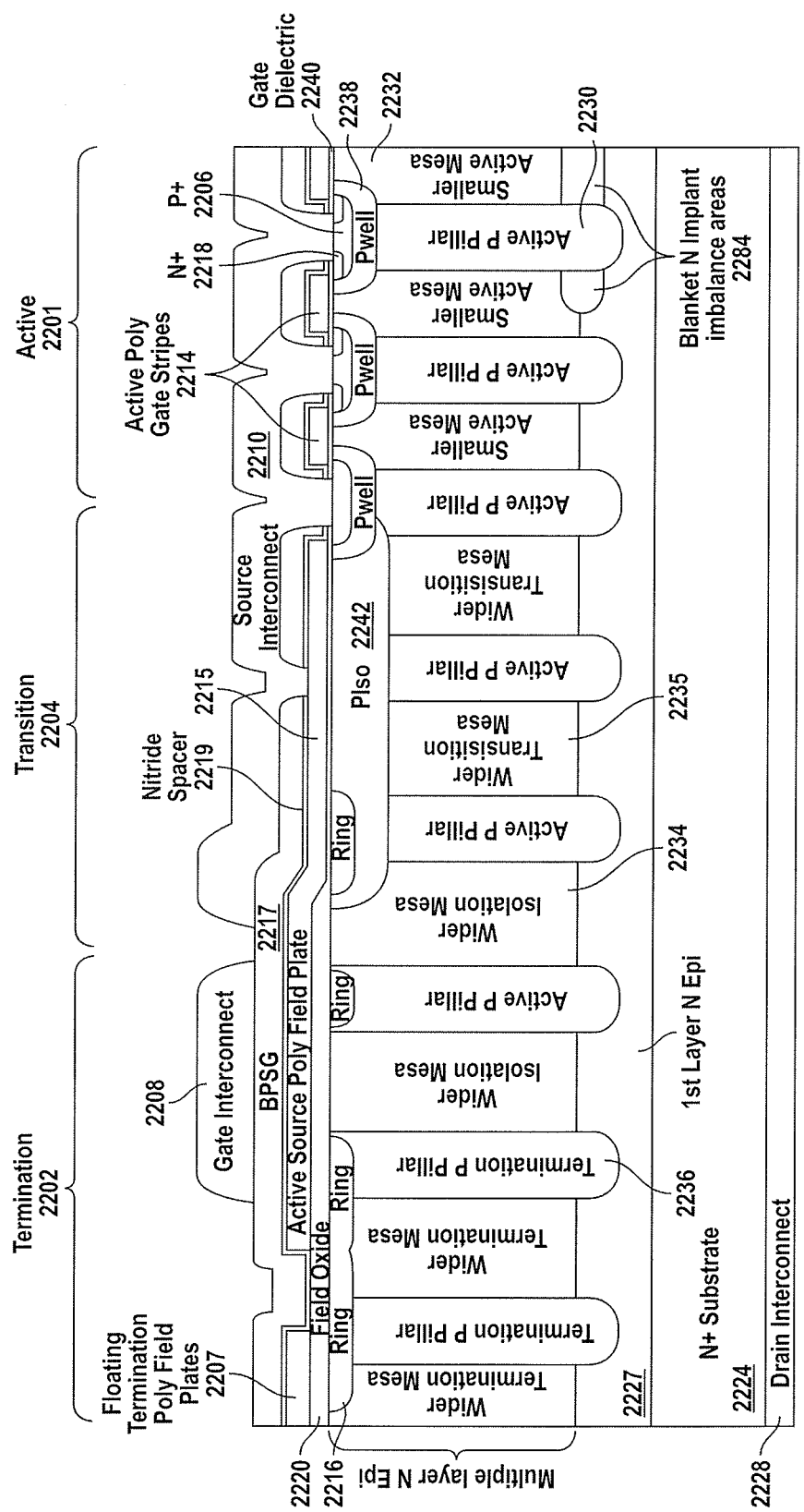
Figure 22N:
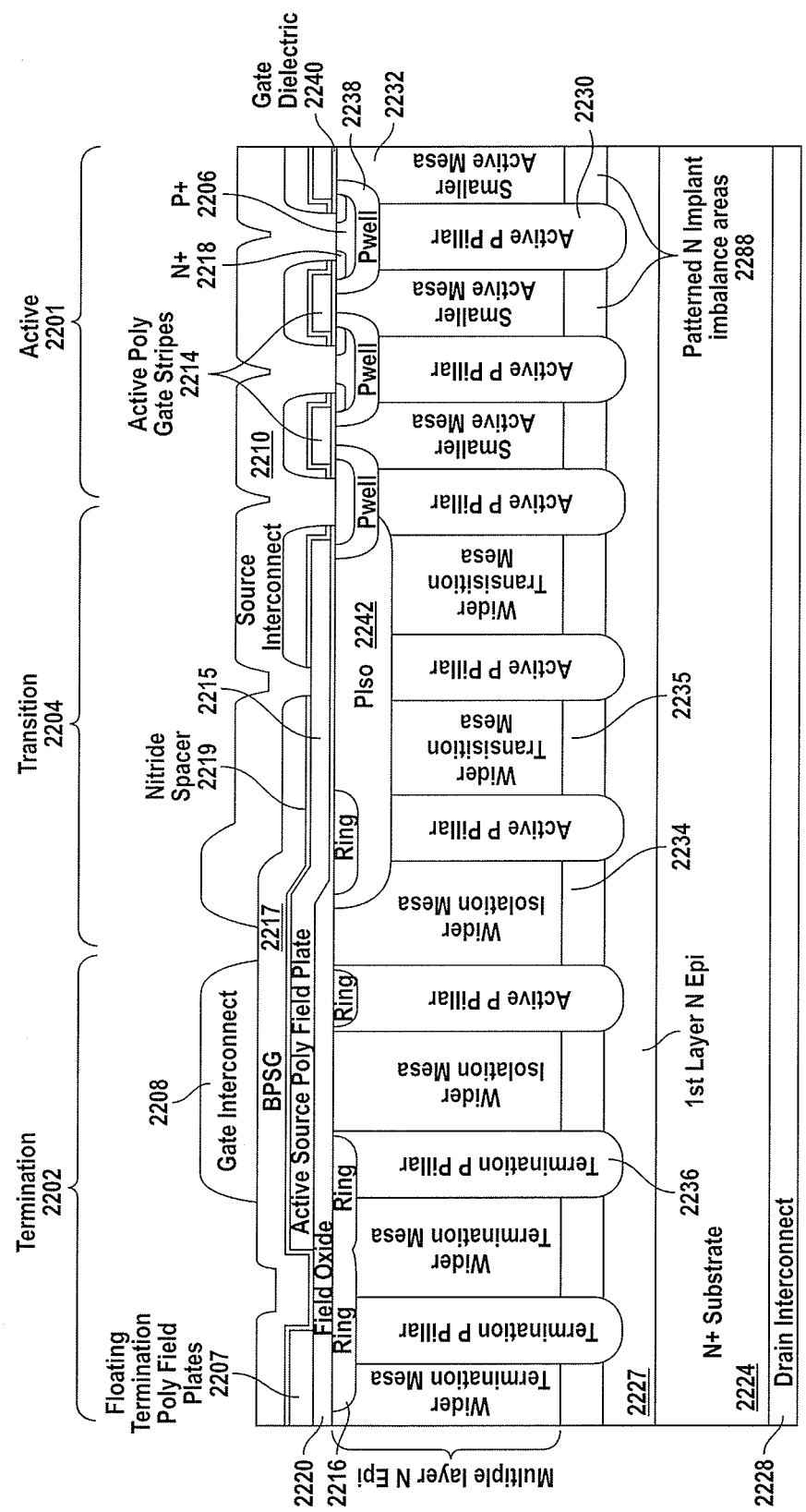

The cross section views in FIGS. 22A-22N are generally similar to FIG. 3 except for inclusion of the N-enrichment regions. In FIG. 22A, N-enrichment regions 2260 may be formed at the bottom of P-pillars 2230 in active region 2201 only. N-enrichment regions 2260 may be wider than P-pillars 2230. FIG. 22B shows a variation where N-enrichment regions 2262 may be formed at the bottom of P-pillars 2230, 2236, including those P-pillars in termination region 2202 (i.e., pillars 2236). FIG. 22C shows a variation where P-pillars 2230, 2236 may not extend into first epi layer 2227. This embodiment helps to spread the current flow under P-pillars 2230, thus reducing Rdson and reducing P-pillar compensation. The effective depth of P-pillars 2230 may also be reduced, thus reducing breakdown voltage. Further, N-enrichments regions 2264 may be formed periodically (in this case, every other pillar) in active region 2201 only.

FIG. 22D shows a variation where N-enrichment regions 2266 may be narrower in width than P-pillars 2230. FIG. 22E shows a variation where narrower N-enrichment regions 2268 may be formed periodically in active region 2201 only, while the FIG. 22F embodiment shows narrower N-enrichment regions 2270 that may be formed at the bottom of P-pillars 2230, 2236, including those in termination region 2202. Narrow N-enrichment regions 2270 may be more effective in pinning the BV at the bottom of the P-pillars, but may be less effective in reducing Rdson.

FIGS. 22G-22L show alternate embodiments where the N-enrichment regions may be formed in the N mesa regions near the bottom of the P-pillars. The mesa regions between P-pillars are herein also referred to as N-pillars. Doping the N-pillar more N-type near the bottom of the P-pillar, where the potential is higher, reduces the lateral depletion causing the effective width of the N-pillar to be wider and thus reducing Rdson. FIG. 22G shows an embodiment where N-enrichment regions 2272 may be formed at the bottom of N-pillars 2232 in active region 2201 only. As shown in FIG. 22G, N-enrichment regions 2272 have a lateral span wider than N-pillars 2232. FIG. 22H shows an embodiment where N-enrichment regions 2274 may be formed periodically in active region 2201 only. FIG. 22I shows an embodiment where N-enrichment regions 2276 may be formed at the bottom of N-pillars 2232, 2234, 2235. FIG. 22J shows N-enrichment regions 2278 at the bottom of N-pillars 2232 in active region 2201 only with a lateral span narrower than N-pillars 2232. FIG. 22K shows an embodiment where narrower N-enrichment regions 2280 are formed periodically in active region 2201. FIG. 22L shows narrower N-enrichment regions 2282 near the bottom of N-pillars 2232, 2234, 2235. The possible variations are not limited to those shown. Many other variations can be envisioned by one skilled in the art.

FIGS. 22M and 22N are similar to FIGS. 21E and 21F except that in FIGS. 22M and 22N blanket N enhancement area 2284 is used in active region 2201 only (FIG. 22M) and in both active region 2201 and termination region 2202 (FIG. 22N).

The doping concentration of the blanket N enrichment region can be carefully selected to ensure that the P-pillars through which it extends remain P-type. For MOSFET and IGBT devices, the N implant is chosen based on the trade-off of decreasing N mesa resistivity versus decreasing Rdson or Vce(sat). Further, in an embodiment not shown the N enrichment regions could also be formed by using one or more stripes that are not parallel to the plurality of active pillars. One advantage of these embodiments is that alignment to the pillar trenches is not critical.

When dopants such as P-well and P+ heavy body are masked off from under the gate pad and gate runners, they become sources of charge imbalance. Normally these areas in non-charge balance devices can be optimized to have higher BV. However, in charge balance devices, if active areas are not doped similar they can become static and dynamic BV locations.

Figure 23:
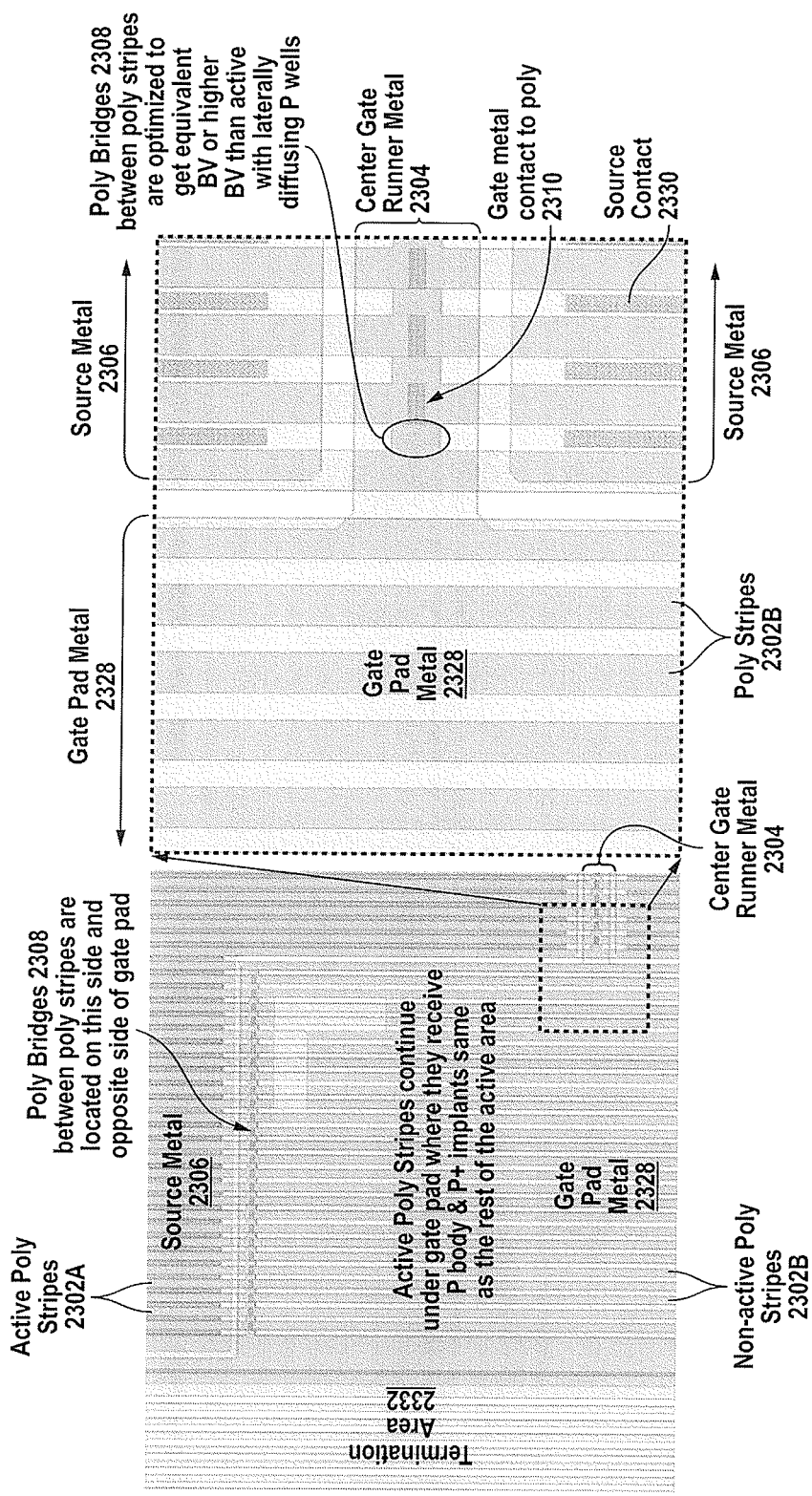
FIG. 23 is a simplified top layout view of a gate pad area and its surrounding region, wherein the active poly stripes are extended under the gate pad, in accordance with and embodiment of the invention.

FIG. 23 shows a top layout view of an exemplary embodiment of the invention wherein active poly stripes 2302A (also referred to as polysilicon gates) may be extended under gate pad 2328 so that the doping profile in the gate pad area is the same as that in the active area, thereby maintaining the same charge balance condition in the gate pad region as in the active region. In other words, by extending gate stripes 2302A into the gate pad area, the silicon region under the gate pad receives the same implants (e.g., well implant and P+ heavy body implant) as in the active area which advantageously helps maintain the same charge balance condition in the gate pad region as in the active region. The right side of FIG. 23 shows an expanded view of a portion of the left figure where gate runner metal 2304 extends out from gate pad 2328. The expanded view more clearly shows another feature of the invention. Small optimized poly bridges 2308 may be formed between poly gate stripes 2302B to maintain an interconnection between stripes 2302B. Without poly bridges 2308, individual contacts can be made to each stripe 2302B, but if one contact is not formed during manufacturing that un-contacted stripe causes a gate feed imbalance. A width of these poly bridges 2308 (in the direction parallel to poly stripes 2302B) is carefully selected to ensure that the implanted P-body merges under poly bridges 2308 thereby preventing charge imbalance in the poly bridge areas.

In the left figure, contacts to poly stripes 2302B in the gate pad area are made along two opposing sides of gate pad 2328. By placing the contacts away from the center bonding area, the integrity of the contacts to poly stripes is maintained during the bonding process. This can be of particular importance in process technologies with thin gate oxide.

Figure 24:
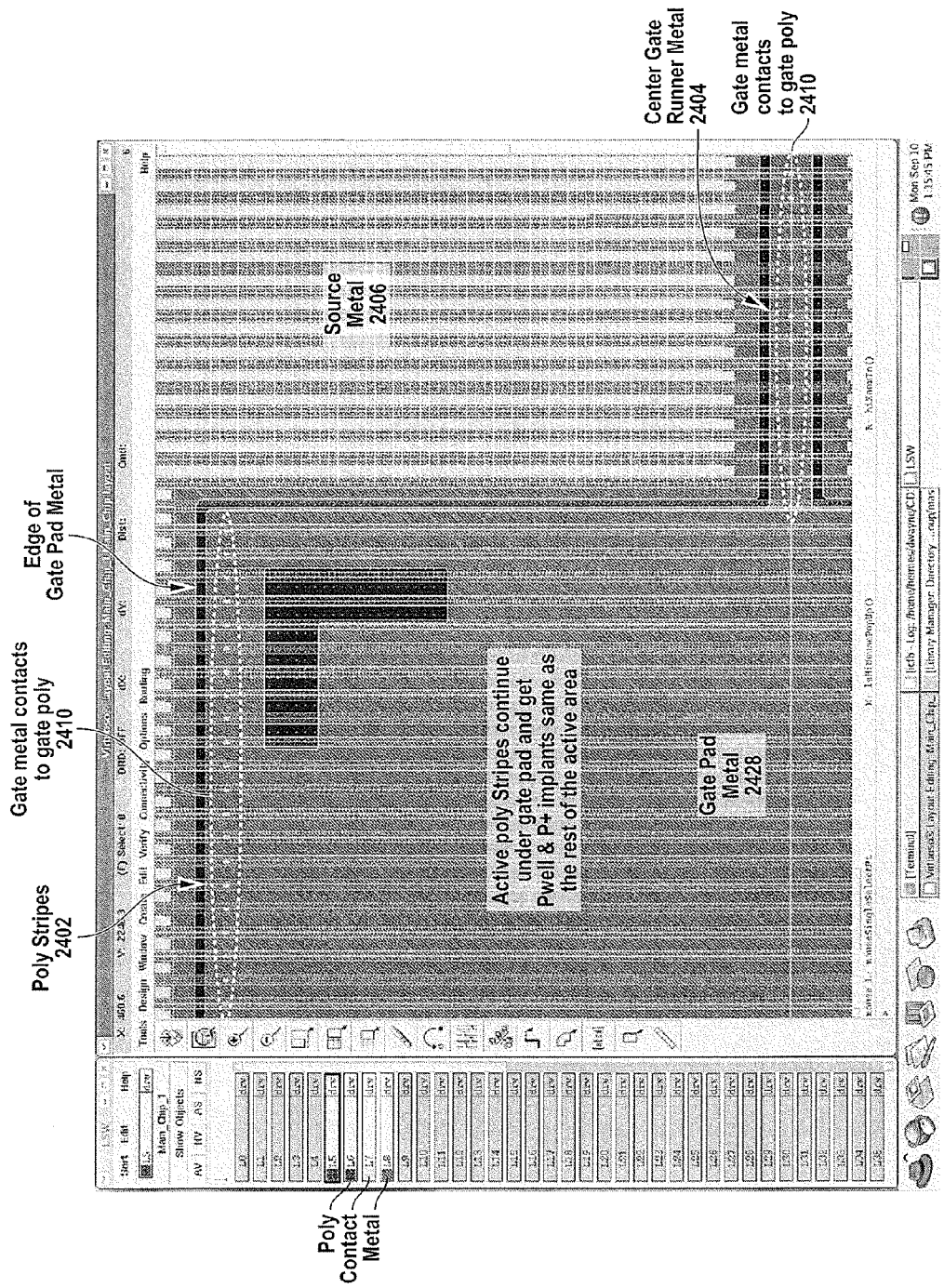
FIG. 24 is a simplified top layout view showing a variation of the FIG. 23 design where the poly stripes are extended through the gate pad area similar to FIG. 23 but no poly bridges are used, in accordance with another embodiment of the invention.

FIG. 24 shows a variation of the FIG. 23 design where poly stripes 2402 are extended through the gate pad area similar to FIG. 23, but no poly bridges are used. As shown, every poly stripe 2402 is contacted by a gate metal-to-poly contact 2410.

Figure 25:
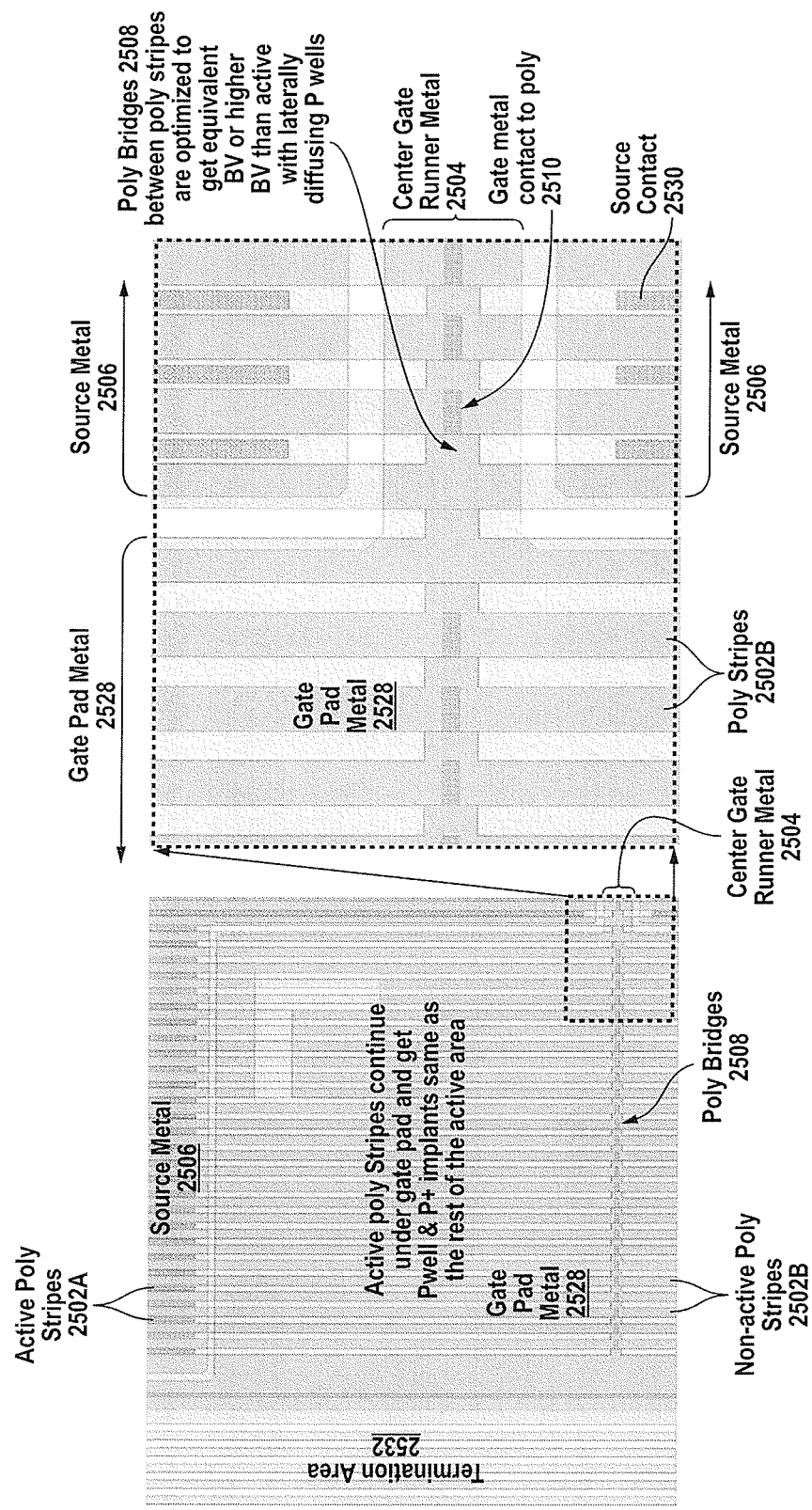
FIG. 25 is a simplified top layout view that is similar to the FIG. 23 embodiment except that the gate metal contacts to the poly stripes are made along the center of the gate pad area, in accordance with an alternate embodiment of the invention.

FIG. 25 is top layout view and is similar to the FIG. 23 embodiment except that the gate metal contacts to poly stripes 2502B are made along a middle section of the gate pad area. In the embodiment shown in FIG. 25, poly stripes 2502 may be extended through the gate pad areas as in the FIG. 23 design. The FIG. 25 design, however, eliminates the non-uniform gate feed length present in the FIG. 23 design due to the two rows of contacts at the two ends of the gate pad. With the metal gate contacts inside and outside the gate pad area lined up, a more uniform RC delay can be obtained through the poly gates, resulting in a more uniform dv/dt throughout the die. In the FIG. 25 embodiment, however, the gate oxide thickness may need to be made sufficiently thick to ensure that the integrity of the gate contacts extending through the center of the gate pad area is maintained during wire bonding.

Figure 26:
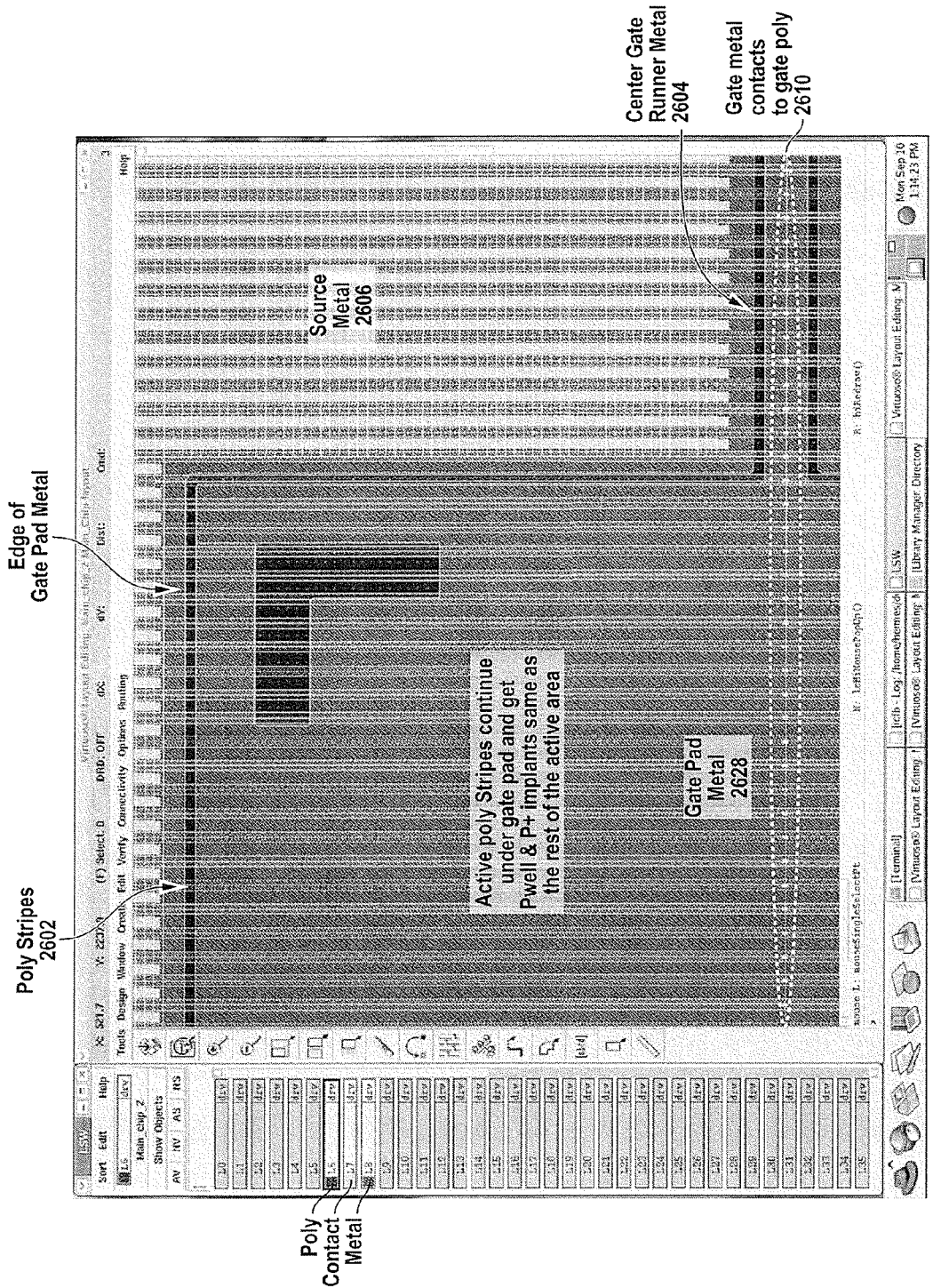
FIG. 26 is a simplified top layout view showing a variation of the FIG. 25 design where the poly stripes are extended through the gate pad area similar to FIG. 23 but no poly bridges are used, in accordance with another embodiment of the invention.

FIG. 26 shows a variation of the FIG. 25 design where poly stripes 2602 may be extended through the gate pad area 2628 similar to FIG. 23, but no poly bridges are used. As shown, every poly stripe 2602 is contacted by a gate metal-to-poly contact 2610.

Creating an active gate structure over the area where the pillar trench is etched and filled can result in lower gate oxide integrity and reduced gate reliability. This is because surface states from the trench etch, stress induced dislocations, damage due to trench etch and filling, and voids resulting from incomplete pillar epi fill can result in reduced gate oxide integrity and reduced gate reliability.

In accordance with an embodiment of the invention, a planar gate or trench gate is configured so that the active channel is not formed over the area where the pillar trench is etched and filled. FIGS. 27A-27C will be used to illustrate this in the context of a planar gate structure, but the concept may also be implemented in trench gate structures. In FIGS. 27A-27C, the vertical dashed double-headed arrows indicate the boundaries of the trench prior to filling the trench with epi. As shown in FIG. 27A, active poly gate stripes 2714 overlap the etched trench, and thus the integrity of the gate oxide is compromised. However, in FIGS. 27B and 27C, the active poly gate width and spacing are designed relative to the etched trench so that no part of the gate oxide underlying gate poly 2714 extends over the etched trench. Note that in FIG. 27C the width of P-pillar 2730 is narrower than the trench boundaries because FIG. 27C represents an N-rich condition.

In the trench epi fill charge balance technology, patterning effects due to the deep trench etch and fill processes result in a non-uniform trench etch and fill across the wafer, or even across the same die. This non-uniformity is generally observed more in the outer regions of the die. In accordance with an embodiment of the invention, the trenches may be extended through the scribe line area, so that the trenches across the entire wafer are etched and filled more uniformly, and thus the patterning effect may be diminished.

Figure 28:
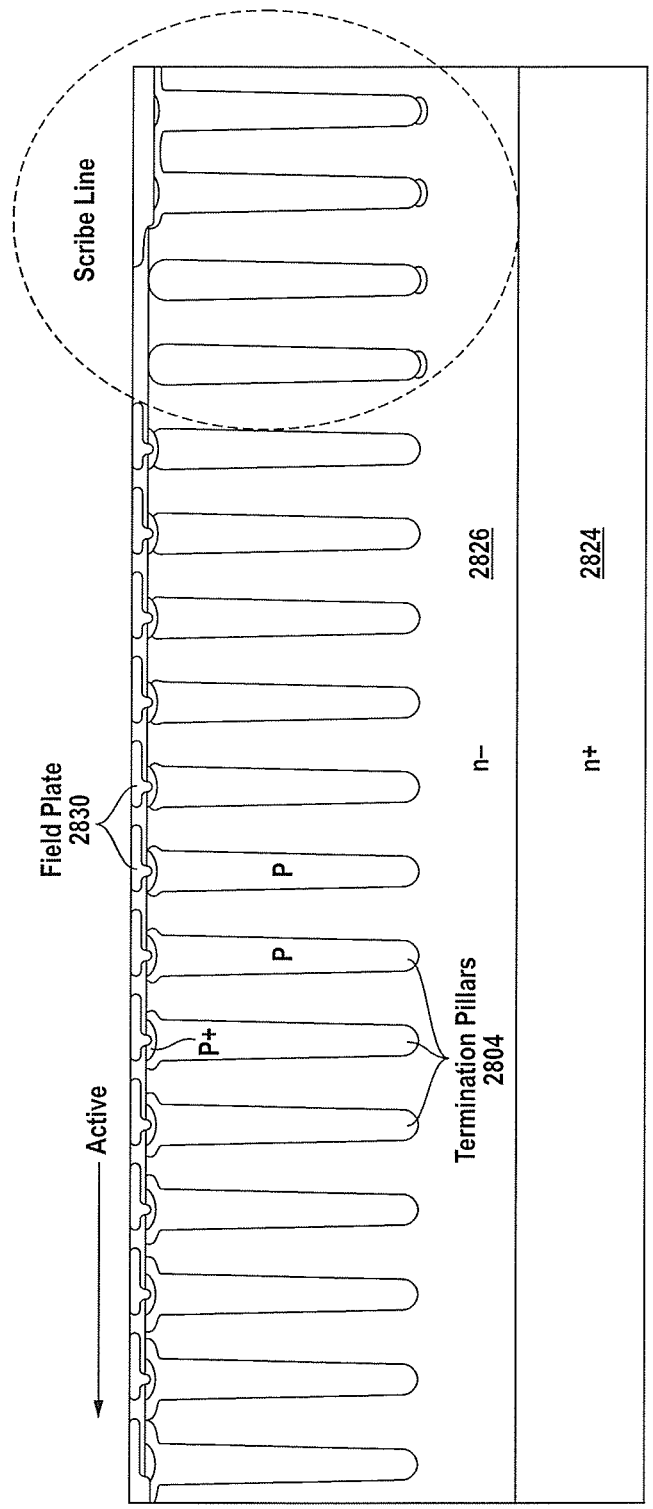
FIG. 28 is a cross section view illustrating a technique where trenches are formed in the scribe line area where usually no trenches are formed, in accordance with an embodiment of the invention.
Figure 30:
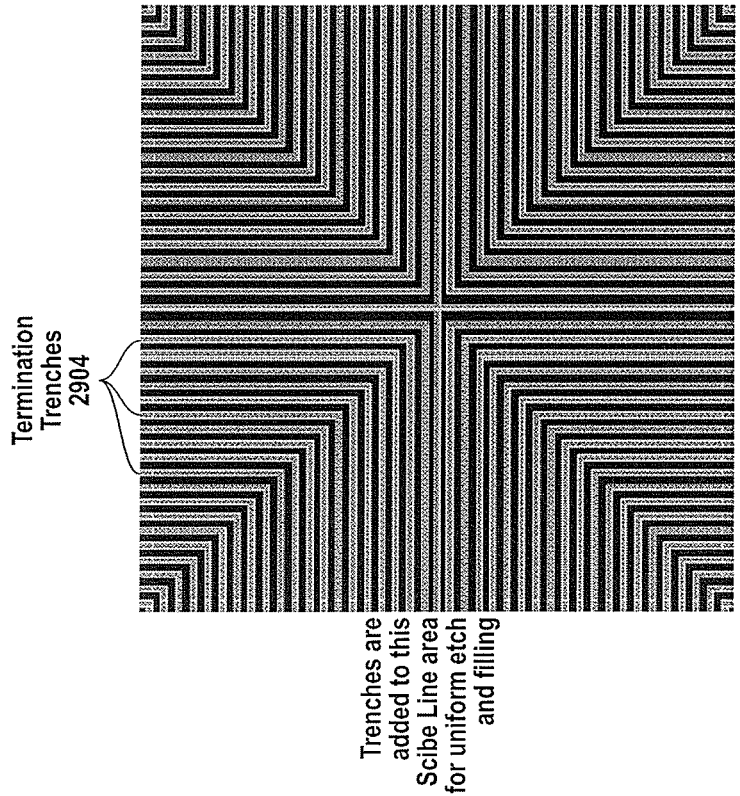
FIG. 30 is a simplified top layout view wherein additional trenches similar in pattern to the termination trenches are formed in the scribe line areas, in accordance with an embodiment of the invention.
Figure 29:
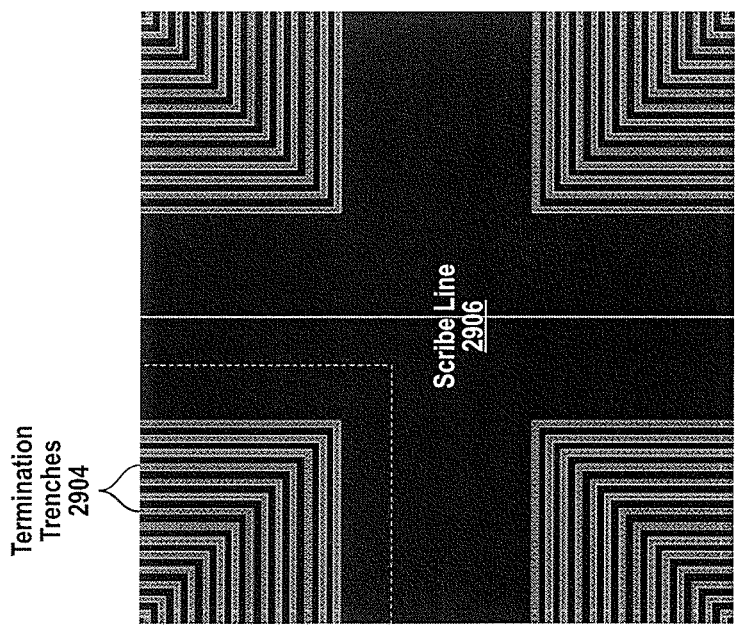
FIG. 29 is a conventional layout diagram showing no trenches extending in the scribe line areas.

As illustrated in FIG. 28, trenches 2804 may be formed in the scribe line area where trenches are usually not formed. This can more clearly be seen from a comparison of the top layout diagrams in FIGS. 29 and 30. FIG. 29 is a conventional layout diagram showing no trenches extending in scribe line areas 2906. In FIG. 30, however, termination trenches 2904 are formed in the scribe line areas. In this manner, trenches may be formed along the entire surface of a wafer thus eliminating the patterning effect.

Figure 31:
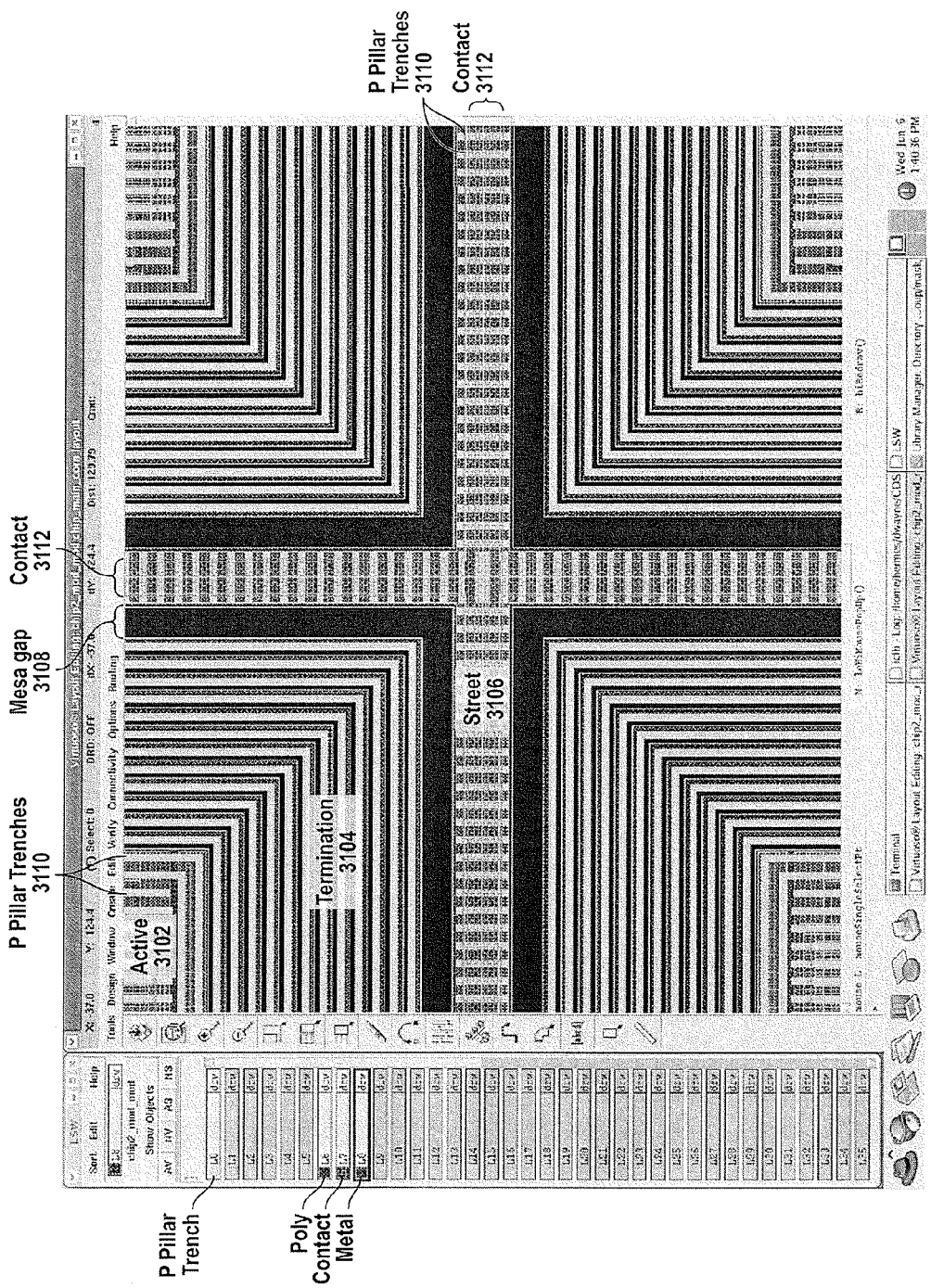
FIGS. 31 and 32 are simplified top layout views showing two variations of the concept of extending trenches in the scribe line areas, in accordance with other embodiments of the invention.
Figure 32:
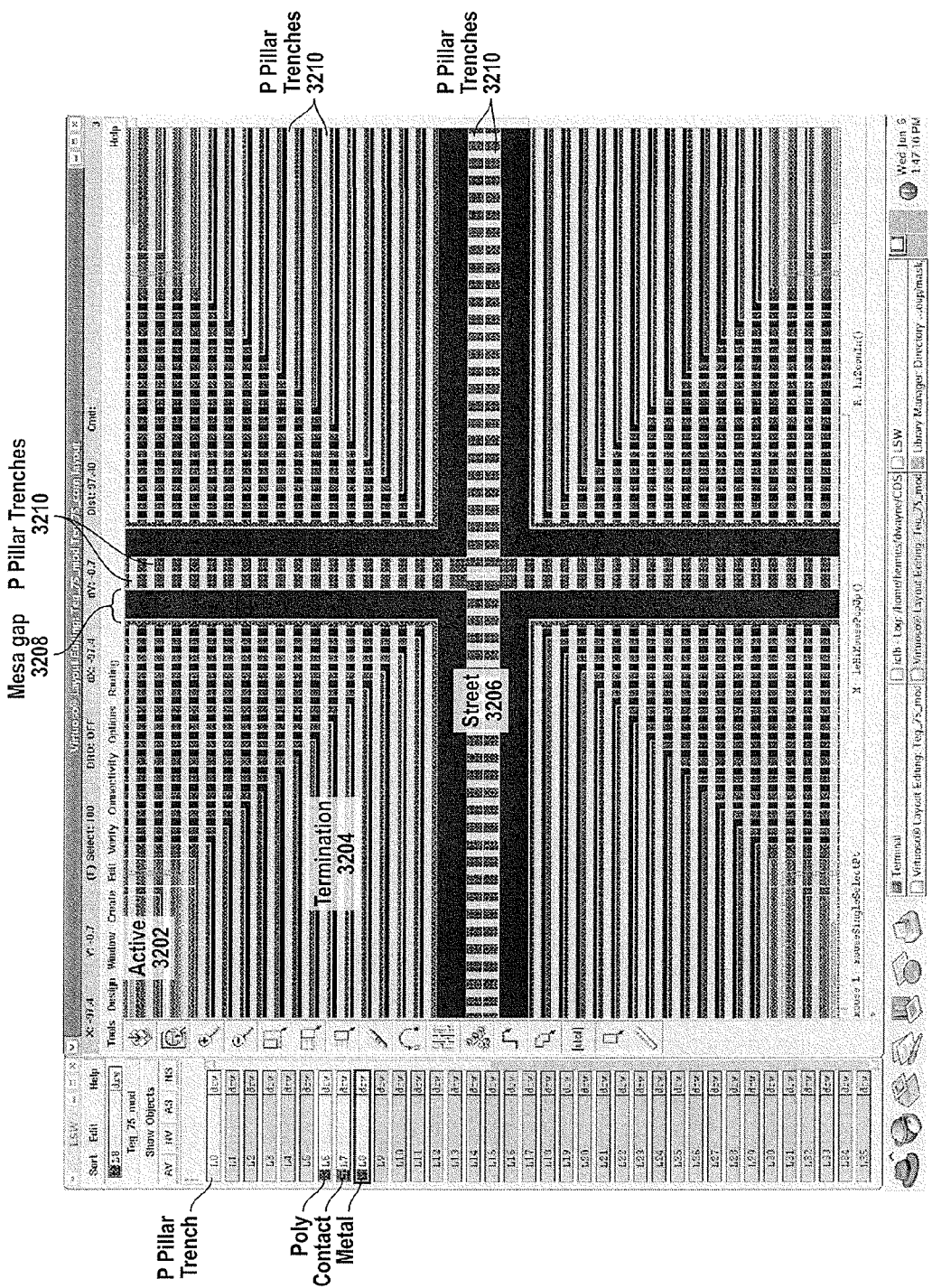

FIGS. 31 and 32 are top layout diagrams showing two variations of the concept of extending trenches in the scribe line areas. In FIG. 31, active trenches 3110 are parallel to one another, and the trenches in termination region 3104 may extend in a concentric fashion. In the scribe line areas, trenches 3110 (i.e., "scribe line trenches") may be formed which extend perpendicular to the direction that the scribe line extends. That is, scribe line trenches 3110 in the vertically extending scribe line region extend horizontally, and scribe line trenches 3110 in the horizontally extending scribe line region extend vertically, as shown. This ensures that the scribe line P-pillars and N-pillars can be shorted together by metal or diffusion and thus will not float.

Further, trenches 3110 are not formed in the entire scribe line area so that a mesa gap 3208 can be formed between scribe line trenches 3110 and the last termination trench. Mesa gap 3208 ensures that the edge of the depletion stops prior to reaching channel stopper, and that the electric field terminates in the mesa gap region. FIG. 32 shows the same scribe line trench design as FIG. 31 in combination with a parallel-parallel configuration.

As stated earlier, for charge balance designs it is desirable not to have areas were charge balance is disrupted. Gaps between pillars and pillar corners can become localized low BV locations. By designing these areas to have higher BV than the active area, parallel pillars in the BV location can be pinned to the active area thus resulting in robust UIS performance.

For trench based charge balanced devices, gaps between active area parallel pillars and concentric pillars can be formed so that charge balance is achieved at the midpoint of the final pillar depth when gaps and pillars are maintained at the same potential. If gaps and pillars are at different potentials, a gap with an N rich condition can enhance BV. To achieve active area BV in parallel-concentric designs, these gaps in both the common potential and different potential can be designed to be more N rich or less P rich with respect to the parallel active area pillar balance condition. The active parallel pillars can be designed to be slightly P rich to intentionally force BV in the active parallel pillars. Thus, the charge balance condition of the gap regions can be optimize to have a higher breakdown voltage than or at least the same as that of the active region.

Figure 33:
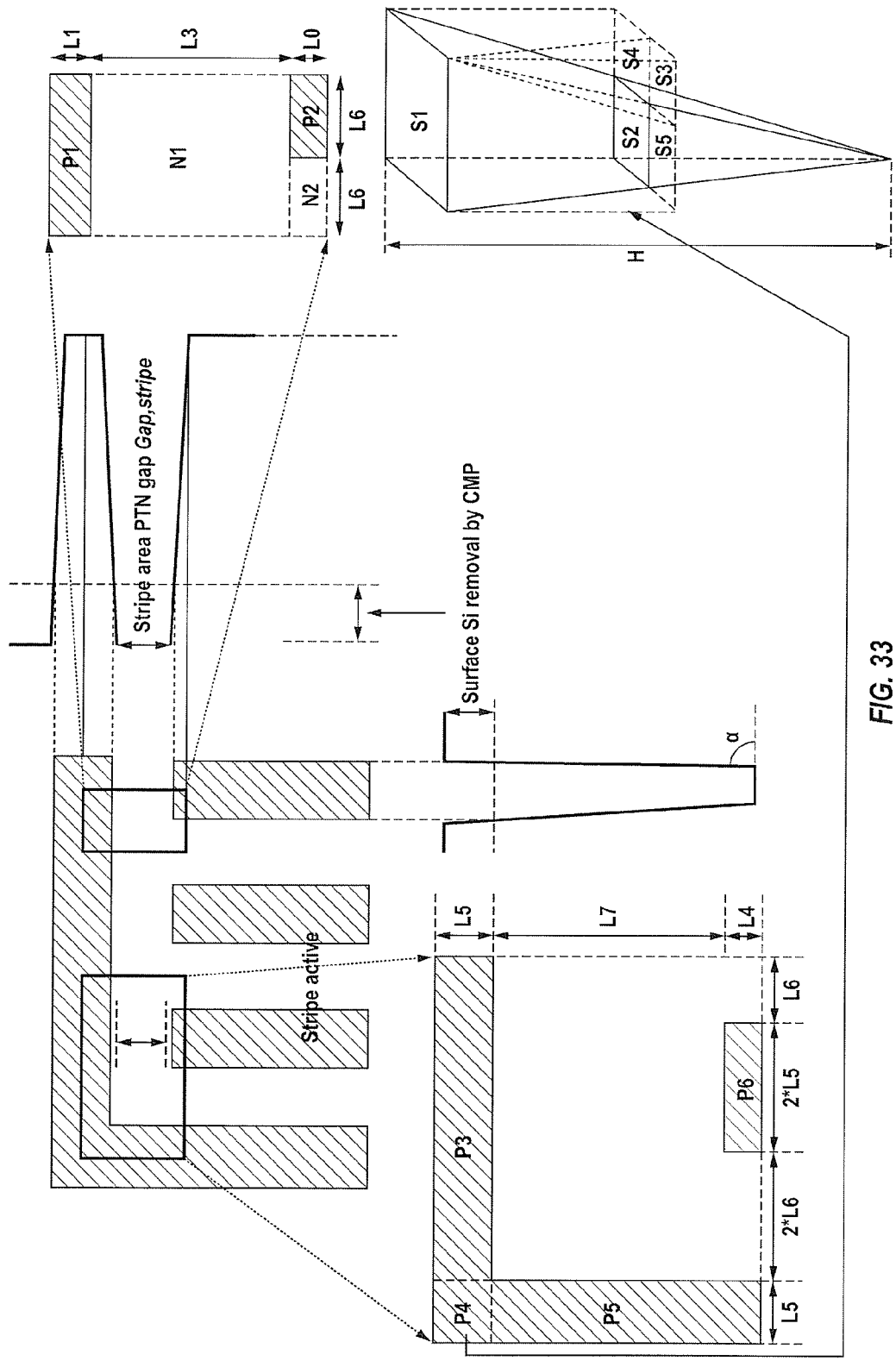
FIG. 33 is a simplified top layout view of a corner region where various gaps in the corner region are carefully designed to obtain the desired charge balance characteristics, in accordance with an embodiment of the invention, in accordance with an embodiment of the invention.

The gaps (stripe gap and corner gap marked in FIG. 33) can be designed so as to satisfy the above condition as follows.

Basic Dimensions
Pillar width (Mask PTN width): Wp [um]
Mesa width (Mask PTN width): Wn [um]
Cell Pitch: Wp+Wn=Cp
Trench Depth: Td [um]
Trench Angle: a [radian]
CMP Si removal: Rcmp [um]
Final Pillar depth: Td-Rcmp=Tp [um]
Stripe gap: Gap,stripe [um]
Corner gap: Gap,corner [um]

With these dimensions, the charge balance state of each region can be calculated and the states can be compared. Gap,stripe and Gap,corner can be adjusted to achieve a charge balance state with a higher breakdown in the stripe gap and corner gap regions than in the parallel active region. One method is to obtain a more balanced charge state in the Gap,stripe and Gap,corner and a P-rich charge state in the parallel active region.

Length and Area Calculation $$L0 = Tp/\tan\alpha$$

$$L1 = Wp - Rcmp/\tan\alpha$$

$$L2 = Cp - L1$$

$$L3 = Gap,stripe + 2*Rcmp/\tan\alpha$$

$$L4 = Tp/\tan\alpha$$

$$L5 = Wp - Rcmp/\tan\alpha$$

$$L6 = Cp - L5$$

$$L7 = Gap,corner + 2*Rcmp/\tan\alpha$$

$$H = L5*\tan\alpha$$

$$S1 = L5*L5$$

$$S2 = S1*\{(H-Tp)/H\}2$$

$$S3 = (Tp/\tan\alpha)2$$

$V2 = (1/3)*H*S1 - (1/3)*S2*(H-Tp)$ (Volume of octahedron enclosed by S1 and S2)

$V3 = (1/3)*S3*Tp$ (Volume of quadrangular pyramid–bottom area S3)

$V4 = V5 = \{(L5)2*Tp - (V2+V3)\}/2$ (Volume of quadrangular pyramid–bottom area S4 or S5)

Real Active Region area—Ap and An $$Ap = 0.5*(L1+(L1-L0))*Tp$$

$$An = 0.5*(L2+(L2+L0))*Tp$$

Stripe Gap Region Volume—Vps and Vns $$Vps = Vp1 + Vp2 = [Cp*0.5*\{L1+(L1-Tp/\tan\alpha)\}*Tp] + [(1/4)*(1/3)*\{(2*L0)*(2*L0)*(2*L1)\}*Tp]$$

$$Vns = Vn1 + Vn2 = [0.5*\{L3+(L3+2*L0)\}*Tp*Cp] + [(0.5*L0*Tp*Cp) - Vp2]$$

Corner Gap Region Volume—Vpc and Vnc $$Vpc = Vp3 + Vp4 + Vp$$
$$= [(3*L6+2*L5)*0.5*\{L5+(L5-Tp/\tan\alpha)\}*Tp+V4] + [V2] + [(L7+L4)*0.5*\{L5+(L5-Tp/\tan\alpha)\}*Tp+V5]$$

$$Vns = Vtotal - Vpc$$
$$= (L5+L4+L7)*(3*L6+3*L5)*Tp - Vpc$$

Using the above formula, six area or volumes (Ap, An, Vps, Vns, Vpc, and Vnc) can be calculated. The ratio of P/N in each region can also be calculated (Ap/An, Vps/Vns, Vpc/Vnc—area ratio Ap/An in stripe active region is the same as volume ratio).

Charge quantity ratio of the stripe gap region and corner gap region are (Na·Vps)/(Nd·Vns) and (Na·Vpc)/(Nd·Vnc), respectively.

These numbers are preferably be closer to 1 than stripe active region, (Na·Ap)/(Nd·An). In other words, $1 \geq (Na \cdot Vps)/(Nd \cdot Vns)$ and $(Na \cdot Vpc)/(Nd \cdot Vnc) \geq (Na \cdot Ap)/(Nd \cdot An)$ or $(Na \cdot Ap)/(Nd \cdot An) \leq (Na \cdot Vps)/(Nd \cdot Vns)$ and $(Na \cdot Vpc)/(Nd \cdot Vnc) \leq 1$ The Gapped stripe and Gapped corner must be determined to satisfy the above relations. If the stripe active area charge balance state is known, then the gap number only with volume ratio comparison can be determined.

Figure 34A:
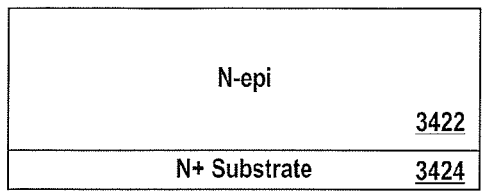
FIGS. 34A-34G are simplified cross section views at various process steps for forming the structure shown in FIG. 2 in accordance with an exemplary embodiment of the invention.
Figure 34B:
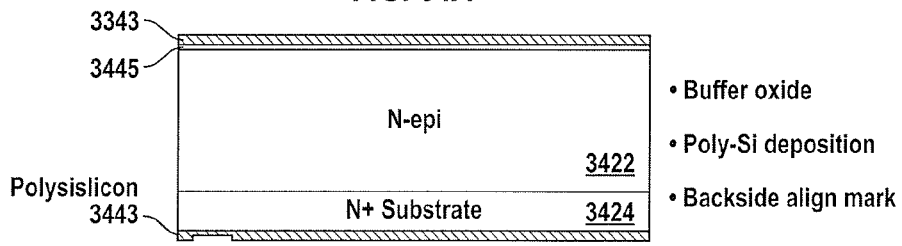

Ex) P rich stripe active, Ap/An≥Vps/Vns and Vpc/Vnc, N rich stripe active, Ap/An≤Vps/Vns and Vpc/Vnc FIGS. 34A-34G are cross section views at various process steps for forming the structure shown in FIG. 2 in accordance with an exemplary embodiment of the invention. In FIG. 34A, N-epi layer 3422 is formed over N+ substrate 3424 using known techniques, followed by a conventional backside silicon CMP. In FIG. 34B, buffer oxide layer 3445 is formed on epi layer 3422, and polysilicon layer 3443 is formed using known methods. A backside alignment mark is formed in polysilicon layer 3443 as shown, followed by polysilicon 3443 and oxide 3445 removal in FIG. 34C. A front side silicon CMP is then carried out using conventional methods.

Figure 34C:
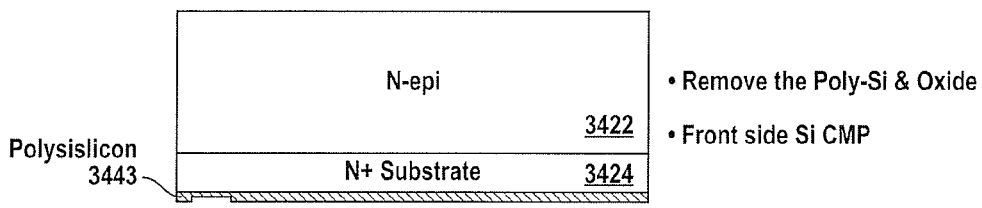
Figure 34D:
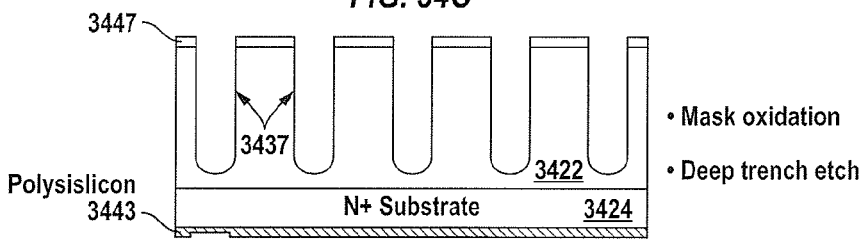
Figure 34E:
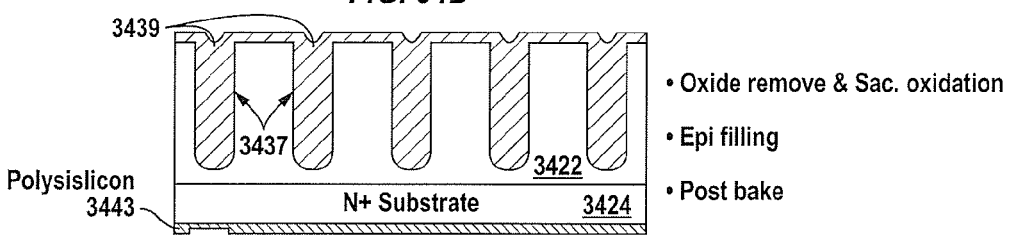
Figure 34F:
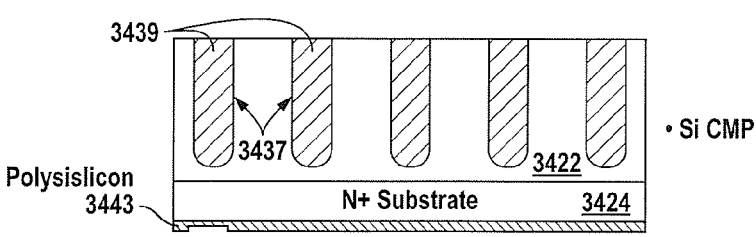
Figure 34G:
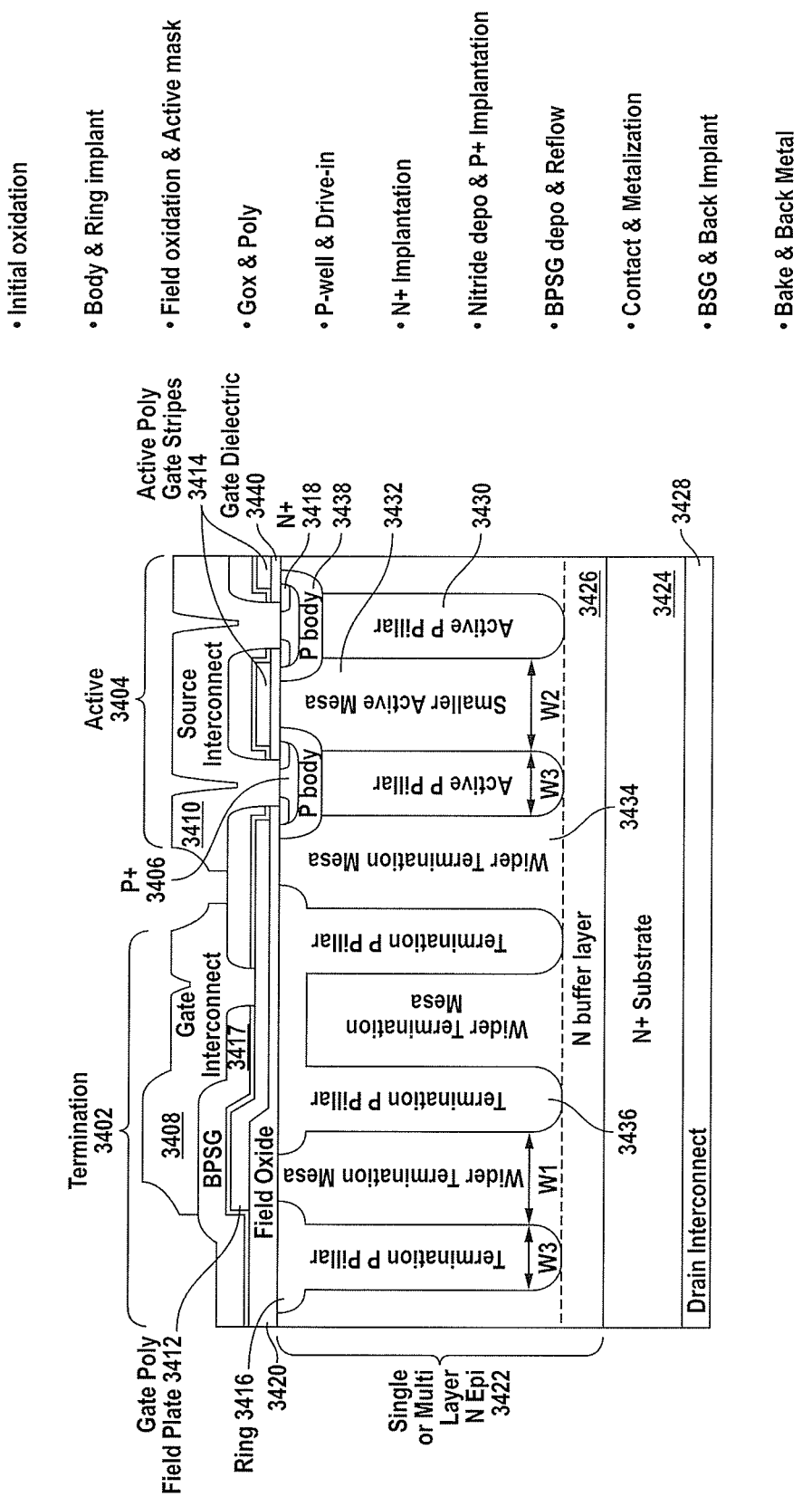

In FIG. 34D, deep trenches 3437 are formed using conventional masking and silicon etch techniques. In FIG. 34E, trenches 3437 are filled with epitaxial silicon 3439 in accordance with known methods, followed by a post bake. A silicon CMP is carried out to planarize the silicon surface in FIG. 34F. In FIG. 34G, a conventional implant is carried out to form P-ring 3420, followed by field oxidation. Next, using known techniques, gate oxide and gate polysilicon are formed, polysilicon is defined and etched, and active P-body regions 3438 are implanted and driven. A conventional source implant is carried out to form N+source regions 3418, followed by nitride deposition. A conventional heavy body implant is carried out to form P+regions 3406 in body regions 3438. Using known methods, BPSG 3417 is deposited and reflowed, contact openings are formed by etching through the BPSG, nitride, and gate oxide stack in the contact windows.

Source metal layer 3410 is formed to contact source regions 3418 and heavy body regions 3406. Further processing may be carried out to form back drain metal 3428. While the process depicted by FIGS. 34A-34C is directed to a planar gate FET, modifying this process to obtain a trench gate FET would be obvious to one skilled in the art in view of this disclosure.

When the N doping is uniform along the depth of the silicon, due to the taper of the trench which is generated as a result of trench etching, the trench width decreases with the distance from the silicon surface. Therefore, the amount of P charge along the trench decreases so that the breakdown is lowered due to the increased charge imbalance (less P and more N) in the lower portion of the trench. In accordance with embodiments of the present invention, a double-epi technique is used to offset the charge imbalance in the lower part of the trench.

Figure 35A:
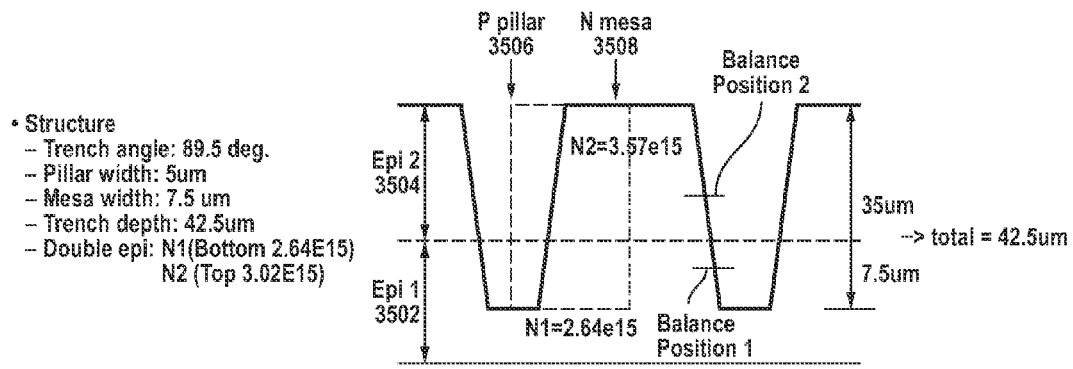
FIG. 35A is a highly simplified cross section view in accordance with an exemplary embodiment of the invention, where doping concentration of two epi layers are carefully selected taking into account the profile of the trench.

A charge balanced structure with different doping concentration for upper and lower epi layers 3504 and 3502, respectively, taking into account the trench profile, is shown in FIG. 35A. For the exemplary set of dimensions and doping concentrations listed in the figure, and given the indicated angle of the trench sidewalls, improved charge balance condition is obtained in the upper and lower epi layers 3504 and 3502, respectively, by using an epi doping concentration in upper epi layer 3504 that is greater than that of lower epi layer 3502. In one embodiment, the two epi layers are formed over a highly doped substrate (not shown). The remaining structural features of the structure can be similar to other planar gate FETs described herein.

Figure 35B:
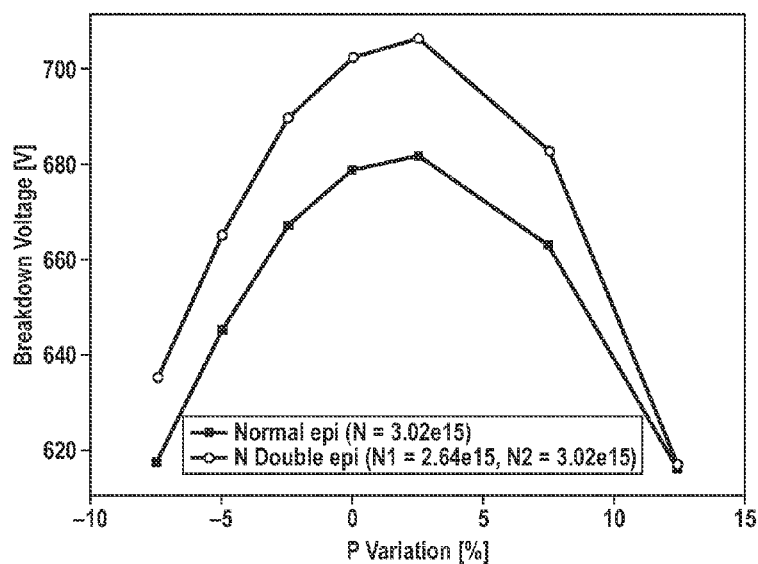
FIG. 35B is a graph comparing the breakdown voltage characteristics of a single epi design with the double epi design shown in FIG. 35A.

FIG. 35B compares the breakdown voltage characteristics of a single epi design with the double epi design shown in FIG. 35A. As can be seen a substantially higher breakdown voltage is obtained by using two epi layers with different doping concentrations.

Figure 36:
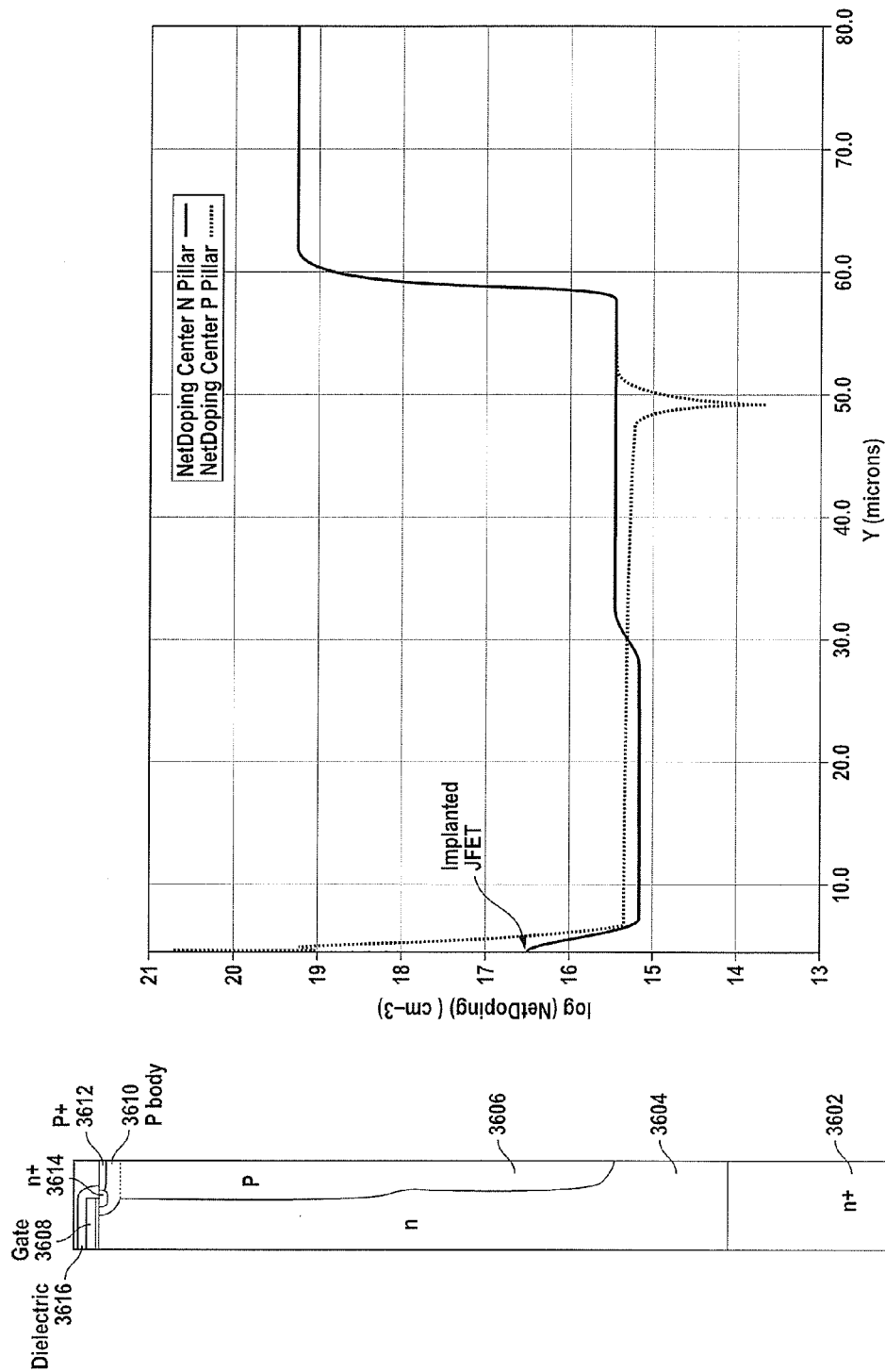
FIG. 36 shows the doping profile for a superjuction FET where a J-FET implant is used to reduce the resistance in the neck region of the superjunction FET.

More than two epi layers may be used to more accurately set the charge balance to the desired condition. If the upper epi layer(s) is(are) made to have a higher resistivity to induce a P-rich condition, a JFET implant (N dopants) or epi JFET can be implemented to reduce the resistance of the MOSFET neck region between adjacent well regions. FIG. 36 shows the doping profile for such a device. With this technique, a narrower N-pillar at top and wider N-pillar at bottom can be obtained with a favorable Rdson.

Note that a P-epi filled trench with less than 90 degree sidewalls provides the charge balance conditions of Qp>Qn at the top of the pillar and Qp<Qn at the bottom, which is favorable for UIS purposes. This condition is also favorable for Rdson and for softer reverse recovery performance of the body diode due to incomplete or less depletion at the bottom. In one embodiment, this condition is obtained by forming a graded (or step) N epi profile with lower doping at bottom. In another embodiment, the trench is filled using a graded SEG epi growth with an increasing P doping profile.

In the trench super-junction process, alignment marks are necessary to ensure that the deep trenches are properly aligned to the various layers and regions formed after the trench etch. However, after filling the trench with epi, a planarization step is necessary to form a smooth and planar top surface. If the alignment mark is formed on the front side of the wafer, it would be removed during the planarization process. In accordance with an exemplary embodiment of the invention, a technique can be used whereby alignment marks are formed on the back side of the wafer prior to forming the trenches, and the alignment marks are transferred to the top side after the planarization of the top surface is complete. One implementation of this technique is shown in the process sequence provided in FIG. 37.

Figure 37:
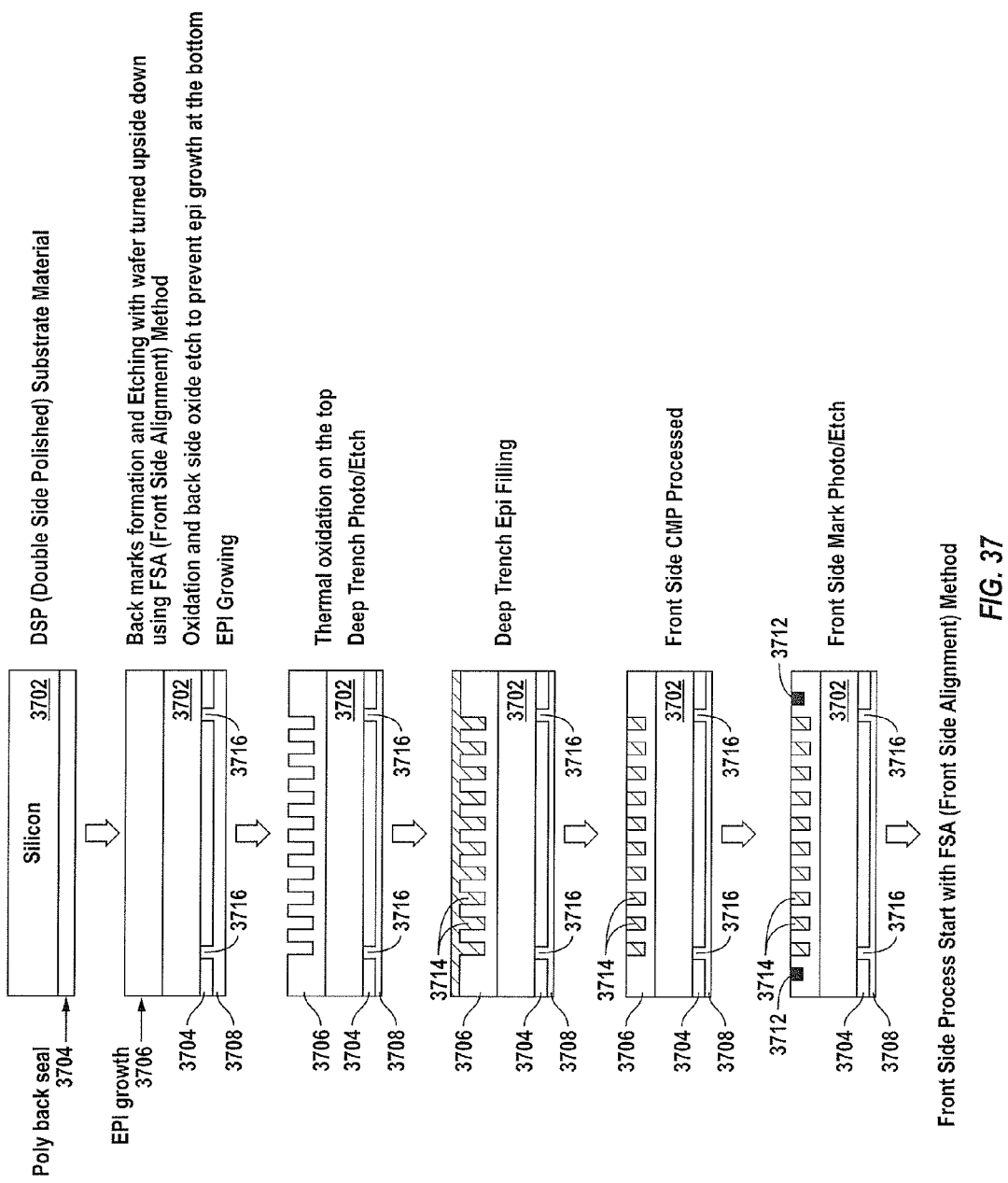
FIG. 37 shows simplified cross section views at various steps a process illustrating a technique whereby alignment marks are formed on the back side of the wafer prior to forming the trenches, and the alignment marks are then transferred to the top side after the planarization of the top surface is complete, in accordance with an embodiment of the invention.

In FIG. 37, silicon substrate 3702 with polysilicon back seal 3704 is provided. Alignment marks 3716 are formed in backside polysilicon 3704 using known techniques. Oxide 3708 is formed on the backside over polysilicon 3704 using known methods, and a conventional epi deposition process is used to form epi layer 3706 on the top side. An oxide may be formed over epi layer 3706 using known techniques, and deep trenches 3710 are formed in epi layer 3706 using conventional photolithography and etch processes. Trenches 3710 are then filled with epi material 3714 using known techniques. A conventional CMP of the front side is carried out to planarize the surface along the top side. Next, backside alignment marks 3710 are transferred to the front side, as depicted by top side alignment marks 3712. Similar process steps to those described in connection with FIGS. 34A-34C may be used to form the remaining layers and regions of the device.

Figure 38:
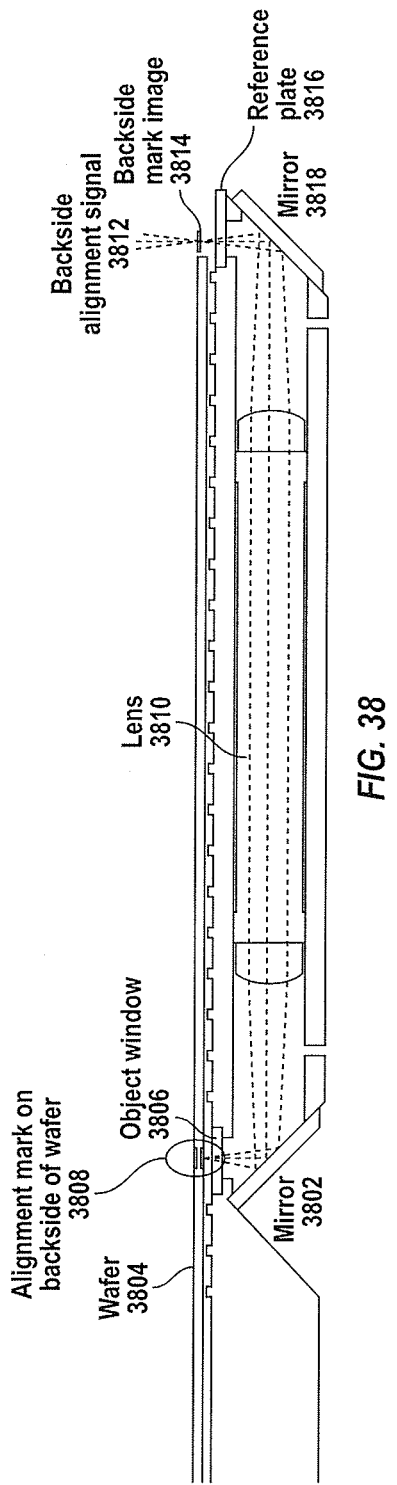
FIG. 38 shows a simplified view of an equipment used in the FIG. 37 process for transferring an alignment mark from back side to front side of the wafer, in accordance with an embodiment of the invention.

FIG. 38 shows a simplified view of the equipment used in transferring the alignment marks from backside to front side of the wafer. As shown, left mirror 3802 projects an image of backside alignment mark 3808 on to right mirror 3818 through lens 3810, and right mirror 3818 in turn makes image 3814 of backside alignment mark 3808 available along the topside of wafer 3804. With the relative positions of backside alignment mark 3808 and its projected image 3814 known, alignment marks can be formed on the top side in alignment with the backside marks.

Figure 39A:
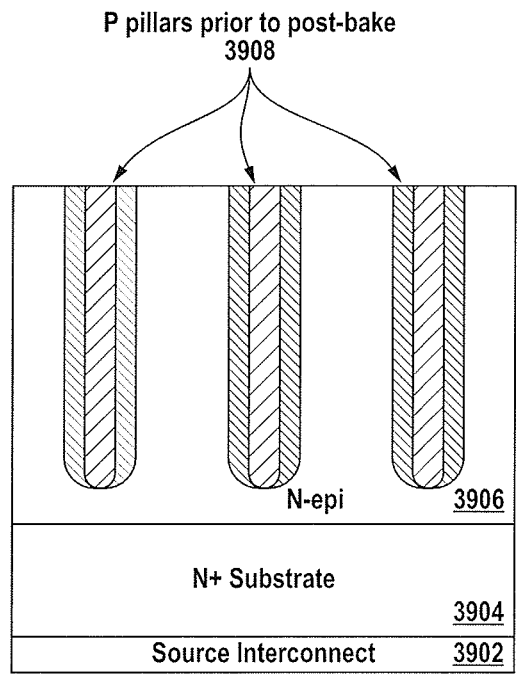
FIGS. 39A and 39B are simplified cross section views illustrating a process whereby a post bake process is carried out after filling the trenches with epi to provide a more solid fill status and crystallization of P-pillars by silicon migration, in accordance with an embodiment of the invention.
Figure 39B:
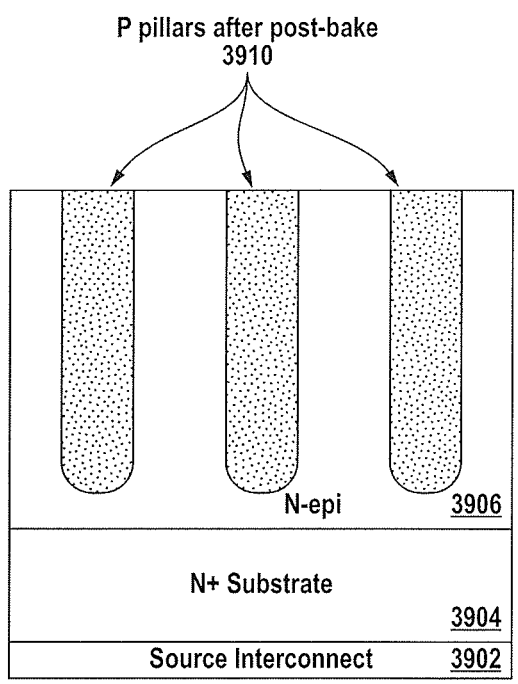

In the deep trench etch and fill process, crystal defects in the P-pillars may become sources of leakage. In accordance with an embodiment of the invention, a post bake process can be carried out after filling the trenches with epi to provide a more solid fill and crystallization of P-pillars by silicon migration. FIGS. 39A and 39B are cross section views of these process steps. In FIG. 39A, the trenches are filled with P-type epi material 3908 using known techniques. However, as illustrated the center portion of epi fill 3908 has crystal defects which if untreated could lead to leakage current. In FIG. 39B a post bake step is carried out resulting in silicon migration whereby a more solid epi fill 3910 is obtained.

In one embodiment, the post-bake step may be carried out at a temperature in the range of 1150 to 1250° C., for a period of time in the range of about 30 to 150 minutes in an inert ambient such as N2, AR, or H2. In one specific embodiment, good results were obtained when the post-bake was carried out at a temperature of 1200° C. for 60 minutes in N2 gas. In another embodiment, the post bake process may be carried out prior to forming the body and source regions so that the high temperature and duration of the post bake does not adversely impact the source and body regions.

A challenge in filling trenches having a high aspect ratio is avoiding formation of voids in the trench or preventing premature epi closure along the top of the trench due to localized growth along the top corners of the trench. Voids and seams in the P-pillars may cause leakage. In accordance with an embodiment of the invention, a seam-less and void-less epi fill may be obtained by rotating the wafer so that it is off-axis instead of on-axis during the photo step used to define the trenches. In one embodiment, a wafer rotation of 45 degrees is used. In an alternate embodiment a rotated starting wafer is used. In addition to eliminating the seams and voids, the wafer rotation helps increase epi growth rate. In one embodiment, a rotated substrate is used. FIG. 40 illustrates a 45 degrees rotation of wafer 4002 relative to its flat 4004. FIG. 41A shows silicon results for the case where no wafer rotation was used. Voids 4102 at the center of the pillars can be observed. FIG. 41B shows silicon results for the case where wafer rotation was used. No voids or seams can be seen in the trenches.

Figure 42A:
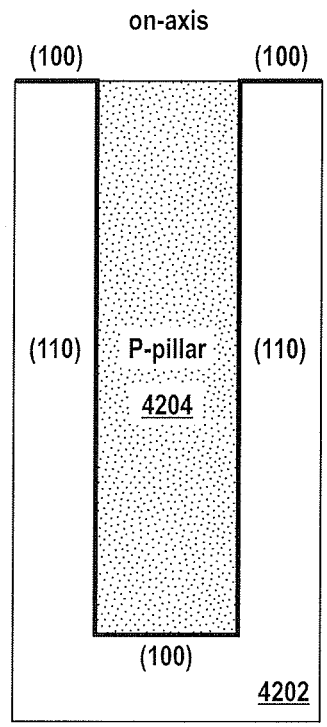
FIGS. 42A and 42B illustrate the crystal orientation for the on-axis and off-axis wafer scenarios, respectively.
Figure 42B:
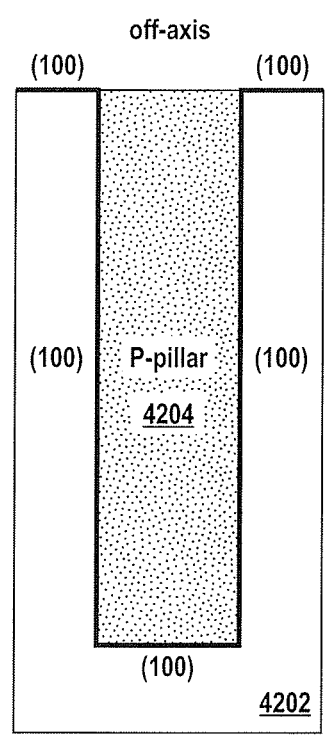

FIGS. 42A and 42B illustrate the crystal orientation for the on-axis and off-axis wafer scenarios. In the on-axis scenario (i.e., non-rotated wafer), the crystal orientation along the trench sidewalls is different than along the trench bottom surface and the mesa surfaces. The mismatch in crystal orientations can result in non-uniform growth of silicon 4204 in the trench. In contrast, in the off-axis scenario (i.e., rotated wafer), the crystal orientation is matched along the vertical and horizontal surfaces. This results in a uniform epi growth rate in all directions and thus a much better filling profile of P-pillars 4204 than in the case of an on-axis wafer.

In conventional trench epi filling processes where trenches have a high aspect ratio, during epi growth, the epi layer along the upper trench sidewalls and the upper corners grow at a faster rate than along the lower trench sidewalls due to a gas transport phenomena in filling high aspect ratio trenches. In accordance with an embodiment of the invention, a multi step epi filling and etching process can be used to uniformly fill deep trenches with epi material in a uniform manner.

Figure 43:
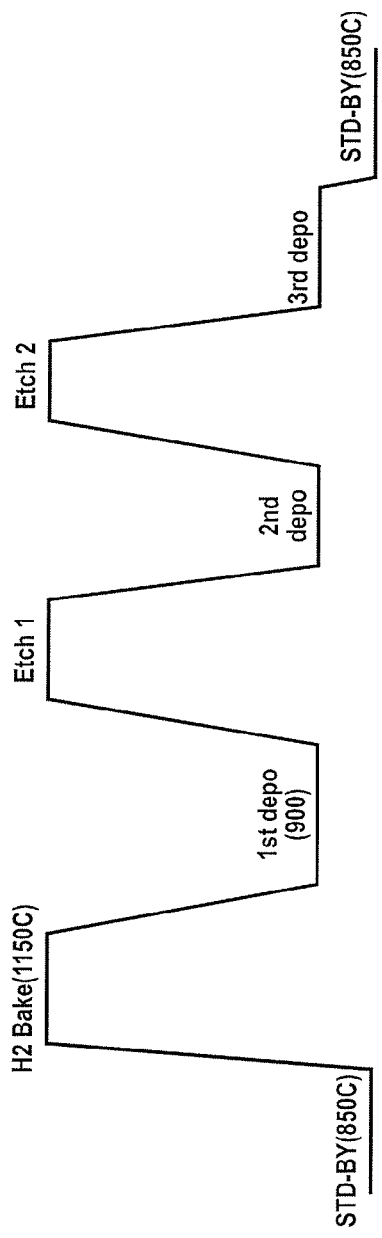
FIG. 43 shows a series of SEM images illustrating a exemplary multi-epi process in accordance with an embodiment of the invention.
Figure 43:
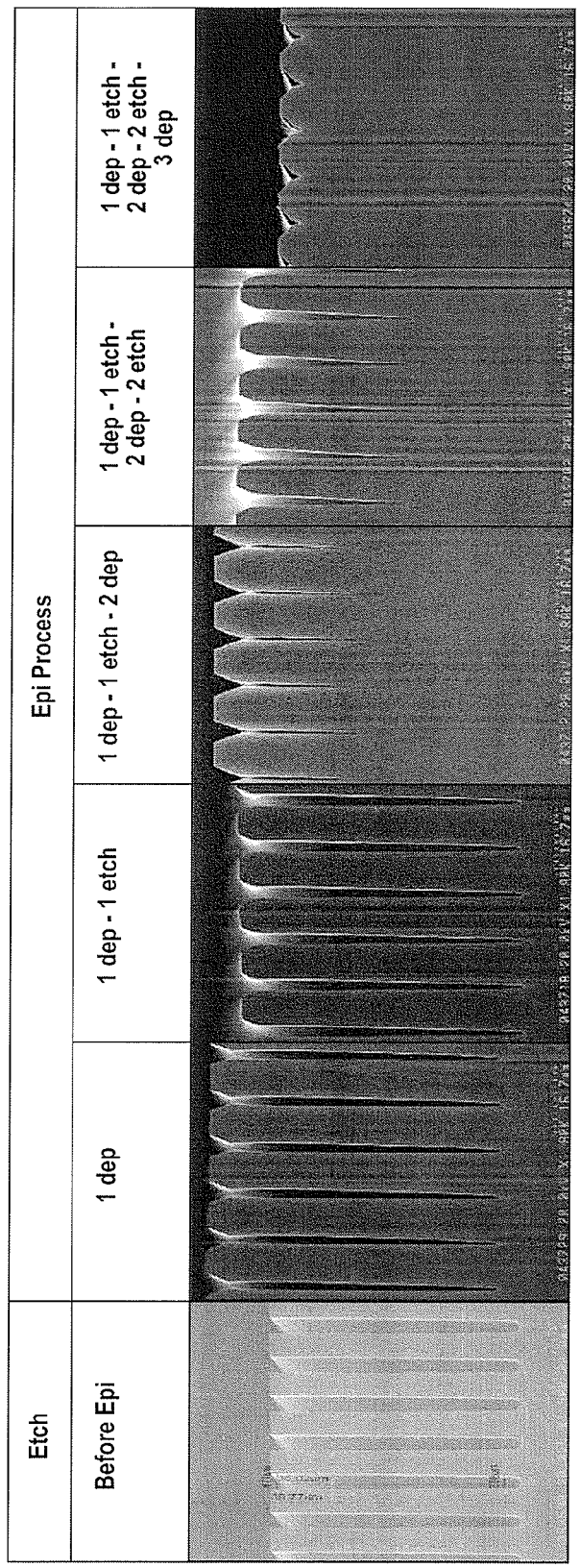

FIG. 43 shows an exemplary trench filling process using multi-epi deposition and etch steps in accordance with an embodiment of the invention. In FIG. 43, the left-most SEM image shows the trenches right after trench etch. The next SEM image to the right shows the trenches after carrying out a first conventional epi deposition process. As can be seen, the epi grows thicker along the upper trench sidewalls and upper trench corners. However, in the next step an epi etch process is carried out whereby a greater amount of the deposited epi along the upper trench sidewalls and corners is removed than other regions of the deposited epi. After the first etch, a second step of epi growth is carried out followed by a second etch step. A third epi deposition is carried out, and as the SEM image on the far right shows, the trenches are completely filled with epi without formation of voids or seams therein. The time line above the SEM images shows the deposition and etch sequences and the corresponding temperatures.

Figure 44A:
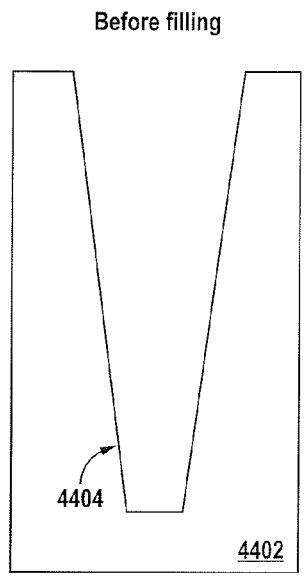
FIGS. 44A-44F are simplified cross section views more clearly illustrating the multi-epi process depicted in FIG. 43, in accordance with an embodiment of the invention.
Figure 44B:
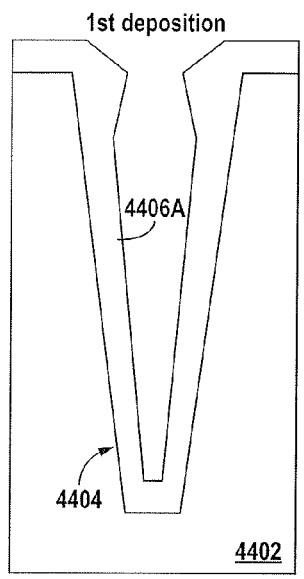
Figure 44C:
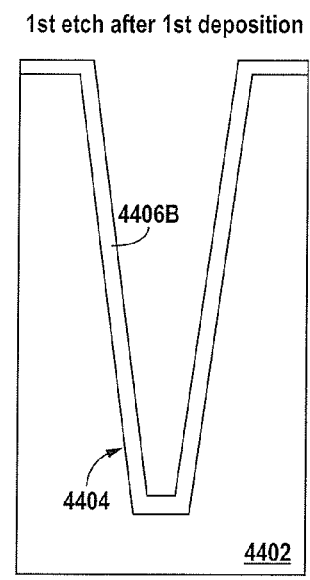
Figure 44D:
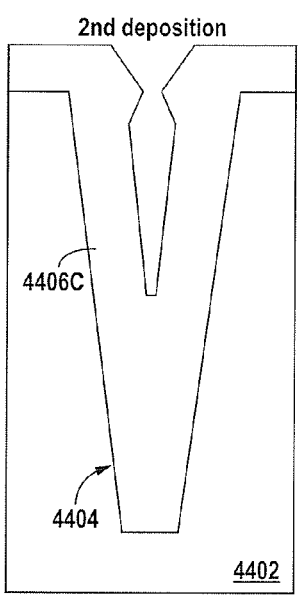
Figure 44E:
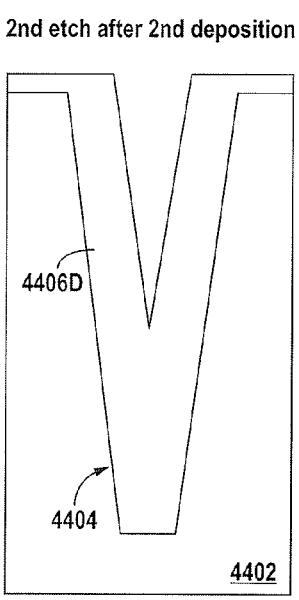
Figure 44F:
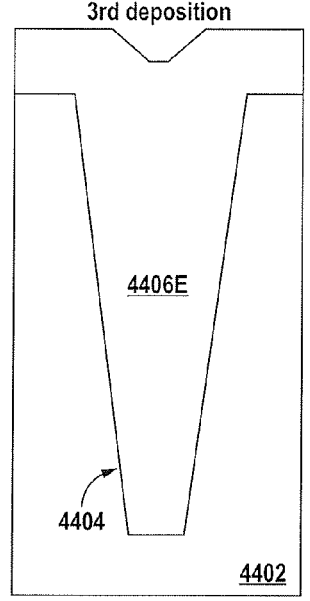

This process sequence is more clearly illustrated in FIGS. 44A-44F. FIG. 44A shows trench 4404 prior to start of the multi-step epi process. In FIG. 44B a first epi deposition is carried out whereby epi 4406A grows in a non-uniform manner. The epi etch carried out in step 44C removes portions of the deposited epi such that the remaining epi 4406B has a relatively uniform thickness. In FIGS. 44D and 44E, a second epi deposition and a second epi etch is carried out such that after the second epi etch the remaining layer of epi 4406D has a relatively uniform thickness. In FIG. 44F a final epi deposition is carried out to fully fill trench 4404. More than 2 or 3 deposition-etch sequences may be used depending on the trench aspect ratio and other process considerations.

Note that the etch steps may be carried out using HCl, which can remove the thicker portion of the epi layer at the trench corners at a faster rate than the other portions of the epi layer. Accordingly, a defect-less, void-less, and highly controllable doping concentration can be obtained in the trench epi fill.

Repeated exposure of trench sidewalls to in-situ HCl etches during a deposition-etch-deposition trench filling process can cause damage to the silicon crystal. If the crystal is not "repaired" or "healed" prior to a deposition step, defects may form at the interface and in the epi layer that is grown. In accordance with an embodiment of the invention, high temperature annealing in a hydrogen ambient at the end of an HCl etch cycle (prior to the next deposition step) will reduce or eliminate the occurrence of these defects thus reducing the leakage current.

Figure 45C:
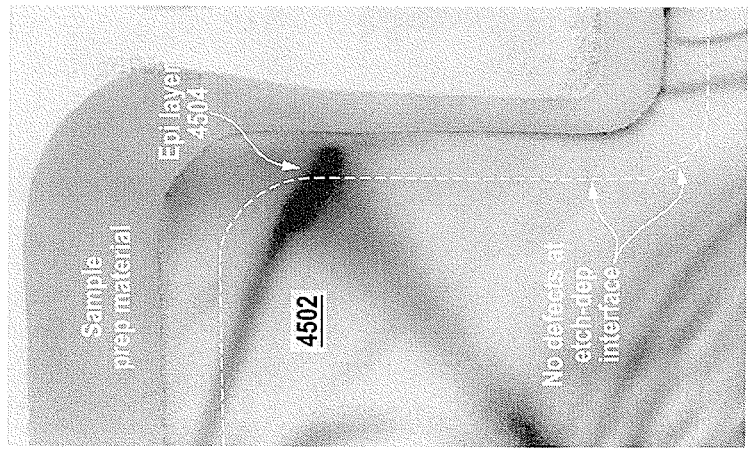
FIGS. 45A-45C are SEM images illustrating a technique for eliminating lattice damage and rounding trench corners, in accordance with an embodiment of the invention.
Figure 45B:
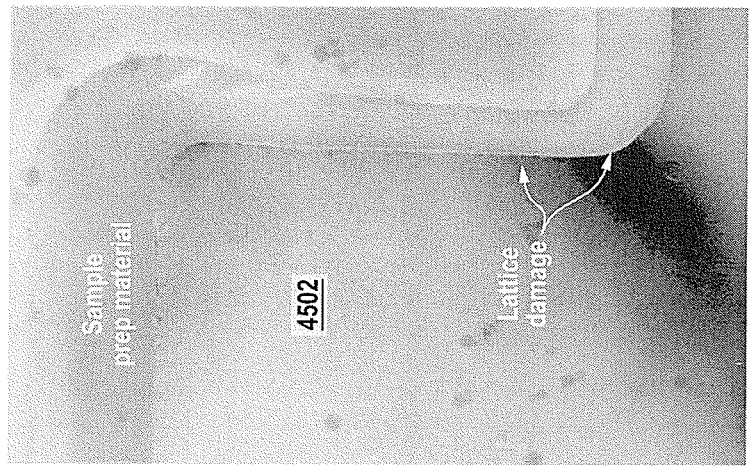
Figure 45A:
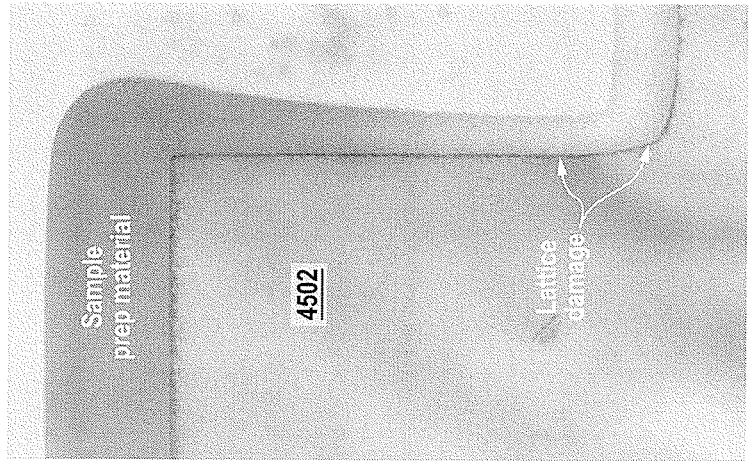

FIG. 45A shows a TEM image of a trench right after the trench etch. Lattice damage along the trench sidewalls can be seen. FIG. 45B shows the trench sidewall surface after performing a high temperature anneal in hydrogen ambient. As can be seen, the lattice damage is healed and the trench corner is rounded. FIG. 45C is a TEM image after growing epi layer 4504 along the trench sidewalls and bottom. The interface between the trench sidewalls and epi 4504 is shown by the dashed line. Once again, no defects are observed at the interface between the trench sidewalls and newly grown epi layer 4504. The deposition and etch cycles may be repeated with intermediate anneal steps so as to remove defects from along the surface of each epi layer after etching the epi layer. All other regions and layers of a power FET can be formed using any one of the techniques described herein.

A technique in accordance with an embodiment of the invention that is highly effective in avoiding creation of voids in the center of the trench or preventing premature epi closure at the top trench corners is ramping the HCl flow throughout the deposition step. Ramping of the HCl flow can inhibits excessive silicon growth at the top of the trench and allows for uniform growth from top to bottom of the trench. This can reduce the number of epi deposition and etch steps necessary to uniformly fill the trench.

Utilizing capabilities of available tools, HCl gas can be ramped from a small flow (e.g., 10 cc) during the initial trench filling when high growth rates are desirable, to a high flow (900 cc) at the final closing of the trench when epi growth at the top trench corners is suppressed in order to avoid pinch-off and creations of voids in the center of the trench.

Figure 46A:
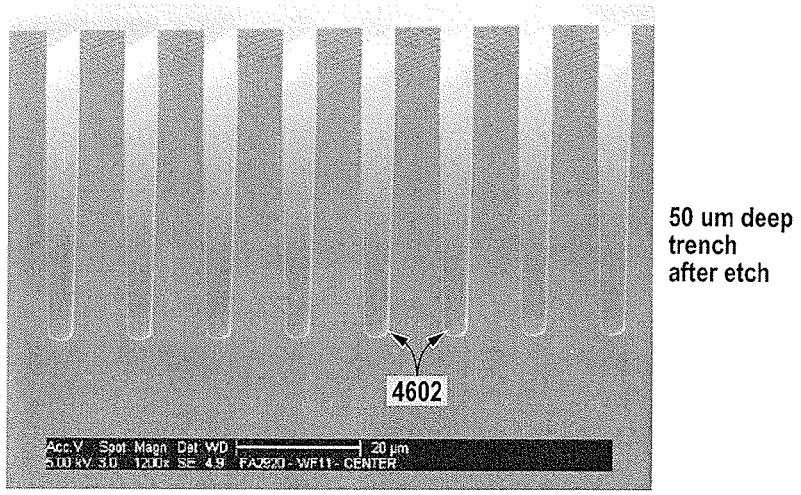
FIGS. 46A-46C are SEM images illustrating a technique for avoiding formation of voids in the center of trenches, and for preventing premature epi closure at the top trench corners, in accordance with an embodiment off the invention.
Figure 46B:
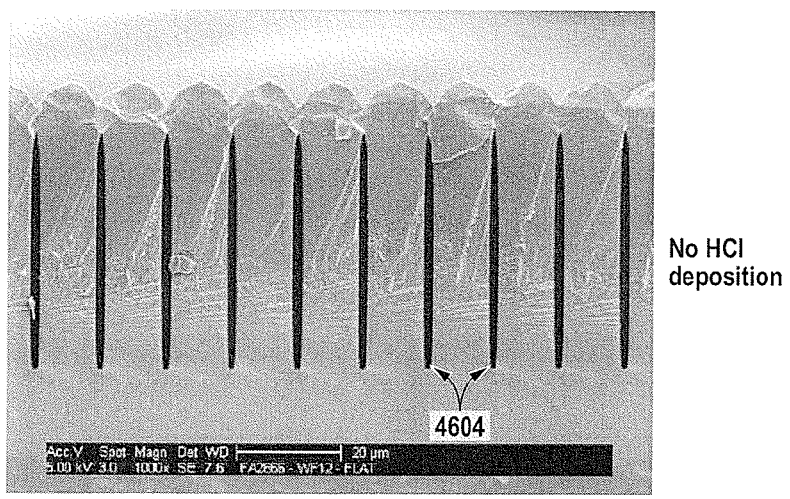
Figure 46C:
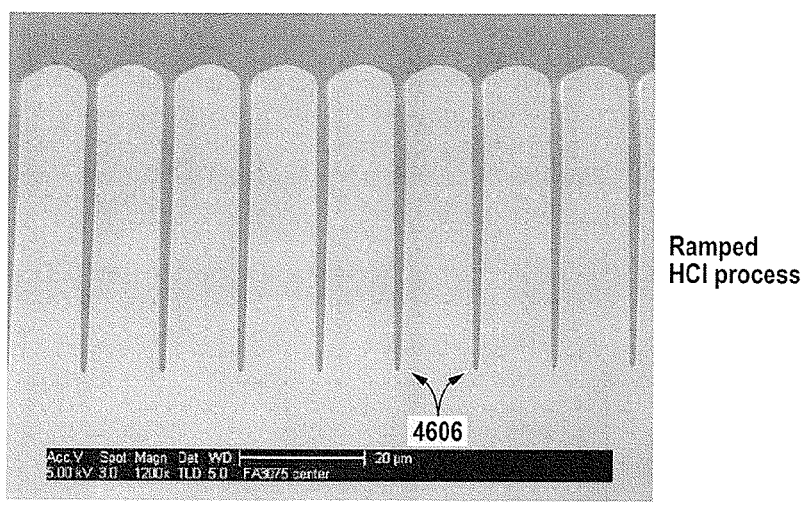

FIG. 46A is a SEM image right after etching 50 um trenches 4602. FIG. 46B shows a SEM of trenches 4604 after carrying out a non-HCl epi deposition step. As can bee seen, the epi fill closes near the top of trenches 4604 thus forming a void in each trench. In contrast, as shown in FIG. 46C, when the deposition process is carried out using ramped HCl flow, a layer of epi uniformly lines the trench sidewalls without closing at the top of trenches 4604.

Figure 47:
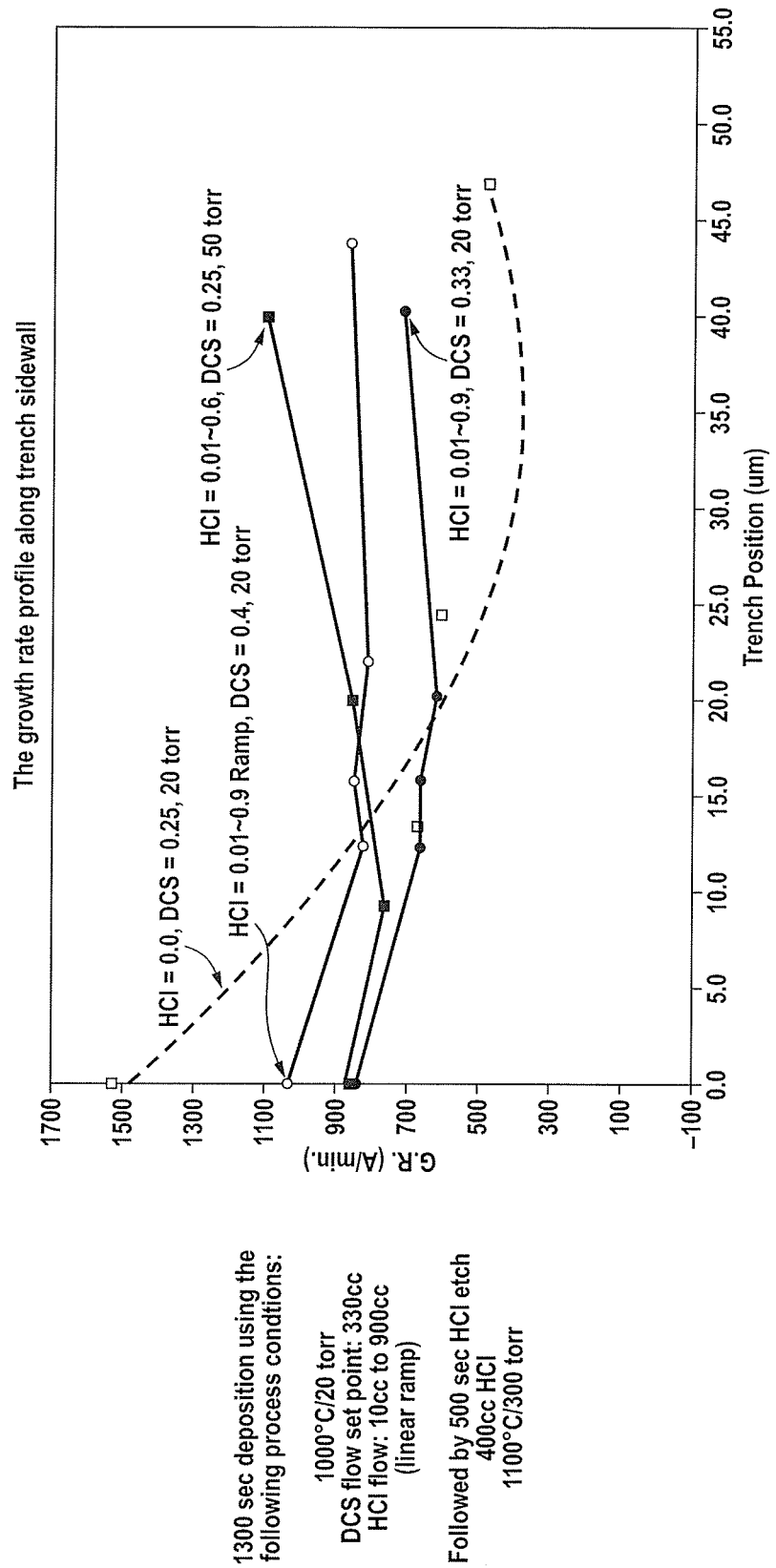
FIG. 47 is graph showing silicon growth rate versus trench position for various HCl flow rates as well as the case where no HCl is used during epi deposition.

FIG. 47 is graph showing silicon growth rate versus trench position for various HCl flow rates as well as the case where no HCl is used during epi deposition. The dashed curve corresponds to the case where no HCl is used. All other curves correspond to various HCl flow rates and other process parameters as indicated in the graph. As can be seen from the dashed curve, without HCl, there can be a wide variation in epi growth rate between the top and bottom of the trench. In contrast, all the other cases in which a ramped HCl is used, the epi growth rate does not change along the trench depth as widely as does the case where no HCl is used. To the left of the graph, numerical values are provided for different parameters in an epi deposition process which has been found to yield a substantially uniform epi growth along the depth of the trench. The invention is not limited to these numerical values; different process technologies may require values different than those listed next to FIG. 47 in order to achieve uniform epi deposition.

While the above provides a complete description of specific embodiments of the present invention, various modifications, alternatives and equivalents are possible. For example, while some embodiments of the invention are illustrated in the context of planar gate MOSFETs, the same techniques could easily be applied to other planar-gate structures such as planar gate IGBTs by merely reversing the polarity of the substrate from those shown in the figures.

Similarly, some of the structures and process sequences are described in the context of N-channel FETs, however, modifying these structures and process sequences to form P-channel FETs would be obvious to one skilled in the art in view of this disclosure. Further, the various techniques disclosed herein are not limited to planar gate structures and may be implemented in trench gate MOSFETs, trench gate IGBTs (which have trench gates), shielded gate MOSFETs or IGBTs (which have trenched gates with underlying shield electrode(s)), and rectifiers (including schottky rectifiers, TMBS rectifiers, etc.).

Additionally, while not specifically called out for each embodiment, the various embodiments including many of the termination designs and charge balance techniques may be implemented in any of the three layout configurations shown in FIGS. 1A-1C. Similarly, many of the embodiments disclosed herein including many of the termination designs and charge balance techniques are not limited in implementation to the trench epi fill charge balance process technology, and may also be implemented in the multi-epi layer pillar process technology. For this and other reasons, therefore, the above description should not be taken as limiting the scope of the invention, which is defined by the appended claims.

What is claimed is:

1. A power device, comprising:
    an active region having a plurality of pillars of a first conductivity type alternately arranged with a plurality of pillars of a second conductivity type, the plurality of pillars of the second conductivity type in the active region each having substantially the same width;
    a termination region surrounding at least a portion of the active region and having a plurality of pillars of the first conductivity type alternately arranged with a plurality of pillars of the second conductivity type, the plurality of pillars of the second conductivity type in the active region each having substantially the same width and being smaller than each width of the pillars of the second conductivity type in the termination region; and
    a transition region disposed between the active region and the termination region, the transition region having a plurality of pillars of the first conductivity type alternately arranged with a plurality of pillars of the second conductivity type, the plurality of pillars of the second conductivity type in the transition region each having a width greater than each width of the pillars of the second conductivity type in the termination region, the plurality of pillars of the second conductivity type in the termination region each having substantially the same width.

2. The power device of claim 1, wherein the transition region includes an isolation diffusion electrically coupling at least two of the pillars of the first conductivity type in the transition region to at least one of the pillars of the first conductivity type in the active region,
    at least one of the plurality of pillars of the first conductivity type in the termination region has a top portion including a diffusion ring shallower than the isolation diffusion.

3. The power device of claim 1, wherein the active region includes a trench gate structure extending to a predetermined depth within at least one of the plurality of pillars of the second conductivity type in the active region.

4. The power device of claim 1, wherein the plurality of pillars of the second conductivity type in the termination region and the plurality of pillars of the second conductivity type in the active region are defined such that a charge balance condition results in a higher breakdown voltage in the termination region than in the active region.

5. The power device of claim 1, wherein each pillar from the plurality of pillars of the first conductivity type in the active region is stripe-shaped, and each pillar from the plurality of pillars of the first conductivity type in the termination region surrounds the active region in a concentric fashion.

6. The power device of claim 1, further comprising:
    an imbalance area at a bottom portion of at least one of the plurality of pillars of the first conductivity type in the active region, the imbalance area extending to a depth below a depth of the at least one of the plurality of pillars of the first conductivity type.

7. The power device of claim 1, wherein the plurality of pillars of the first conductivity type in the active region have substantially the same doping profile as the plurality of pillars of the first conductivity type in the termination region.

8. The power device of claim 1, wherein at least one of the plurality of pillars of the first conductivity type has a bottom portion disposed in a first epitaxial layer and disposed above a second epitaxial layer,
    the power device further comprising:
    an imbalance area at the bottom portion of the at least one of the plurality of pillars of the first conductivity type.

9. The power device of claim 8, wherein the imbalance area extends to a depth below a depth of the at least one of the plurality of pillars of the first conductivity type.

10. The power device of claim 8, wherein the imbalance area has a width greater than a width of the at least one of the plurality of pillars of the first conductivity type.

11. The power device of claim 1, wherein at least one of the plurality of pillars of the first conductivity type has a first portion disposed in a first epitaxial layer and a second portion disposed in a second epitaxial layer,
    the power device further comprising:
    an imbalance area at a bottom portion of the at least one of the plurality of pillars of the first conductivity type.

12. The power device of claim 11, wherein the imbalance area is of the second conductivity type.

13. The power device of claim 1, wherein at least one of the plurality of pillars of the first conductivity type in the termination region has a top portion including a diffusion ring shallower than a P-well included in the active region.

14. The power device of claim 1, further comprising:
    a diffusion ring coupled to a top portion of each of two of the plurality of pillars of the first conductivity type in the termination region; and
    a P-well included in the active region and associated with a planar gate structure, the diffusion ring being shallower than the P-well.

15. A power device, comprising:
    an active region having a plurality of pillars of a first conductivity type alternately arranged with a plurality of pillars of a second conductivity type, the plurality of pillars of the first conductivity type in the active region each having substantially the same width;
    a termination region surrounding at least a portion of the active region and having a plurality of pillars of the first conductivity type alternately arranged with a plurality of pillars of the second conductivity type, each of the plurality of pillars of the second conductivity type in the termination region having the same width, at least a portion of the plurality of pillars of the second conductivity type in the active region each having a width less than each of the widths of the plurality of pillars of the second conductivity type in the termination region; and
    a transition region disposed between the active region and the termination region, the transition region having a plurality of pillars of the first conductivity type alternately arranged with a plurality of pillars of the second conductivity type, each of the pillars of the second conductivity type in the transition region have the same width, each of the pillars of the second conductivity type in the transition region has a width greater than a width of a pillar from the plurality of pillars of the second conductivity type in the termination region.

16. The power device of claim 15, further comprising:

an imbalance area at a bottom portion of at least one of the plurality of pillars of the first conductivity type in the active region, the imbalance area extending to a depth below a depth of the at least one of the plurality of pillars of the first conductivity type, at least one of the plurality of pillars of the first conductivity type in the termination region having a top portion including a diffusion ring, the diffusion ring having a depth shallower than a depth of a P-well in an active region and shallower than a depth of an isolation region included in the transition region.

17. The power device of claim 15, further comprising:
a substrate;
a first epitaxial layer;
a second epitaxial layer, the first epitaxial layer being disposed between the substrate and the second epitaxial layer; and
an imbalance area at a bottom portion of the at least one of the plurality of pillars of the first conductivity type.

18. The power device of claim 17, wherein the imbalance area is the second conductivity type.

19. The power device of claim 15, wherein the active region includes a planar gate structure extending over at least one of the plurality of pillars of the second conductivity type in the active region.

20. The power device of claim 15, wherein the active region includes a trench gate structure extending to a predetermined depth within at least one of the plurality of pillars of the second conductivity type in the active region.

21. The power device of claim 15, wherein the transition region includes an isolation diffusion electrically coupling at least two of the pillars of the first conductivity type in the transition region to at least one of the pillars of the first conductivity type in the active region.

22. The power device of claim 15, wherein the transition region includes an isolation diffusion electrically coupling at least two of the pillars of the first conductivity type in the transition region to at least one of the pillars of the first conductivity type in the active region, the isolation diffusion being insulated from a portion of a field plate by a dielectric, the isolation diffusion has a depth deeper than a depth of a P-well included in the active region, the depth of the P-well is deeper than a depth of a diffusion ring included in the termination region.

23. The power device of claim 15, further comprising:
a field plate having a first portion disposed in the transition region and insulated from at least a portion of the plurality of pillars of the second conductivity type in the transition region by a first dielectric, the field plate having a second portion disposed in the termination region and insulated from at least a portion of the plurality of pillars of the second conductivity type in the termination region by a second dielectric having a thickness greater than a thickness of the first dielectric.

24. A power device, comprising:
an active region having a plurality of pillars of a first conductivity type alternately arranged with a plurality of pillars of a second conductivity type;
a termination region having a plurality of pillars of the first conductivity type alternately arranged with a plurality of pillars of the second conductivity type, the plurality of pillars of the first conductivity type in the termination region have the same width,
the plurality of pillars of the second conductivity type in the active region including a pillar having a width smaller than a width of a pillar from the plurality of pillars of the second conductivity type in the termination region; and
a transition region disposed between the active region and the termination region, the transition region having at least one pillar of the first conductivity type adjacent to at least one pillar of the second conductivity type,
the at least one pillar of the second conductivity type in the transition region has a width greater than the width of the pillar from the plurality of pillars of the second conductivity type in the termination region,
at least one of the plurality of pillars of the first conductivity type in the termination region has a top portion including at least a portion of a diffusion ring, the diffusion ring being shallower than a P-well included in the active region and disposed between a pair of pillars of the second conductivity type in the active region.

25. The power device of claim 24, wherein at least one of the plurality of pillars of the first conductivity type in the active region is in contact with an imbalance area, the imbalance area is a P-type imbalance area or an N-type imbalance area.

* * * * *